(12) United States Patent
Kim et al.

(10) Patent No.: US 9,012,321 B1
(45) Date of Patent: Apr. 21, 2015

(54) METHOD OF MANUFACTURING SEMICONDUCTOR DEVICE

(71) Applicants: Dae-ik Kim, Hwaseong-si (KR); Hyoung-sub Kim, Seongnam-si (KR); Yoo-sang Hwang, Suwon-si (KR); Nak-jin Son, Suwon-si (KR); Ji-young Kim, Yongin-si (KR)

(72) Inventors: Dae-ik Kim, Hwaseong-si (KR); Hyoung-sub Kim, Seongnam-si (KR); Yoo-sang Hwang, Suwon-si (KR); Nak-jin Son, Suwon-si (KR); Ji-young Kim, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 14/283,666

(22) Filed: May 21, 2014

(30) Foreign Application Priority Data

Oct. 7, 2013 (KR) .......................... 10-2013-0119440

(51) Int. Cl.
*H01L 21/00* (2006.01)
*H01L 21/762* (2006.01)
*H01L 21/768* (2006.01)

(52) U.S. Cl.
CPC .... *H01L 21/76224* (2013.01); *H01L 21/76838* (2013.01)

(58) Field of Classification Search
USPC .......................... 438/620, 629, 597
See application file for complete search history.

(56) References Cited

U.S. PATENT DOCUMENTS

| | | | |
|---|---|---|---|
| 6,589,837 B1 | 7/2003 | Ban et al. | |
| 7,371,636 B2 | 5/2008 | Nam | |
| 8,093,125 B2 | 1/2012 | Kim | |
| 2009/0127608 A1* | 5/2009 | Weis | 257/306 |
| 2010/0285644 A1* | 11/2010 | Lee et al. | 438/239 |

FOREIGN PATENT DOCUMENTS

| | | |
|---|---|---|
| KR | 10-0712995 B1 | 5/2007 |
| KR | 2008-0062019 A | 7/2008 |
| KR | 2009-0103147 A | 10/2009 |
| KR | 2010-0127478 A | 12/2010 |
| KR | 2012-0134216 A | 12/2012 |

* cited by examiner

*Primary Examiner* — Richard Booth
(74) *Attorney, Agent, or Firm* — Harness, Dickey & Pierce, P.L.C.

(57) ABSTRACT

Provided is a method of manufacturing a semiconductor device. The method includes forming a sacrificial film as part of a process of forming a semiconductor device. The sacrificial film has a relatively high etch selectivity with respect to other materials of the semiconductor device so as to reduce loss of etching masks and improve the quality of a components (e.g., buried contacts) of the semiconductor device.

20 Claims, 99 Drawing Sheets

METHOD OF MANUFACTURING SEMICONDUCTOR DEVICE

CROSS-REFERENCE TO RELATED APPLICATIONS

This application claims the benefit of Korean Patent Application No. 10-2013-0119440, filed on Oct. 7, 2013, in the Korean Intellectual Property Office, the disclosure of which is incorporated herein in its entirety by reference.

BACKGROUND

The inventive concepts relate to methods of manufacturing semiconductor devices, and more particularly, to methods of manufacturing semiconductor devices including a plurality of wire lines and a plurality of buried contacts (BCs) that cross each other.

Due to an increase in a degree of integration of a semiconductor device, design rules on components of the semiconductor device are decreasing. The process of forming a plurality of wire lines and a plurality of BCs disposed between the plurality of wire lines is becoming complex and difficult for highly scaled semiconductor devices. For example, in the highly scaled semiconductor device, a not open (NOP) margin is insufficient due to a decrease of an open space for a BC, and a BC recess distribution is also poor.

SUMMARY

At least one of the inventive concepts provide a method of manufacturing a semiconductor device, wherein an insufficient not open (NOP) margin caused by a decrease of an open space for a buried contact (BC buried contact), and a poor BC recess distribution are mitigated (or alternatively, prevented) while manufacturing a highly downscaled semiconductor device.

At least one of the inventive concepts also provide a method of manufacturing a semiconductor device, wherein an excessive etching loss of an etch mask is mitigated (or alternatively, prevented) while etching an open space for a BC.

According to an aspect of the inventive concepts, there is provided a method of manufacturing a semiconductor device, the method including: forming a plurality of bit line structures spaced apart from each other through a first groove, extending in a first direction, and each including a bit line and an insulation capping line, on a substrate whose active region is defined by a device isolating film and in which a word line is embedded; forming a multi-film spacer whose outermost region is a nitride film, on two side walls of each of the plurality of bit line structures; exposing a part of a top surface of the active region by etching a lower insulating film of a bottom surface of the first groove by using the multi-film spacer as a mask; forming a sacrificial film formed of a spin on hardmask (SOH) material to embed the first groove and cover the plurality of bit line structures and the multi-film spacer; forming a second groove by removing the sacrificial film exposed through a first mask pattern that extends in a second direction perpendicular to the first direction and exposes a region corresponding to the word line; forming a first insulating film formed of an oxide material and embedding the second groove; forming a third groove that exposes a part of a top surface of the active region by removing the remaining sacrificial film by using the first insulating film as a mask; forming a conductive film formed of a polysilicon material, which embeds the third groove and is electrically connected to the active region; and forming a metal film covering the conductive film, the first insulating film, the plurality of bit line structures, and the multi-film spacer after removing a top portion of the conductive film through etch-back.

The multi-film spacer may include a first nitride film, an oxide film, and a second nitride film.

The exposing of the part of the top surface of the active region may include expanding an exposed area of the top surface of the active region by further etching an oxide film on the active region.

The forming of the second groove may include removing the sacrificial film by using the first mask pattern and the multi-film spacer as masks.

The forming of the third groove may include removing the sacrificial film through ashing and stripping, wherein an exposed area of a top surface of the active region after the sacrificial film is removed and an exposed area of a top surface of the active region before the sacrificial film is formed may be substantially the same.

The forming of the conductive film may include: forming a first conductive film embedding the third groove and covering the plurality of bit line structures and the multi-film spacer; and exposing the plurality of bit line structures and the multi-film spacer by removing a top portion of the first conductive film via chemical mechanical polishing (CMP).

The method may further include, after the forming of the metal film, forming a fifth groove by removing parts of the metal film, the plurality of bit line structures, and the multi-film spacer exposed through a second mask pattern having a predetermined shape, wherein the metal film may be separated into a plurality of landing pads that are electrically isolated from each other, through the fifth groove. The plurality of landing pads may be disposed in a zigzag form along the first direction, the multi-film spacer at a left side wall of each of the plurality of bit line structures and the multi-film spacer at a right side wall of each of the plurality of bit line structures may be alternately exposed through the fifth groove along the first direction, and the multi-film spacers at side walls of the plurality of bit line structures in a same direction may be exposed through the fifth groove along the second direction.

The method may further include, before the forming of the metal film: forming a fourth groove by removing a top portion of the first insulating film by using the conductive film as a mask; and forming a second insulating film formed of a nitride material and embedding the fourth groove, wherein the metal film may cover the second insulating film, and the method may further include, after the forming of the metal film: forming a fifth groove exposing an oxide film spacer in the multi-film spacer by removing parts of the metal film, the plurality of bit line structures, and the multi-film spacer exposed through a second mask pattern having a predetermined shape; forming an air spacer by removing the oxide film spacer; and forming a capping insulating film embedding the fifth groove and covering the metal film. The forming of the fourth groove may include maintaining a top surface of the remaining first insulating film to be lower than a top surface of the conductive film remaining through the etch-back.

According to another aspect of the inventive concept, there is provided a method of manufacturing a semiconductor device, the method including: forming a plurality of bit line structures spaced apart from each other through a first groove, extending in a first direction, and each including a bit line and an insulation capping line, on a substrate whose active region is defined by a device isolating film and in which a word line is embedded; forming a first multi-film spacer whose outermost region is a nitride film, on two side walls of each of the plurality of bit line structures; exposing a part of a top surface of the active region by etching a lower insulating film of a bottom surface of the first groove by using the first multi-film spacer as a mask; forming a second multi-film spacer by removing the nitride film of the outermost region of the first multi-film spacer; forming a conductive thin film formed of a polysilicon material, which covers the plurality of bit line structures, the second multi-film spacer, and the exposed top surface of the active region; forming a sacrificial film formed of a spin on hardmask (SOH) material, which embeds the first groove and covers the conductive thin film; forming a second groove by removing the sacrificial film exposed through a first mask pattern that extends in a second direction perpendicular to the first direction and exposes a region corresponding to the word line; removing the conductive thin film exposed through the second groove; forming a first insulating film formed of an oxide material and embedding the second groove; forming a third groove exposing the conductive thin film by removing the remaining sacrificial film by using the first insulating film as a mask; forming a conductive film embedding the third groove, electrically connected to the active region, and formed of a polysilicon material, on the conductive thin film; and forming a metal film covering the conductive film, the first insulating film, the plurality of bit line structures, and the second multi-film spacer after removing a top portion of the conductive film through etch-back by using the first insulating film as a mask.

The first multi-film spacer may include a first nitride film, an oxide film, and a second nitride film, and the second multi-film spacer may include the first nitride film and the oxide film.

The exposing of the part of the top surface of the active region may include expanding an exposed area of the top surface of the active region by further etching an oxide film on the active region.

The removing of the conductive thin film may include separating the conductive thin film extending in the first direction into a plurality of conductive thin films that are electrically isolated from each other.

The forming of the conductive film may include forming the conductive film on the conductive thin film via deposition or via selective epitaxial growth (SEG).

BRIEF DESCRIPTION OF THE DRAWINGS

Exemplary embodiments of the inventive concepts will be more clearly understood from the following detailed description taken in conjunction with the accompanying drawings in which.

DETAILED DESCRIPTION OF EXAMPLE EMBODIMENTS

Figure 1:
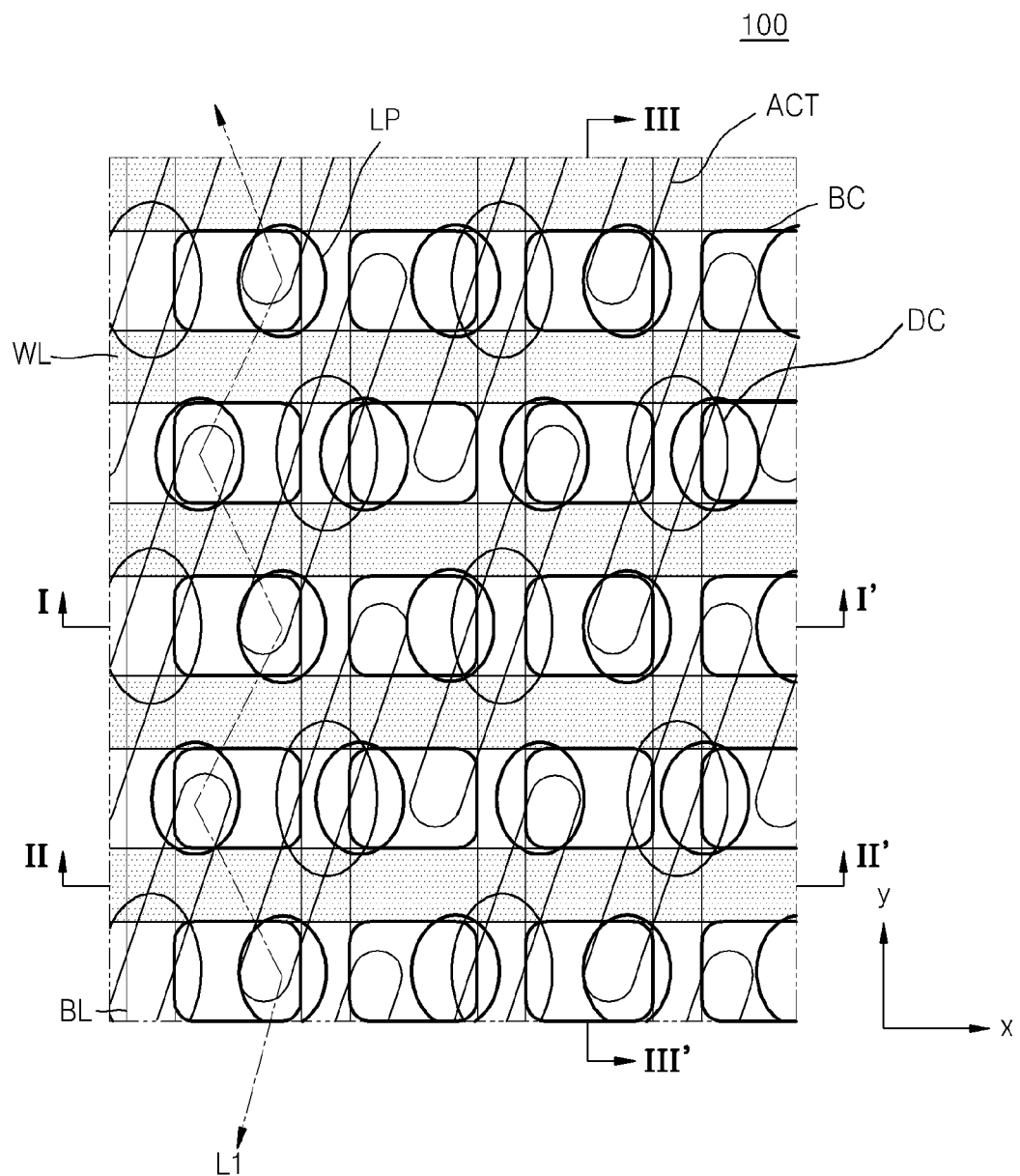
FIG. 1 is a schematic layout of a semiconductor device according to at least one example embodiment of the inventive concepts.

Example embodiments will be understood more readily by reference to the following detailed description and the accompanying drawings. The example embodiments may, however, be embodied in many different forms and should not be construed as being limited to those set forth herein. Rather, these example embodiments are provided so that this disclosure will be thorough and complete. In at least some example embodiments, well-known device structures and well-known technologies will not be specifically described in order to avoid ambiguous interpretation.

It will be understood that when an element is referred to as being "connected to" or "coupled to" another element, it can be directly on, connected or coupled to the other element or intervening elements may be present. In contrast, when an element is referred to as being "directly connected to" or "directly coupled to" another element, there are no intervening elements present. Like numbers refer to like elements throughout. As used herein, the term "and/or" includes any and all combinations of one or more of the associated listed items.

It will be understood that, although the terms first, second, third, etc., may be used herein to describe various elements, components and/or sections, these elements, components and/or sections should not be limited by these terms. These terms are only used to distinguish one element, component or section from another element, component or section. Thus, a first element, component or section discussed below could be termed a second element, component or section without departing from the teachings of the example embodiments.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises," "comprising," "includes," and/or "including" when used in this specification, specify the presence of stated components, steps, operations, and/or elements, but do not preclude the presence or addition of one or more other components, steps, operations, elements, and/or groups thereof.

Unless otherwise defined, all terms (including technical and scientific terms) used herein have the same meaning as commonly understood by one of ordinary skill in the art to which these example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Spatially relative terms, such as "below", "beneath", "lower", "above", "upper", and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

FIG. 1 is a schematic layout of a semiconductor device 100 according to at least one example embodiment of the inventive concepts.

Referring to FIG. 1, the semiconductor device 100 may include a plurality of active regions ACT. The active region ACT may be defined by a device isolating film 114 of FIG. 2A formed on a substrate 110 of FIG. 2A. According to a decrease of a design rule of the semiconductor device 100, the active regions ACT may be disposed in bar shapes in a diagonal line or oblique line.

A plurality of word lines WL or gate lines extending in parallel to each other in a second direction (x direction) across the active region ACT may be disposed on the active region ACT. The word lines WL may be disposed at regular intervals. A plurality of bit lines BL extending in parallel to each other in a first direction (y direction) perpendicular to the word lines WL may be disposed on the word lines WL. The bit lines BL may also be disposed at regular intervals.

According to one or more example embodiments, the semiconductor device 100 may include a memory cell having a unit cell size of 6F². Here, F denotes a minimum lithographic feature size.

Meanwhile, the semiconductor device 100 may include various contact arrangements formed on the active region ACT, such as a direct contact DC, a buried contact BC, and a landing pad LP. Here, the direct contact DC denotes a contact connecting the active region ACT to the bit line BL, and the buried contact BC denotes a contact connecting the active region ACT to a lower electrode (not shown) of a capacitor.

Generally, a contact area between the buried contact BC and the active region ACT may be small based on an arrangement structure. Accordingly, the landing pad LP that is conductive may be used to increase a contact area of the active region ACT and a contact area of the lower electrode of the capacitor. The landing pad LP may be disposed between the active region ACT and the buried contact BC, or between the buried contact BC and the lower electrode of the capacitor. According to at least one example embodiment, the landing pad LP may be disposed between the buried contact BC and the lower electrode of the capacitor. As such, by increasing the contact area by using the landing pad LP, contact resistance between the active region ACT and the lower electrode of the capacitor may be decreased.

According to the semiconductor device 100 of at least one example embodiment, the direct contact DC may be disposed on a center portion of the active region ACT, and the buried contact BC may be disposed on two end portions of the active region ACT. As the buried contact BC is disposed on two end portions of the active region ACT, the landing pad LP may be disposed to partially overlap the buried contact BC adjacent to two ends of the active region ACT.

Meanwhile, the word line WL may be embedded in a substrate of the semiconductor device 100, and disposed across the active region ACT between the direct contact DC and the buried contact BC. As shown in FIG. 1, the two word lines WL are disposed to cross one active region ACT, and since the active region ACT is disposed in a diagonal line, the active region ACT may have a predetermined angle lower than 90° with the word lines.

The direct contact DC and the buried contact BC are symmetrically disposed, and thus may be disposed on straight lines along x- and y-axes. Meanwhile, unlike the direct contact DC and the buried contact BC, the landing pad LP may be disposed in a zigzag form L1 in the first direction (y direction) along which the bit line BL extends. Also, the landing pad LP may be disposed to overlap a same side portion of each bit line BL in the second direction (x direction) along which the word line WL extends. For example, each landing pad LP on a first line may overlap a left side surface of the corresponding bit line BL, and each landing pad LP on a second line may overlap a right side surface of the corresponding bit line BL.

By using a sacrificial film formed of a spin on hardmask (SOH) material while etching an open region for the buried contact BC, an etching process may be easily performed with an increased selectivity. When a sacrificial film formed of an oxide material is used, an open region for the buried contact BC is in a contact type, but according to at least one example embodiment, since the semiconductor device 100 uses the sacrificial film formed of the SOH material, the open region for the buried contact may be in a line type, and thus a not open (NOP) margin may be increased and a recess distribution of the buried contacts BC may be improved.

Meanwhile, in the semiconductor device 100 according to at least one example embodiment, since the buried contact BC is formed by using the sacrificial film formed of the SOH material, the buried contact BC may be surrounded by an insulating layer formed of an oxide material and/or a nitride material, as will be described in detail later with reference to FIGS. 14A and 14B.

FIGS. 2A through 13C are cross-sectional views for describing a method of manufacturing the semiconductor device 100 of FIG. 1, according to at least one example embodiment of the inventive concepts. Here, FIGS. 2A, 3A, . . . , and 13A are cross-sectional views taken along a line I-I' of FIG. 1, FIGS. 2B, 3B, . . . , and 13B are cross-sectional views taken along a line II-IF of FIG. 1, and FIGS. 2C, 3C, . . . , and 13C are cross-sectional views taken along a line III-III' of FIG. 1.

Figure 2A:
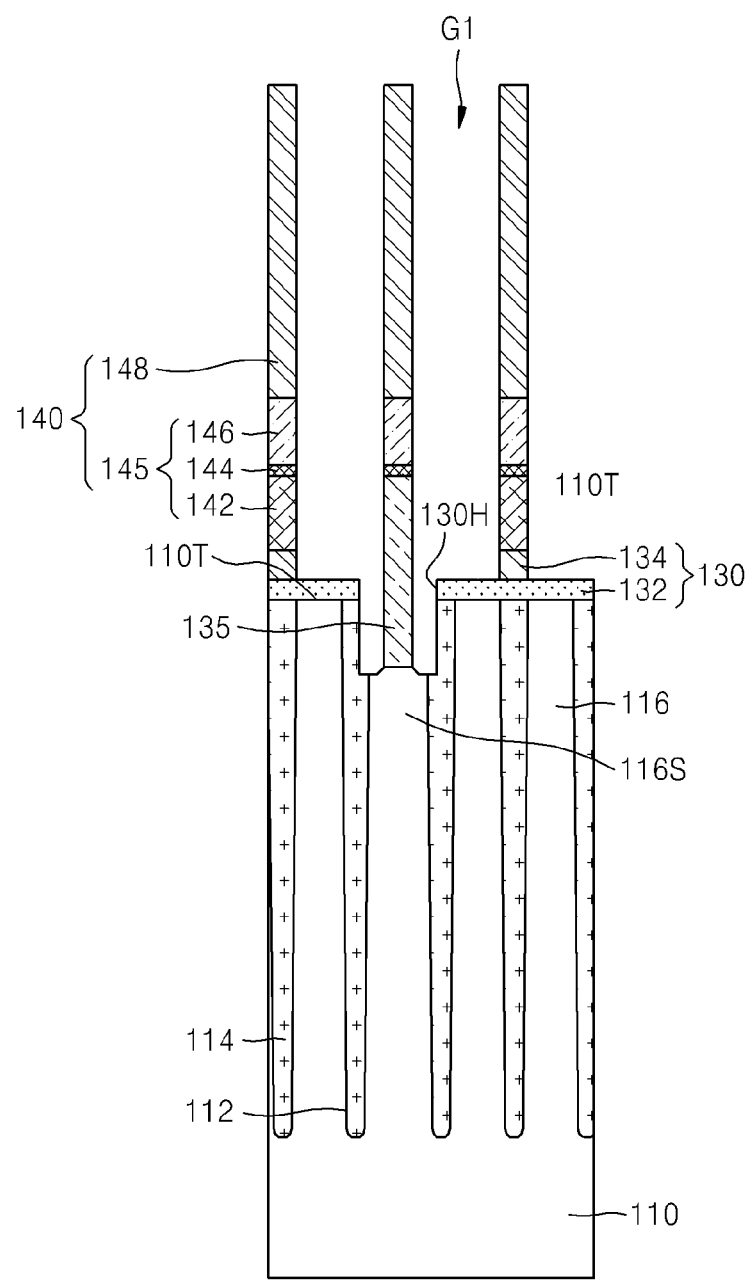
FIGS. 2A through 13C are cross-sectional views for describing a method of manufacturing the semiconductor device of FIG. 1, according to at least one example embodiment of the inventive concepts.
Figure 2B:
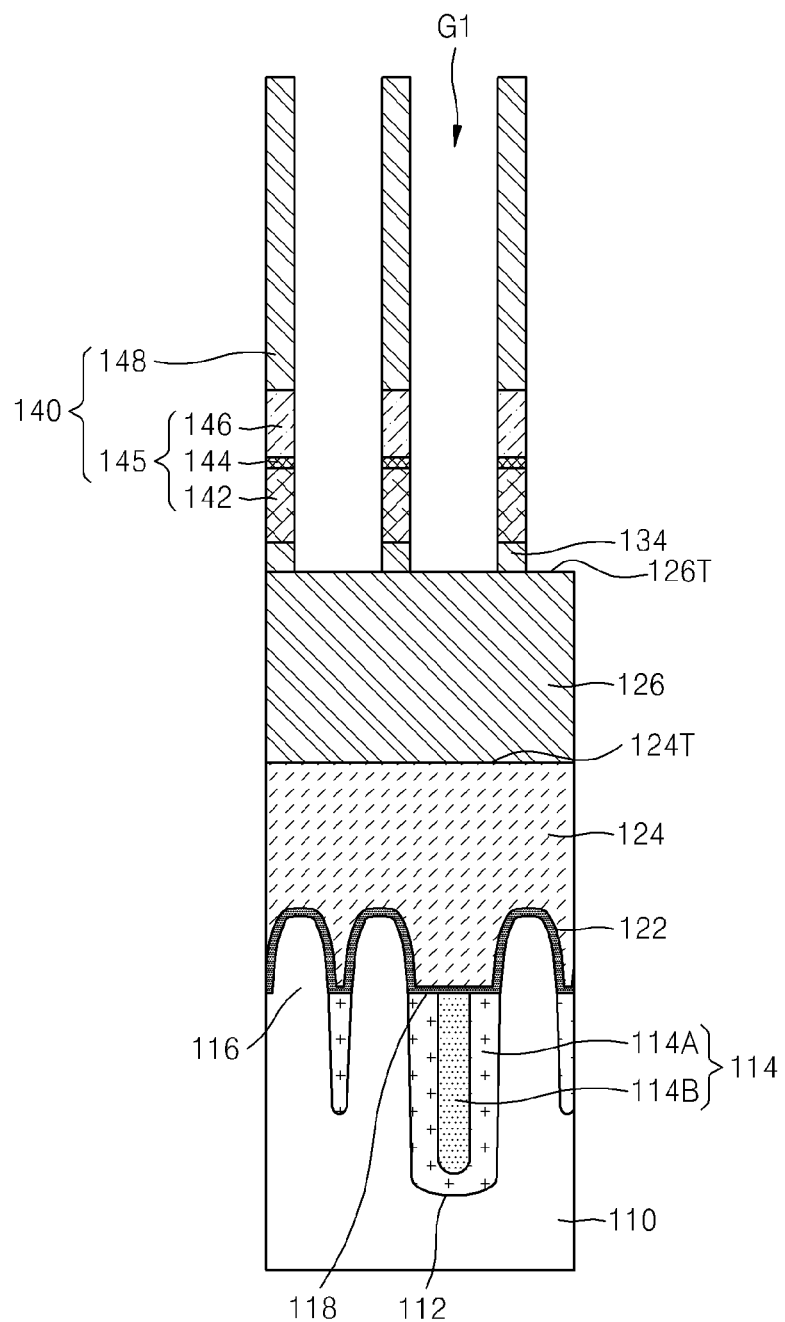
Figure 2C:
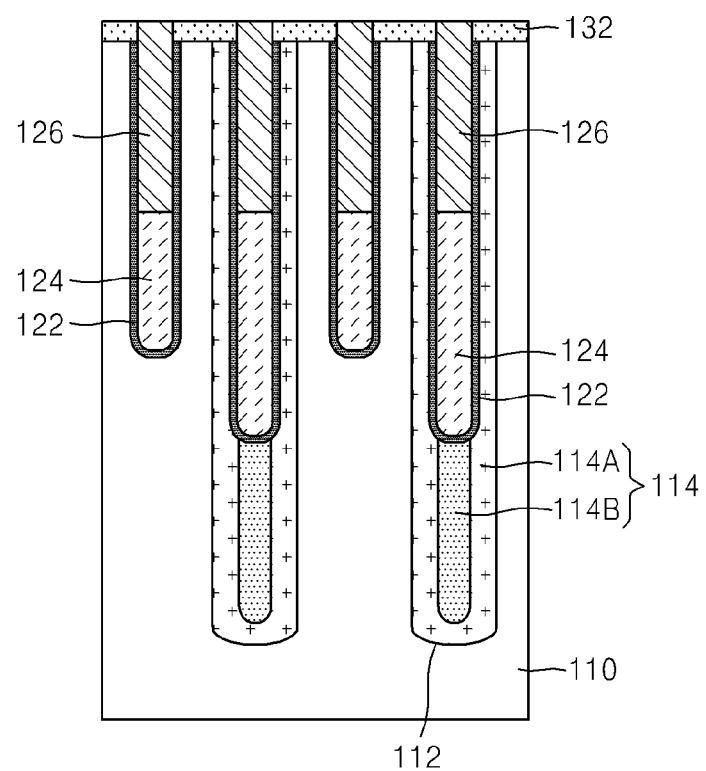

Referring to FIGS. 2A through 2C, a device isolating trench 112 is formed on the substrate 110, and the device isolating film 114 is formed in the device isolating trench 112.

An active region 116 may be defined in the substrate 110 by the device isolating film 114. As shown in FIG. 1, the active region 116 may have a relatively long island shape having a short axis and a long axis, and may be disposed diagonally to have an angle lower than 90° with respect to a word line 124 disposed on the active region 116.

The substrate 110 may include silicon (Si), such as crystalline Si, polycrystalline Si, or amorphous Si. According to one or more example embodiments, the substrate 110 may include germanium (Ge) or a compound semiconductor, such as SiGe, silicon carbide (SiC), gallium arsenide (GaAs), indium arsenide (InAs), or indium phosphide (InP). According to one or more example embodiments, the substrate 100 may include a conductive region, such as an impurity-doped well, or an impurity-doped structure.

The device isolating film 114 may be formed of one insulating film, or as shown in FIG. 2B or 2C, may include an outer insulating film 114A and an inner insulating film 114B. The outer and inner insulating films 114A and 114B may be formed of different materials. For example, the outer insulating film 114A may be formed of an oxide film and the inner insulating film 114B may be formed of a nitride film. However, a structure of the device isolating film 114 is not limited thereto. For example, the device isolating film 114 may be formed of a multi-film including a combination of at least three types of insulating films.

A plurality of word line trenches 118 are formed on the substrate 110. The word line trenches 118 extend in parallel to each other, and may each have a line shape crossing the active region 116.

As shown in FIG. 2B, in order to form the word line trenches 118 whose bottom surfaces are stepped, the device isolating film 114 and the substrate 110 are etched via different etching processes such that an etching depth of the device isolating film 114 and an etching depth of the substrate 110 are different from each other.

After washing a result product obtained after forming the word line trench 118, a gate dielectric film 112, the word line 124, and a buried insulating film 126 are sequentially formed in each of the word line trenches 118.

According to one or more example embodiments, after forming the word line 124, a source/drain region may be formed on a top surface of the active region 116 by injecting impurity ions to the substrate 110 on two sides of the word line 124 by using the word line 124 as a mask. FIG. 2A shows a source region 116S. The direct contact DC may be connected to the source region 116S. According to one or more example embodiments, the impurity ions may be injected to form the source/drain region before forming the word line 124.

A top surface 124T of the word line 124 may be lower than a top surface 110T of the substrate 110. A bottom surface of the word line 124 is uneven as shown in FIG. 2B, and a saddle fin field effect transistor (FINFET) may be formed in the active region 116. According to one or more example embodiments, the word line 124 may be formed of at least one material selected from titanium (Ti), titanium nitride (TiN), tantalum (Ta), TaN, tungsten (W), WN, TiSiN, and WSiN.

The gate dielectric film 122 may be formed of at least one material selected from a silicon oxide (SiO) film, a silicon nitride (SiN) film, a silicon oxynitride (SiON) film, an oxide/nitride/oxide (ONO) film, and a high-k dielectric film having a higher dielectric constant than a silicon oxide film. For example, the gate dielectric film 122 may have a dielectric constant from about 10 to about 25. According to one or more example embodiments, the gate dielectric film 122 may be formed of at least one material selected from hafnium oxide (HfO), HfSiO, HfON, HfSiON, lanthanum oxide (LaO), lanthanum aluminum oxide (LaAlO), zirconium oxide (ZrO), ZrSiO, ZrON, ZrSiON, TaO, TiO, barium strontium titanium oxide (BaSrTiO), BaTiO, SrTiO, yttrium oxide (YO), AlO, and lead scandium tantalum oxide (PbScTaO). Alternatively, the gate dielectric film 122 may be formed of HfO$_2$, Al$_2$O$_3$, HfAlO$_3$, Ta$_2$O$_3$, or TiO$_2$.

A top surface 126T of the buried insulating film 126 is disposed approximately on a same level as the top surface 110T of the substrate 110. The buried insulating film 126 may be formed of a SiO film, a SiN film, a SiON film or a combination thereof.

A SiN film 134 is formed on the substrate 110. In detail, a SiO film 132 is formed throughout the substrate 110, the word line trench 118 is formed to form the word line 124 and the buried insulating film 126, planarization is performed via CMP, and then the SiN film 134 may be formed throughout the result product. Here, the SiO film 132 may be formed after the buried insulating film 126 is formed. The SiN film 134 may form an interlayer insulating film pattern 130, together with the SiO film 132. The interlayer insulating film pattern 130 may have a thickness from about 200 Å to about 400 Å. In some cases, the interlayer insulating film pattern 130 may be formed of a single layer of SiO. For example, the interlayer insulating film pattern 130 may be formed of tetraethylorthosilicate (TEOS), high density plasma (HDP), or boro-phospho silicate glass (BPSG).

The interlayer insulating film pattern 130 may include a plurality of openings 130H exposing the source region 116S of the active region 116. A spacer (not shown) formed of a material different from the device isolating film 114 may be formed at a side wall of the opening 130H. For example, when the device isolating film 114 is formed of SiO film, the spacer may be formed of SiN film. Alternatively, the spacer may not be formed. After the spacer is formed, the openings 130H may be filled with a conductive material so as to form a plurality of direct contacts 135 electrically connected to the source region 116S of the active region 116.

Then, a plurality of bit line structures 140 extending in parallel to each other in the second direction (x direction of FIG. 1) are formed on the interlayer insulating film pattern 130 and the direct contact 135. The bit line structures 140 may each include a bit line 145 and an insulation capping line 148 covering a top surface of the bit line 145. The bit line 145 may be electrically connected to the direct contact 135.

According to one or more example embodiments, the bit line 145 may be formed of at least one material selected from an impurity-doped semiconductor, a metal, a metal nitride, and a metal silicide. The bit line 145 may be formed in one layer, or as shown in FIGS. 2A through 2C, may be formed in a multi-film. For example, the bit line 145 may have a stacked structure in which doped polysilicon 142, WN 144, and W 146 are sequentially stacked on each other.

According to one or more example embodiments, the insulation capping line 148 is formed of SiN film. A thickness of the insulation capping line 148 may be higher than that of the bit line 145.

According to one or more example embodiments, in order to form the bit line structure 140, a bit line forming conductive film and an insulating layer covering the bit line forming conductive film are first formed on the interlayer insulating film pattern 130. A thickness of the insulating layer may be higher than that of the bit line forming conductive film. The insulating layer is patterned to form the insulating capping line 148, and then the bit line forming conductive film is etched by using the insulating capping line 148 as an etch mask to form the bit line 145.

According to one or more example embodiments, a part of the interlayer insulating film pattern 130 may be etched while excessively etching the bit line forming conductive film so that a stepped portion is formed on a top surface of the interlayer insulating film pattern 130. For example, the SiO film 132 may be exposed as the SiN film 134 of the interlayer insulating film pattern 130 is etched. Also, the spacer formed of the SiN film may be removed to expose again the opening 130H surrounding the direct contact 135.

According to one or more example embodiments, the bit line forming conductive film may be formed of a multi-film. For example, the bit line forming conductive film may have a multi-film structure in which a first metal silicide film, a conductive barrier film, a second metal silicide film, and an electrode film formed of a metal or metal nitride are sequentially stacked on each other. According to the semiconductor device 100, the bit line forming conductive film may include a doped polysilicon film, a WN film, and a W film.

As shown in FIGS. 2A through 2C, a line shaped space, i.e., a first groove G1 may be formed between the bit line structures 140.

Figure 3A:
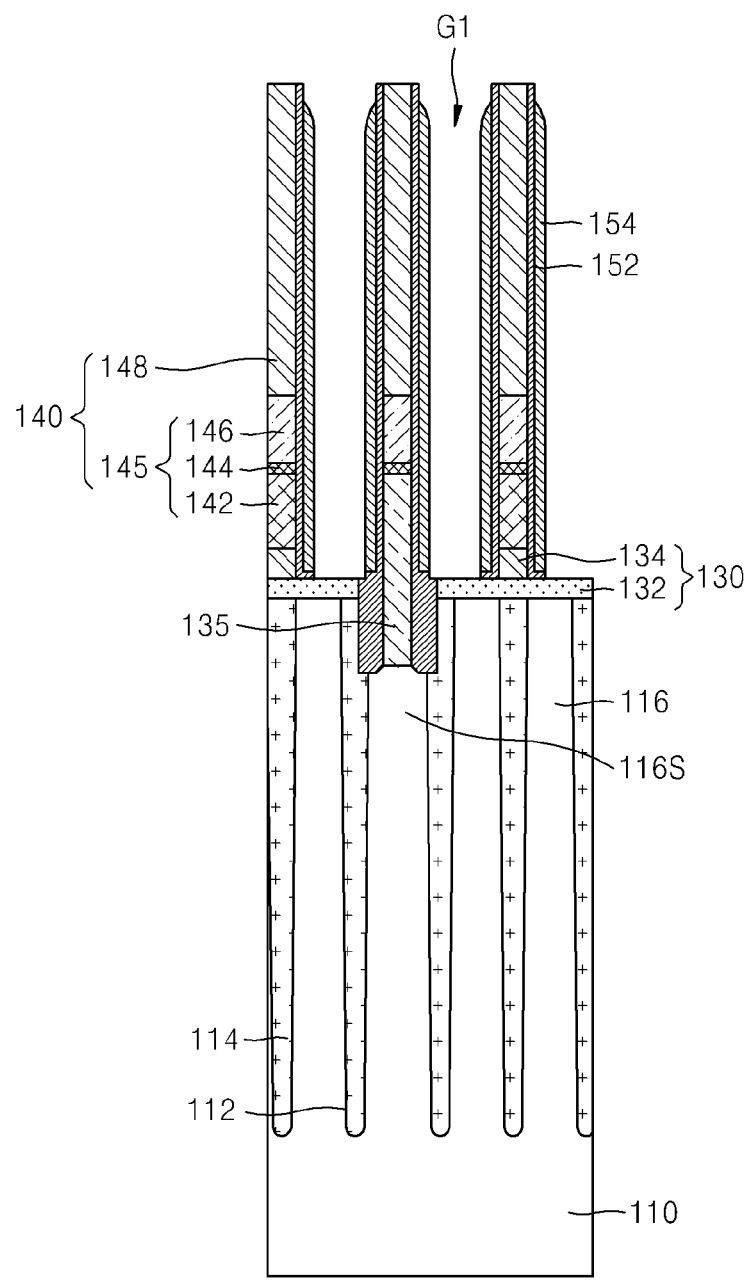
Figure 3B:
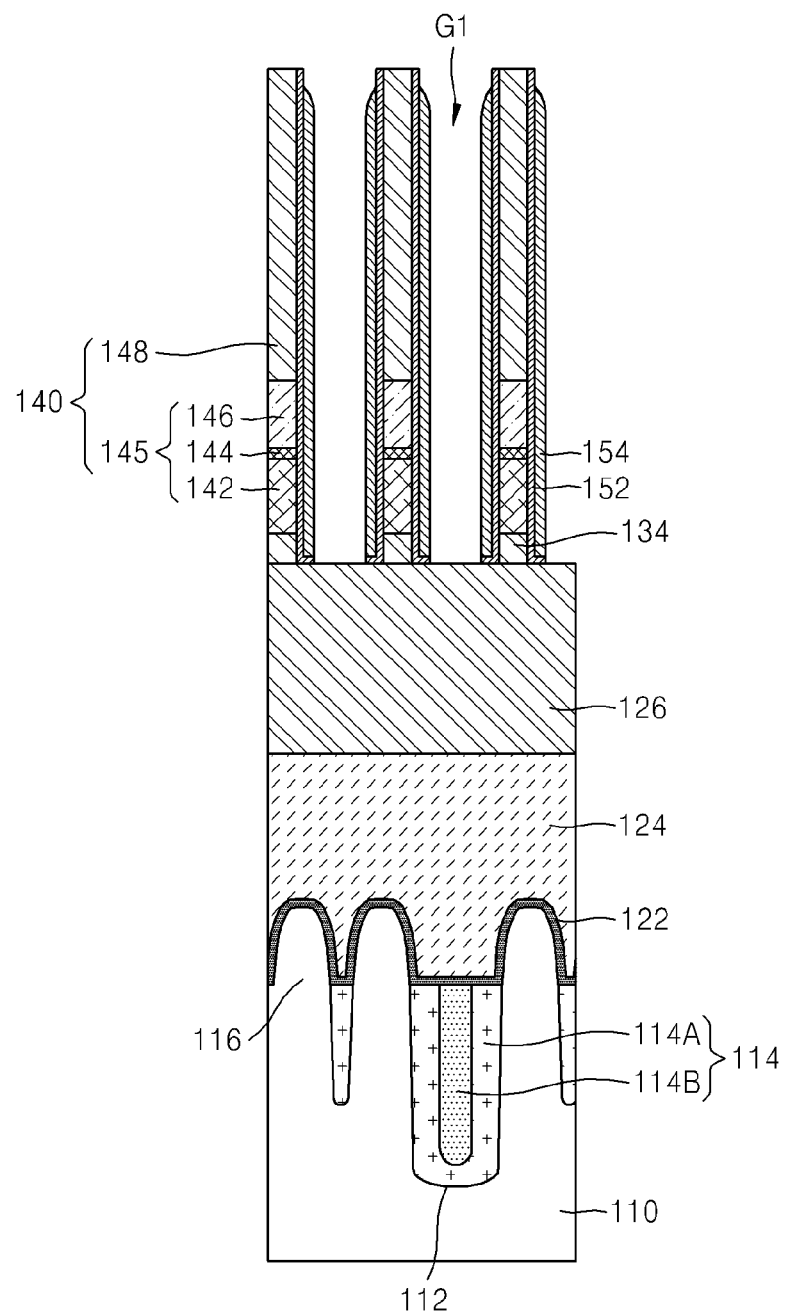
Figure 3C:
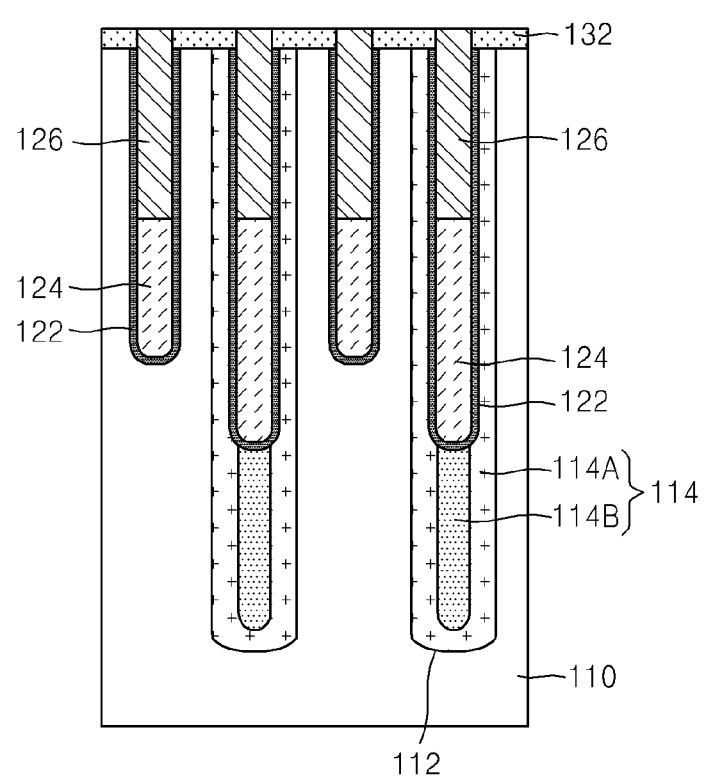

Referring to FIGS. 3A through 3C, an insulating liner 152 covering an exposed top surface and a side wall of the bit line structure 140 and an exposed surface of the interlayer insulating film pattern 130, and filling the opening 130H is formed. According to one or more example embodiments, the insulating liner 152 may be used as an etch blocking film in following processes. The insulating liner 152 may be used as a protection film for protecting the bit line structure 140.

According to one or more example embodiments, the insulating liner 152 may be formed of a SiN film. Such an insulating liner 152 may have a thickness from about 30 Å to about 80 Å.

Then, a first spacer insulating film is deposited on a result product obtained by forming the insulating liner 152, and then the first spacer insulating film is etched back by using the insulating liner 152 as an etch blocking film to form a plurality of first spacers 154 covering the insulating liner 152 on two side walls of the bit line structure 140. According to one or more example embodiments, the first spacer 154 may be formed of SiO, an SiGe compound, or polymer. However, a material of the first spacer 154 is not limited thereto.

The first spacer 154 may be formed of a material having an etch selectivity with respect to the insulating liner 152. For example, the first spacer 154 may be formed of an insulating material or a conductive material. In the semiconductor device 100 according to at least one example embodiment, the first spacer 154 may be formed of SiO.

Meanwhile, as shown in FIGS. 3A through 3C, top and bottom surface portions of the insulating liner 152 may be removed during an etch-back process. However, alternatively, the top and bottom surface portions of the insulating liner 152 may not be removed but may be maintained by adjusting an etch amount of the first spacer 154.

Figure 4A:
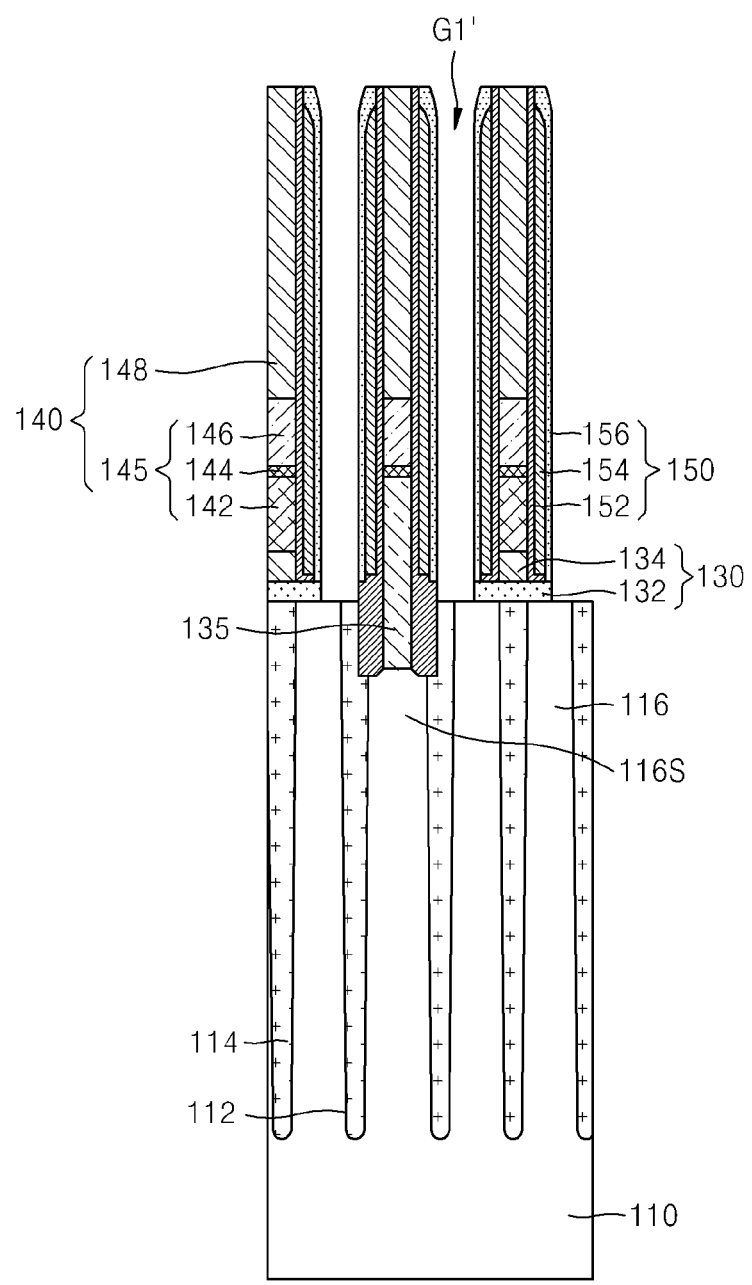
Figure 4B:
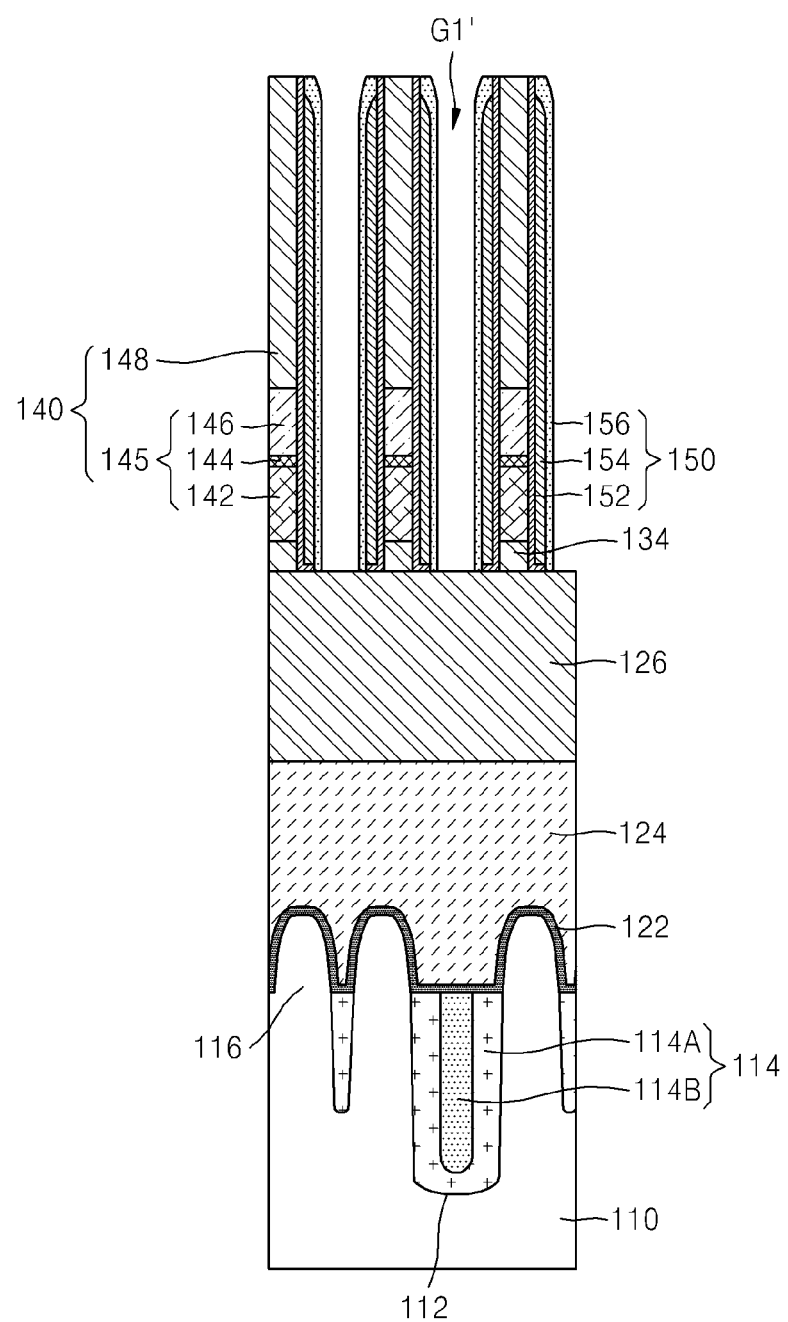
Figure 4C:
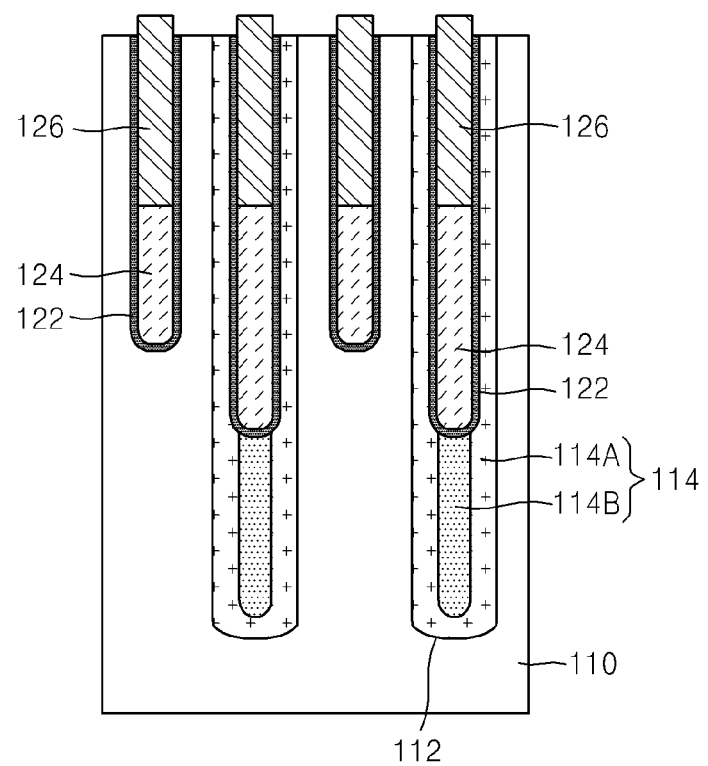

Referring to FIGS. 4A through 4C, a second spacer insulating film (not shown) covering the insulating liner 152 and the first spacer 154 in a uniform thickness may be formed on a result product obtained by forming the first spacer 154. After forming the second spacer insulating film, a plurality of spacers 156 covering the first spacer 154 on two side walls of the bit line structure 140 may be formed by etching back the second spacer insulating film by using the first spacer 154 as an etch blocking film.

The second spacer 156 may be formed of a material different from the first spacer 154. According to one or more embodiments, the second spacer 156 may be formed of a SiO film, a SiN film, or a SiON film. According to the semiconductor device 100 of at least one example embodiment, the second spacer 156 may be formed of a SiN film. Such a second spacer 156 may have a thickness from about 20 Å to about 100 Å.

Here, the insulating liner 152, the first spacer 154, and the second spacer 156 may form a multi-film spacer 150 surrounding a side wall of the bit line structure 140.

Meanwhile, after forming the second spacer 156 via etch-back, the interlayer insulating film pattern 130 on a bottom surface of the first groove G1 may be exposed. For example, the etch-back process may be continuously performed to remove material films forming the insulating liner 152, the first spacer 154, and the second spacer 156, which are on the bottom surface of the first groove G1, thereby exposing the SiO film 132 below the first groove G1.

Then, the SiO film 132 on the bottom surface of the first groove G1 is etched by using the second spacer 156 as an etch blocking film so as to expose a part of a top surface of the active region 116. A part of a top surface of the device isolating film 114 adjacent to the active region 116 may also be exposed while exposing the part of the top surface of the active region 116.

As such, according to at least one example embodiment, the active region 116 may be opened while forming the multi-film spacer 150 of the bit line structure 140. Accordingly, the active region 116 may be opened in a line shape. In detail, the bit line structure 140 may have a line structure, and the first groove G1 between the line bit structures 140 may also have a line structure. Accordingly, the first groove G1 formed after the multi-film spacer 150 surrounding the bit line structure 140 may also have a line structure. In other words, the active region 116 may be opened in a line shape along a first groove G1' by etching the SiO film 132 by using the multi-film spacer 150 as a mask.

As such, by opening the active region 116 in a line shape, a possibility of NOP generation may be remarkably reduced compared to opening the active region 116 in a contact shape. Also, an etch amount of a mask during an etching process may be reduced. Here, a contact shape is a term compared to a line shape, wherein an entire outer region of an open region is surrounded by an etch mask. In other words, a horizontal cross section of the contact shape may have a polygonal or circular shape surrounded by the etch mask.

Meanwhile, during an etching process, a mask may be formed of a nitride or oxide film and an etch amount may be excessive when an active region is opened in a contact shape, and thus a loss amount of the mask may be high. Accordingly, an open region is increased or a thickness of the mask is increased, but such increases are limited due to recent downscale of a device.

Accordingly, as in the method of at least one example embodiment, the active region 116 is opened in a line shape while forming the multi-film spacer 150 so as to increase an open region and stably perform an etching process. In other words, an NOP margin may be increased, a mask loss amount may be reduced, and a recess distribution of the buried contacts BC may also be reduced by using the method according to at least one example embodiment.

Figure 5A:
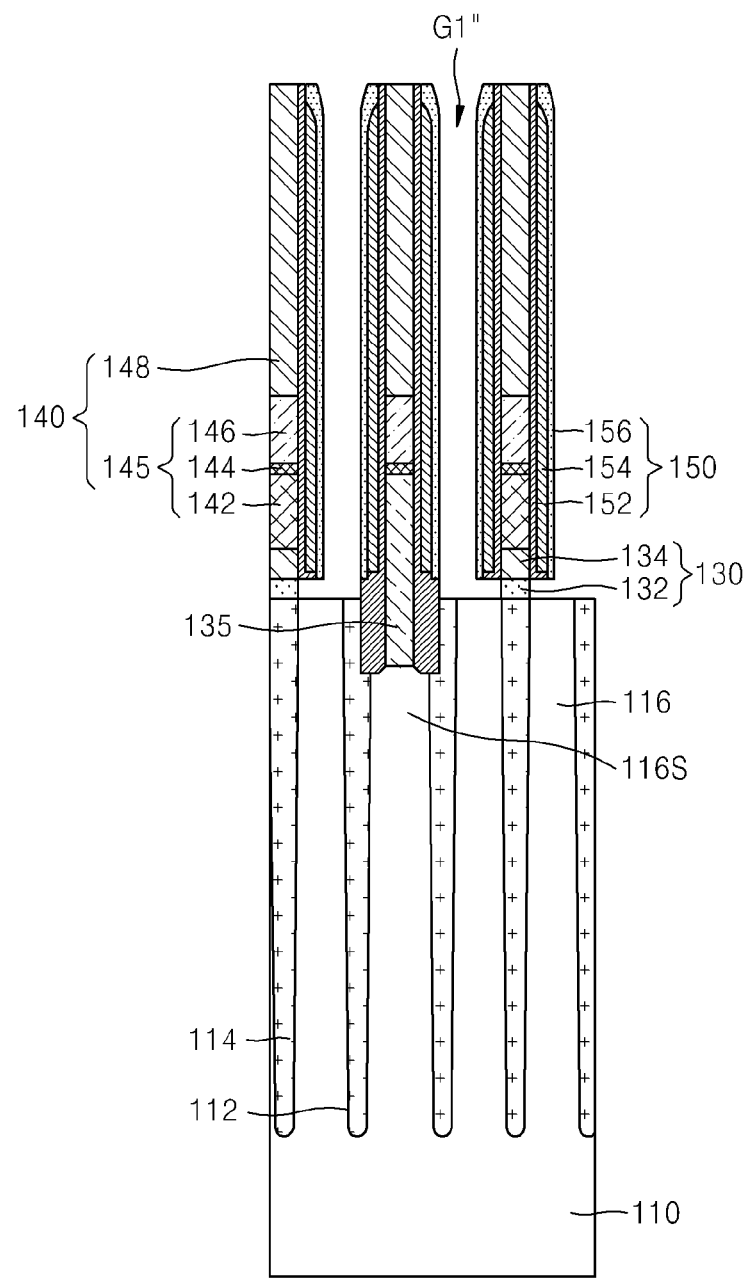
Figure 5B:
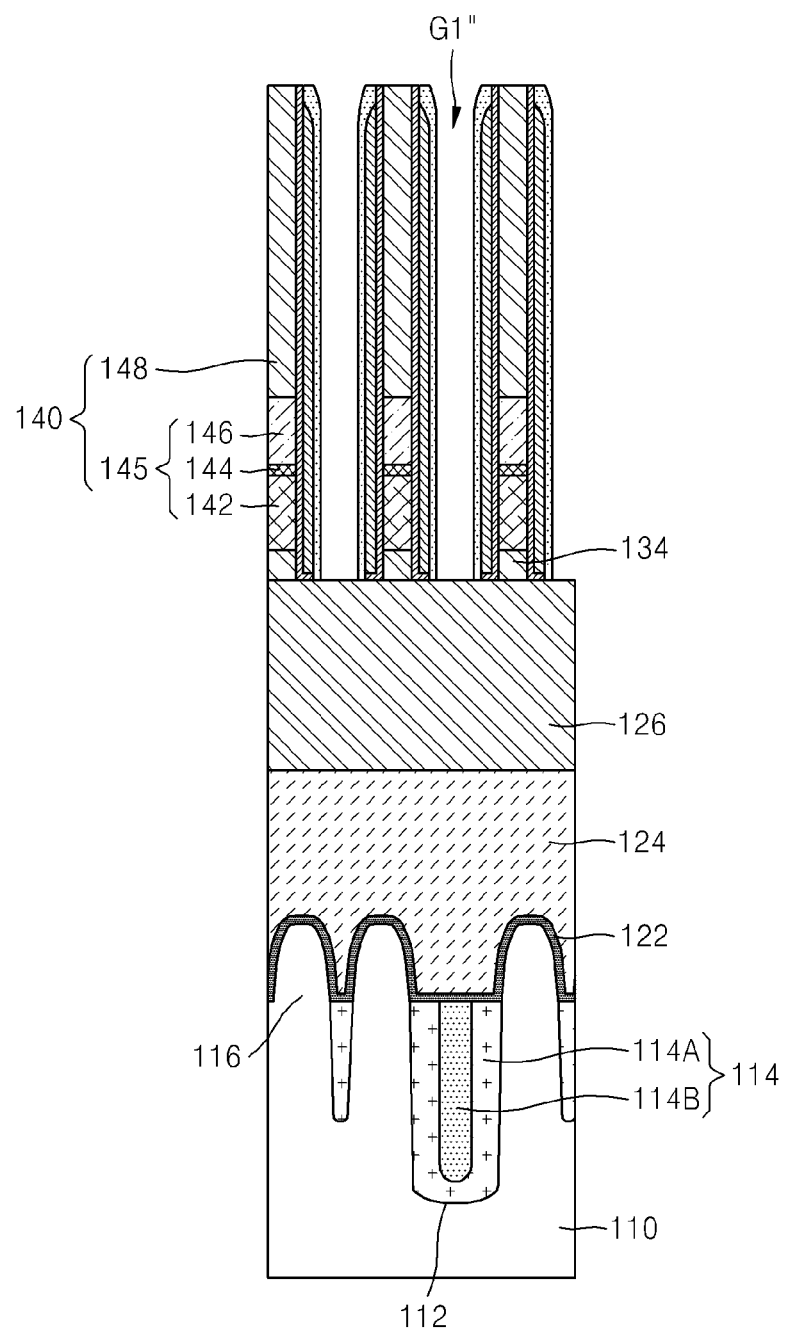
Figure 5C:
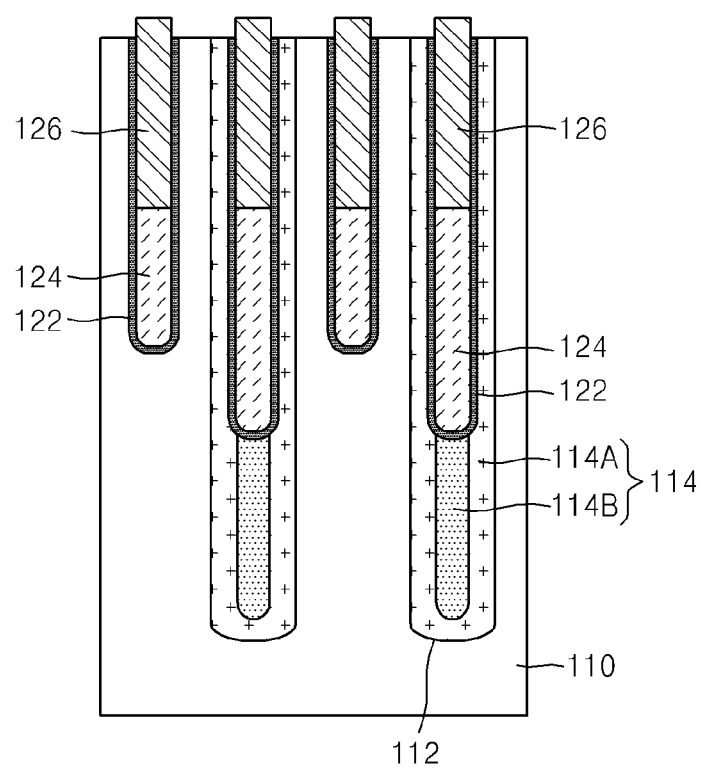

Referring to FIGS. 5A through 5C, after opening the top surface of the active region 116, an open area of the top surface of the active region 116 is expanded by further performing a wet etching process on an oxide film, for example, the SiO film 132. As such, by expanding the open area of the top surface of the active region 116, a contact area between the active region 116 and the buried contact BC formed by filling a conductive material in a first groove G1″ later may be expanded. Accordingly, contact resistance between the buried contact BC and the active region 116 may be decreased.

Meanwhile, according to circumstances, the wet etching process may be omitted. For example, if a sufficient open area is obtained by opening the active region 116 in a line shape, the open area of the active region 116 is not required to be expanded, and thus the wet etching process may be omitted.

Figure 6A:
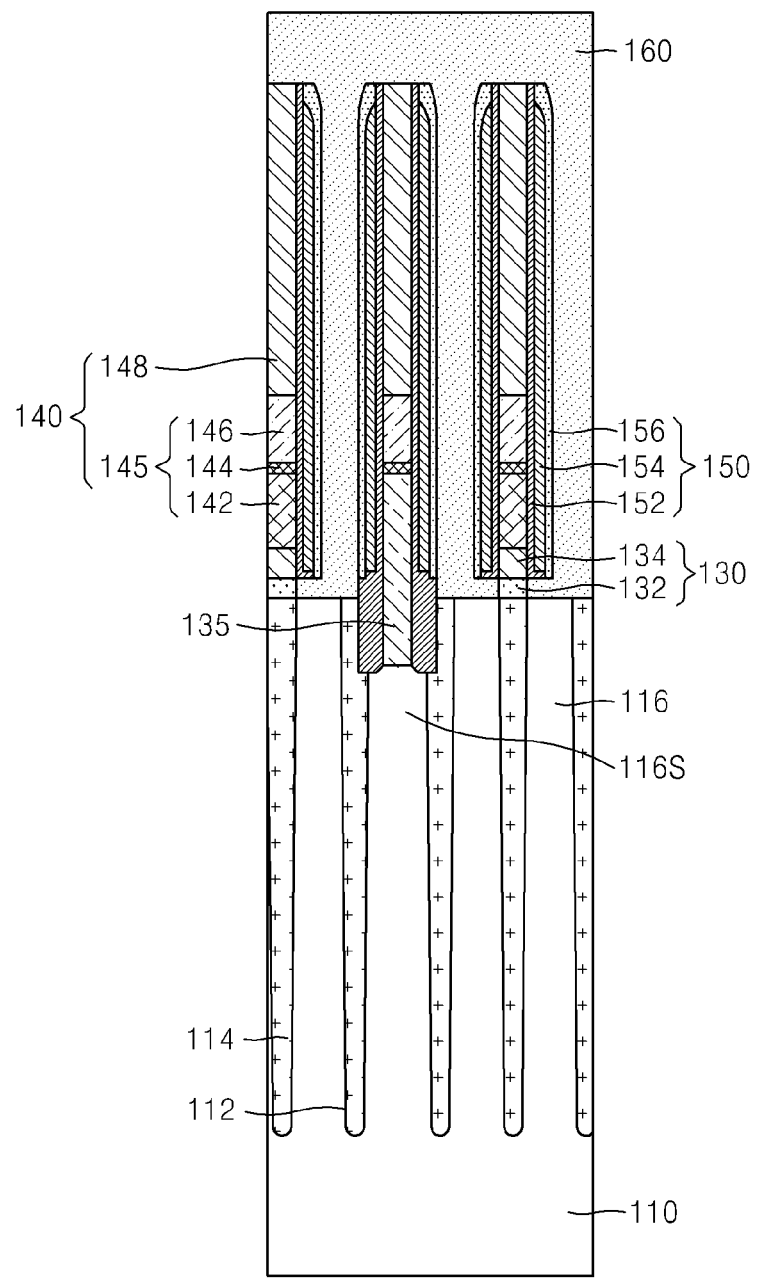
Figure 6B:
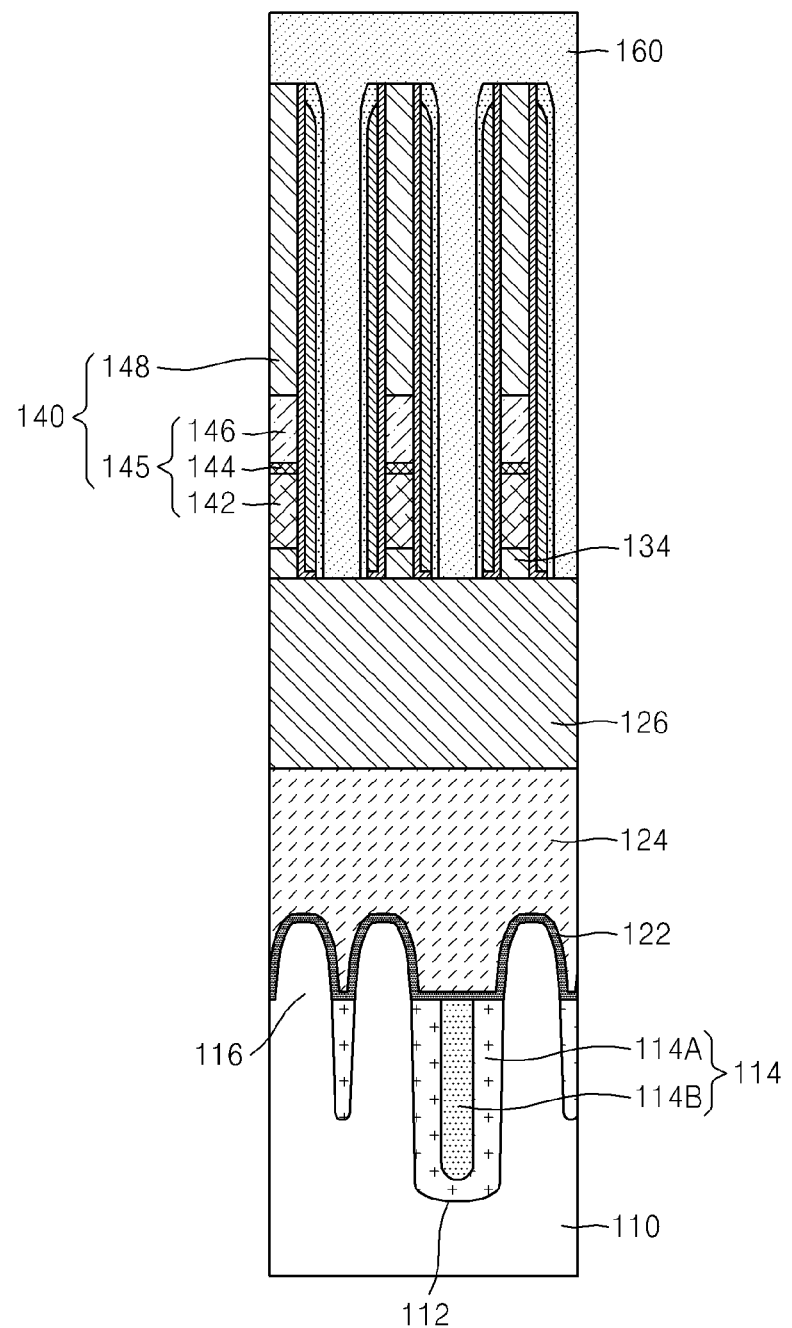
Figure 6C:
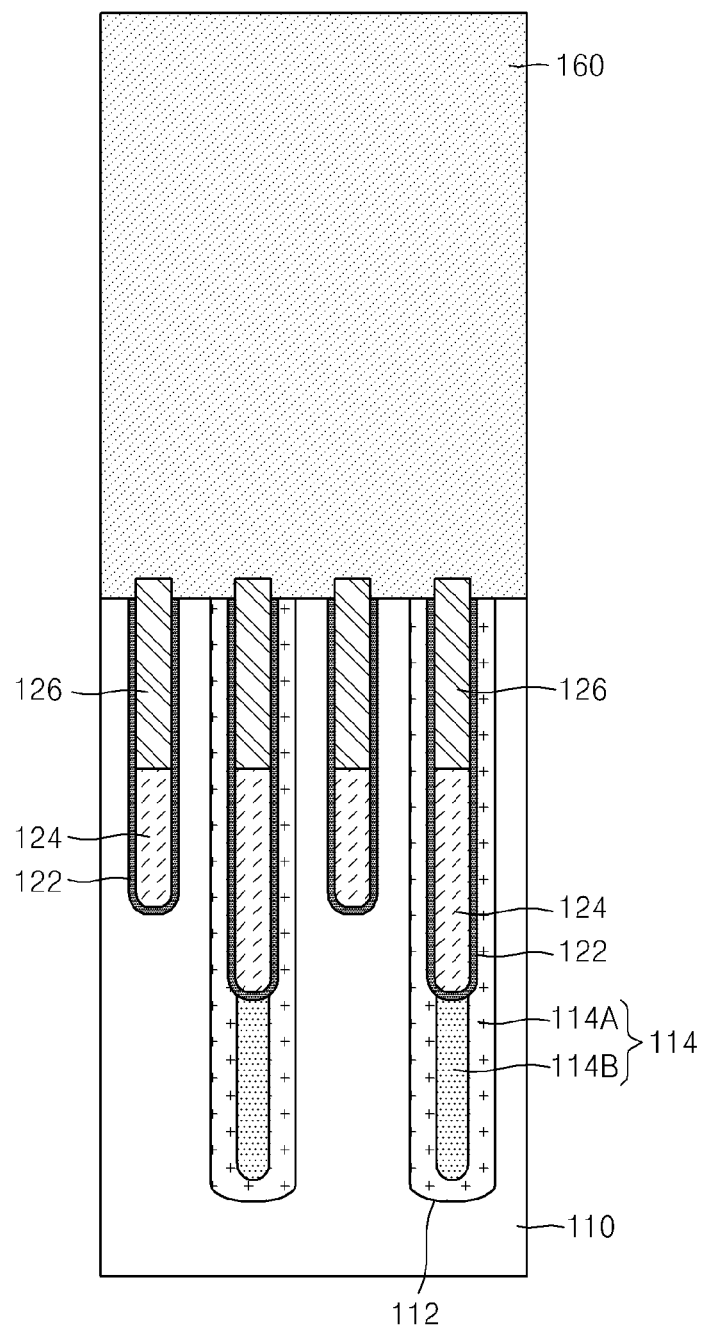

Referring to FIGS. 6A through 6C, after expanding the exposed area of the top surface of the active region 116 by performing the wet etching process on the SiO film 132, a sacrificial film 160 filling the first groove G1" and covering top surfaces of the bit line structure 140 and multi-film spacer 150 is formed. The sacrificial film 160 may be formed of an SOH material. Here, the SOH material may be a material including a hydrocarbon compound or a derivative thereof whose carbon amount is from about 85 wt % to about 99 wt % based on a total weight.

The sacrificial film 160, in detail, the sacrificial film 160 formed of an SOH material, may be formed by coating an organic compound via a spin coating process or another deposition process to form an organic compound layer, and then performing a baking process at least once. The organic compound may include a hydrocarbon compound or a derivative thereof containing an aromatic ring, such as phenyl, benzene, or naphthalene. Also, the organic compound may include a material having a relatively high carbon amount from about 85 wt % to about 99 wt % based on a total weight.

In detail, first, the organic compound is coated via spin coating to form the organic compound layer on a target material film. Then, the organic compound layer is firstly baked at a temperature from about 150° C. to about 350° C. to form a carbon containing layer. The first baking may be performed for about 60 seconds. Next, the carbon containing layer may be secondarily backed and hardened at a temperature from about 300° C. to about 550° C. to form the sacrificial film 160 formed of an SOH material. The second baking may be performed for about 30 to 300 seconds. As such, by hardening the carbon containing layer via such a second baking process to form the sacrificial film 160 formed of an SOH material, the sacrificial film 160 may be less susceptible (or alternatively, prevented) from being adversely affected during a deposition process even when the deposition process is performed at a relatively high temperature of about 400° C. to form another film on the sacrificial film 160.

The sacrificial film 160 formed of an SOH material may be easily removed via an ashing or stripping process. Accordingly, the sacrificial film 160 formed of an SOH material may be easily removed via the ashing or stripping process without having to perform a separate etching process. Thus, the active region 116 that was opened in FIGS. 5A through 5C before forming the sacrificial film 160 formed of an SOH material may be opened again.

Alternatively, the sacrificial film 160 may be formed of an amorphous carbon layer (ACL) material instead of an SOH material. The ACL material also contains a large amount of carbon, and thus has similar characteristics as the SOH material.

Figure 7A:
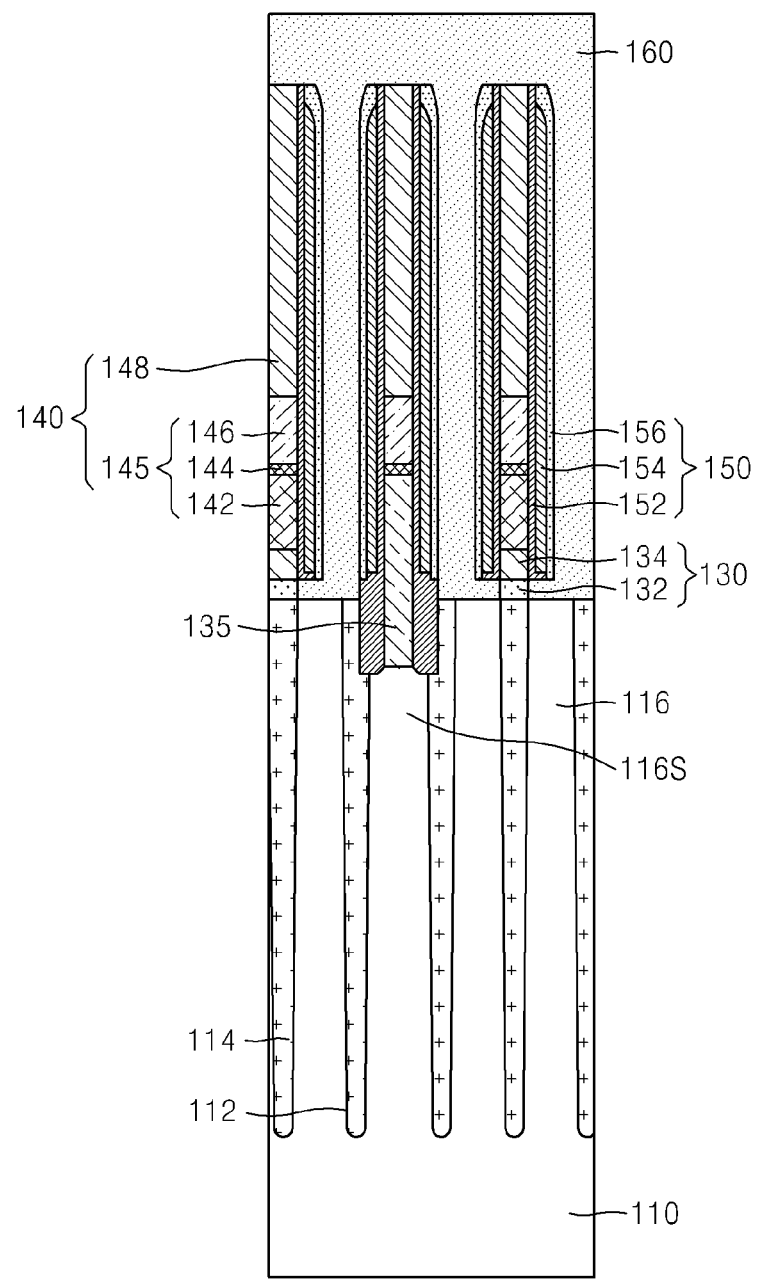
Figure 7B:
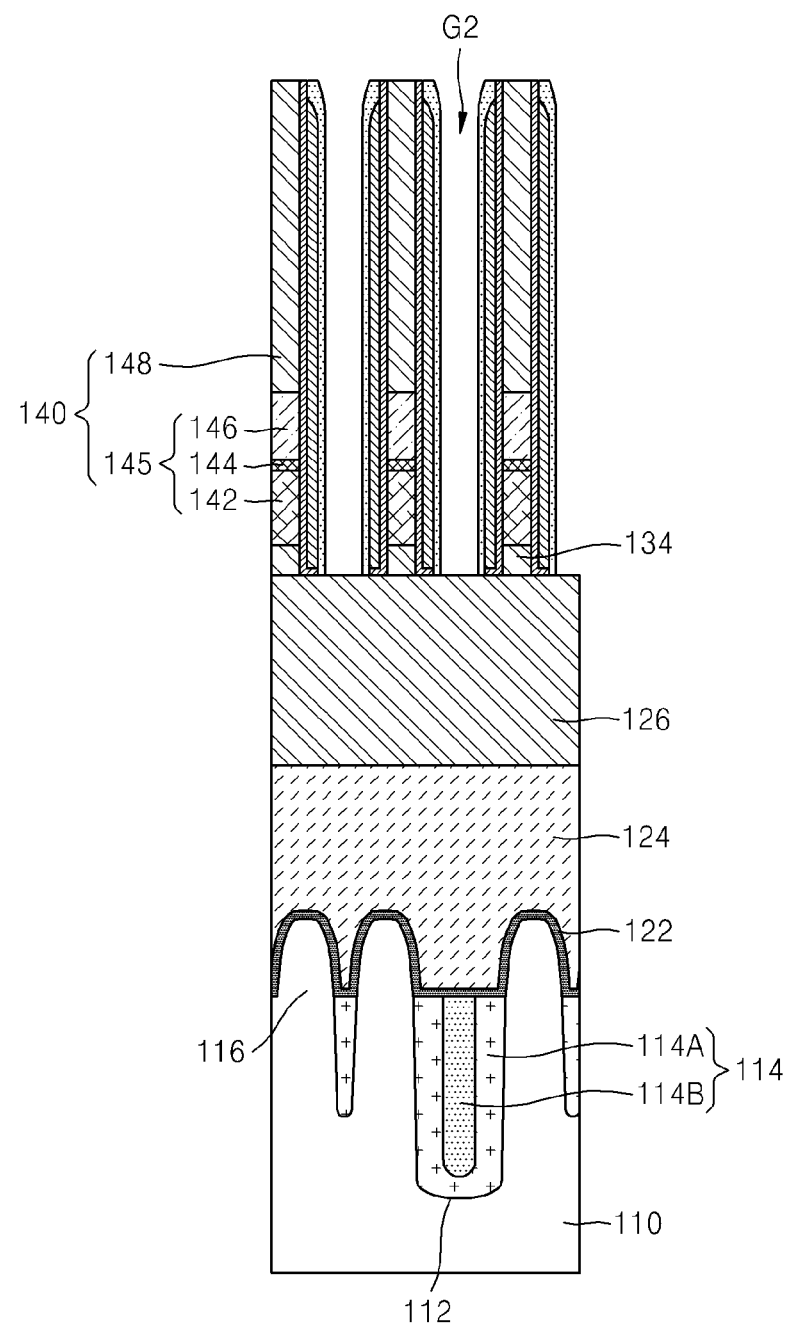
Figure 7C:
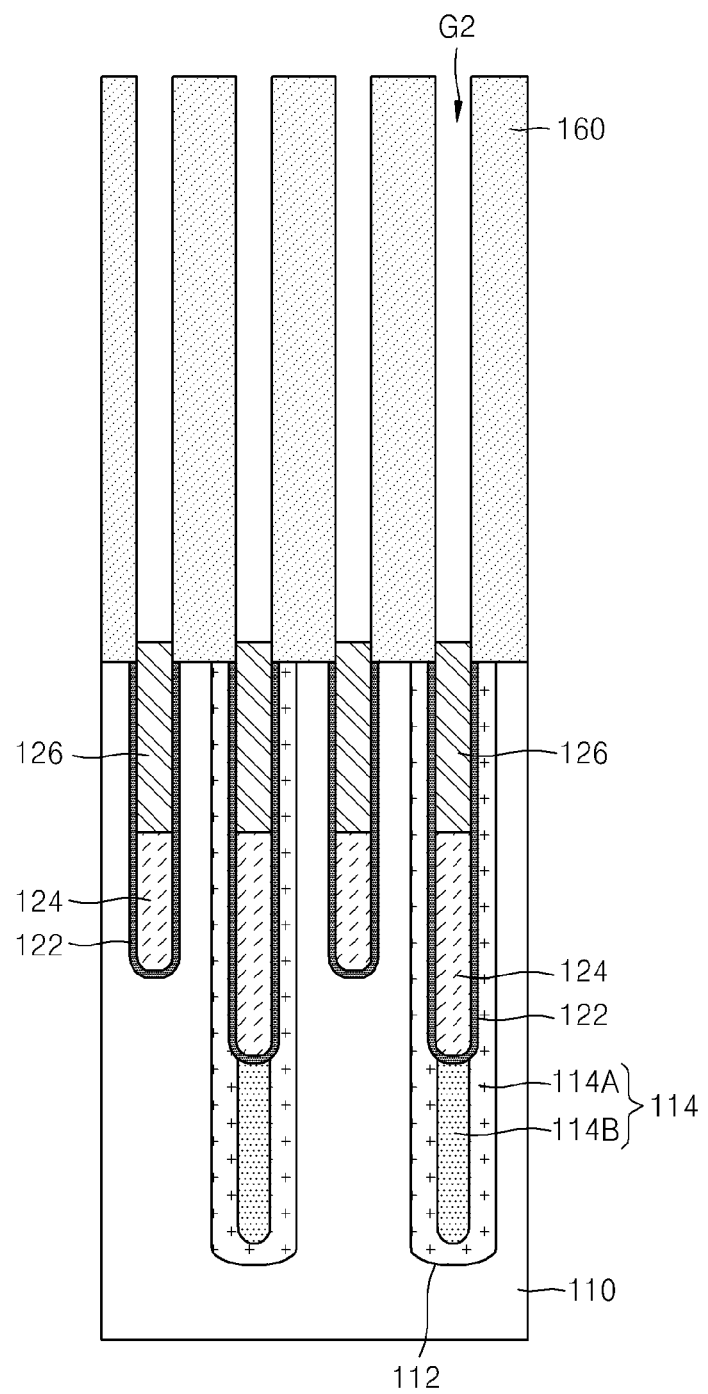

Referring to FIGS. 7A through 7C, after forming a mask pattern (not shown, refer to M of FIG. 30D) having a desired (or alternatively, predetermined) shape on a result product obtained by forming the sacrificial film 160, a part of the sacrificial film 160 is removed by using the mask pattern as an etch mask to form a plurality of second grooves G2 exposing a top surface of the buried insulating film 126. The mask pattern may have a line shape opening a region of a top surface of the sacrificial film 160 corresponding to the word line 124. Accordingly, as shown in FIG. 7C, the second groove G2 may expose a region of a top surface of the buried insulating film 126 corresponding to the word line 124.

Meanwhile, while forming the second groove G2, the bit line structure 140 and the multi-film spacer 150 may operate as an etch mask, together with the mask pattern. Accordingly, as shown in FIG. 7B, the second groove G2 may inwardly expose the multi-film spacer 150 on a side wall of the bit line structure 140, i.e., expose the second spacer 156.

As described above, since the bit line structure 140 and the multi-film spacer 150 are perpendicular to the word line 124, the bit line structure 140 and the multi-film spacer 150 are also perpendicular to the mask pattern. Accordingly, the second groove G2 formed by using the bit line structure 140, the multi-film spacer 150, and the mask pattern as an etch mask may have a rectangular structure surrounded by the bit line structure 140, the multi-film spacer 150, and the sacrificial film 160.

The mask pattern is removed after the second groove G2 is formed.

The second groove G2 formed here may correspond to a fence region surrounding the buried contact BC formed later. The fence region will be described in detail later with reference to FIGS. 14A and 14B.

Figure 8A:
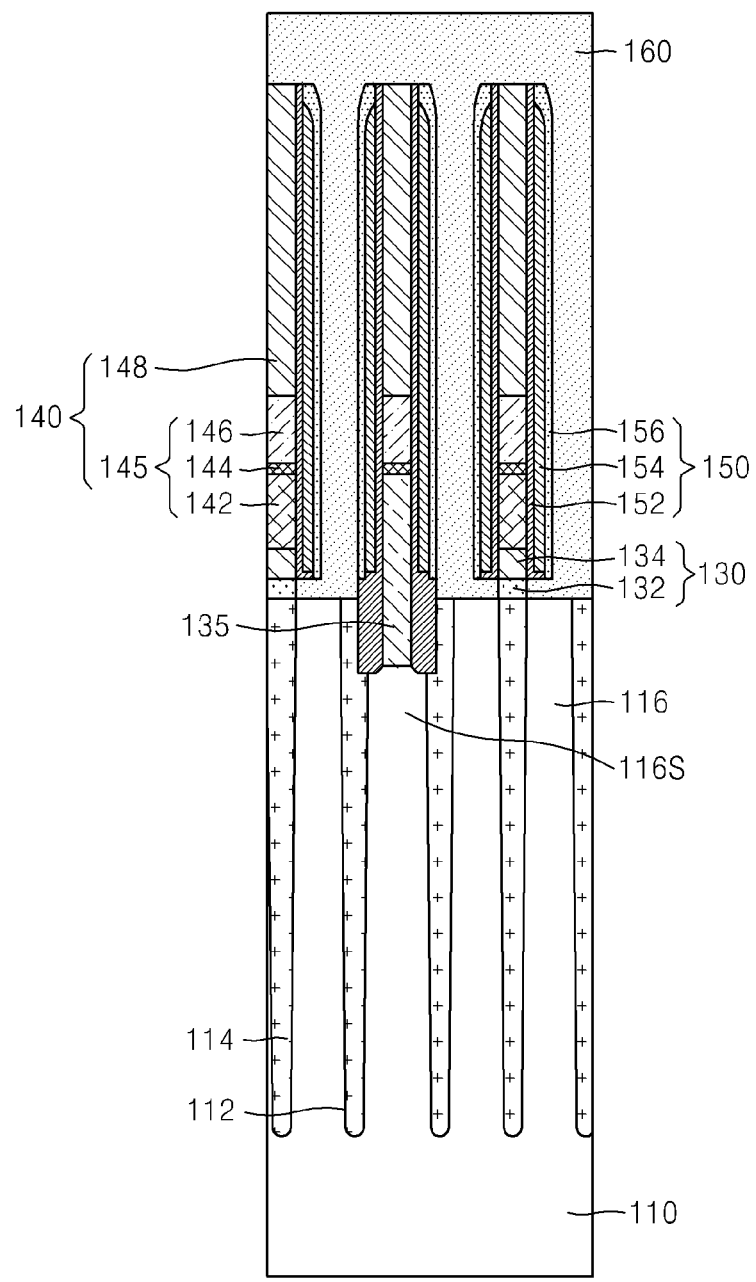
Figure 8B:
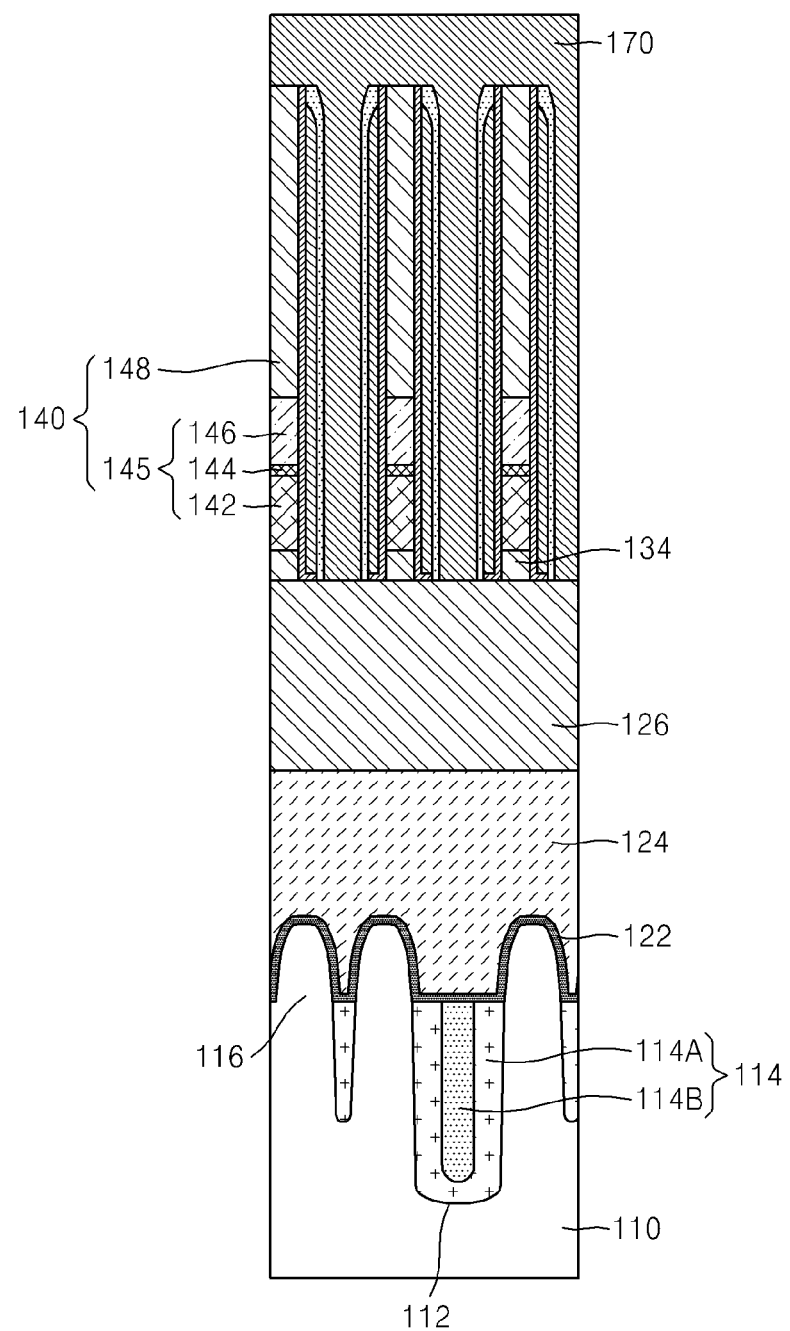
Figure 8C:
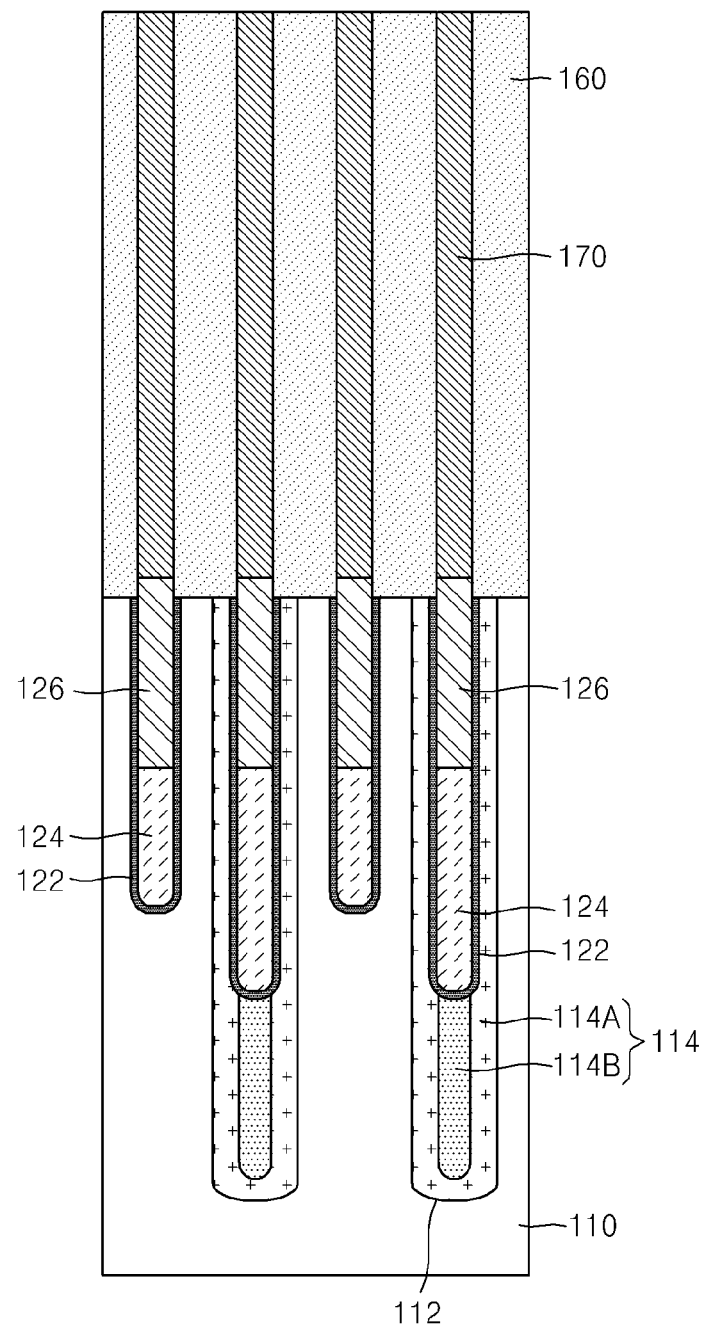

Referring to FIGS. 8A through 8C, a first insulating film 170 filling the second groove G2, i.e., the fence region, and covering the top surfaces of the bit line structure 140 and multi-film spacer 150 is formed. The first insulating film 170 may be an oxide insulating film.

The first insulating film 170 may later be a fence surrounding two side surfaces of the buried contact BC.

Figure 9A:
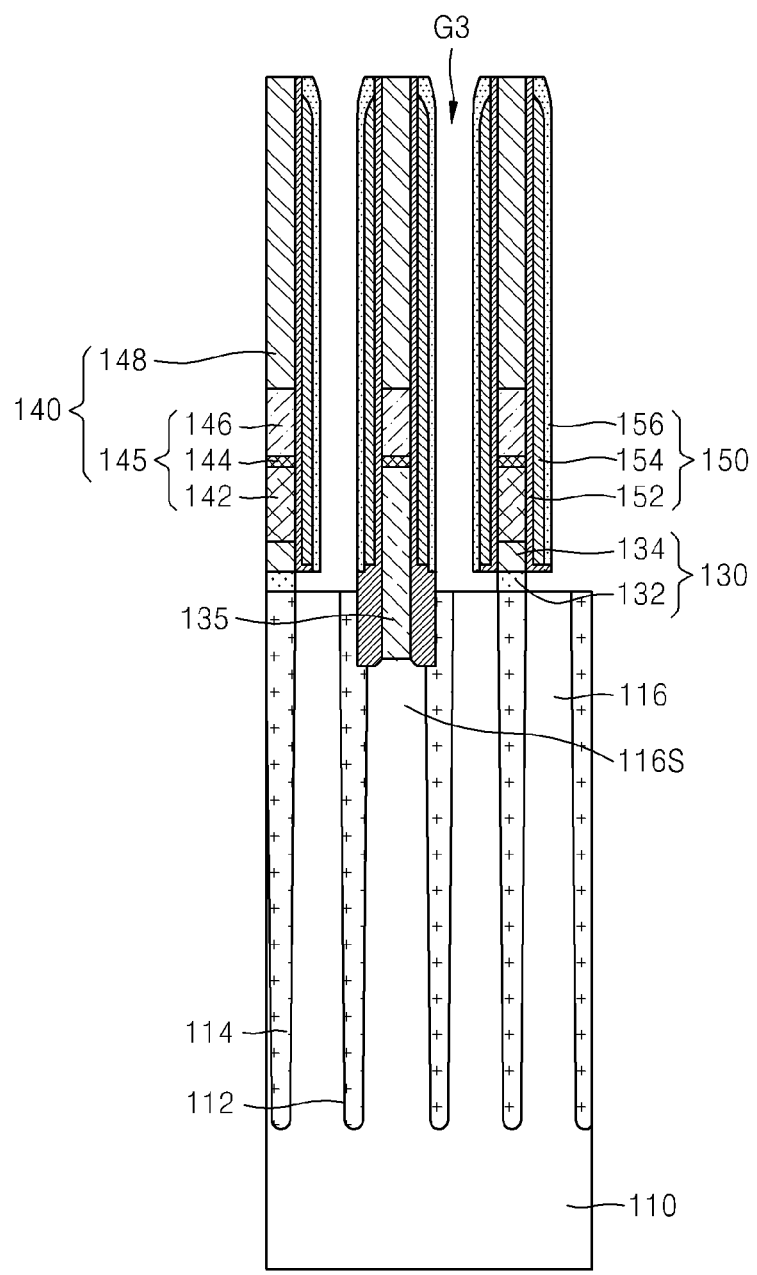
Figure 9B:
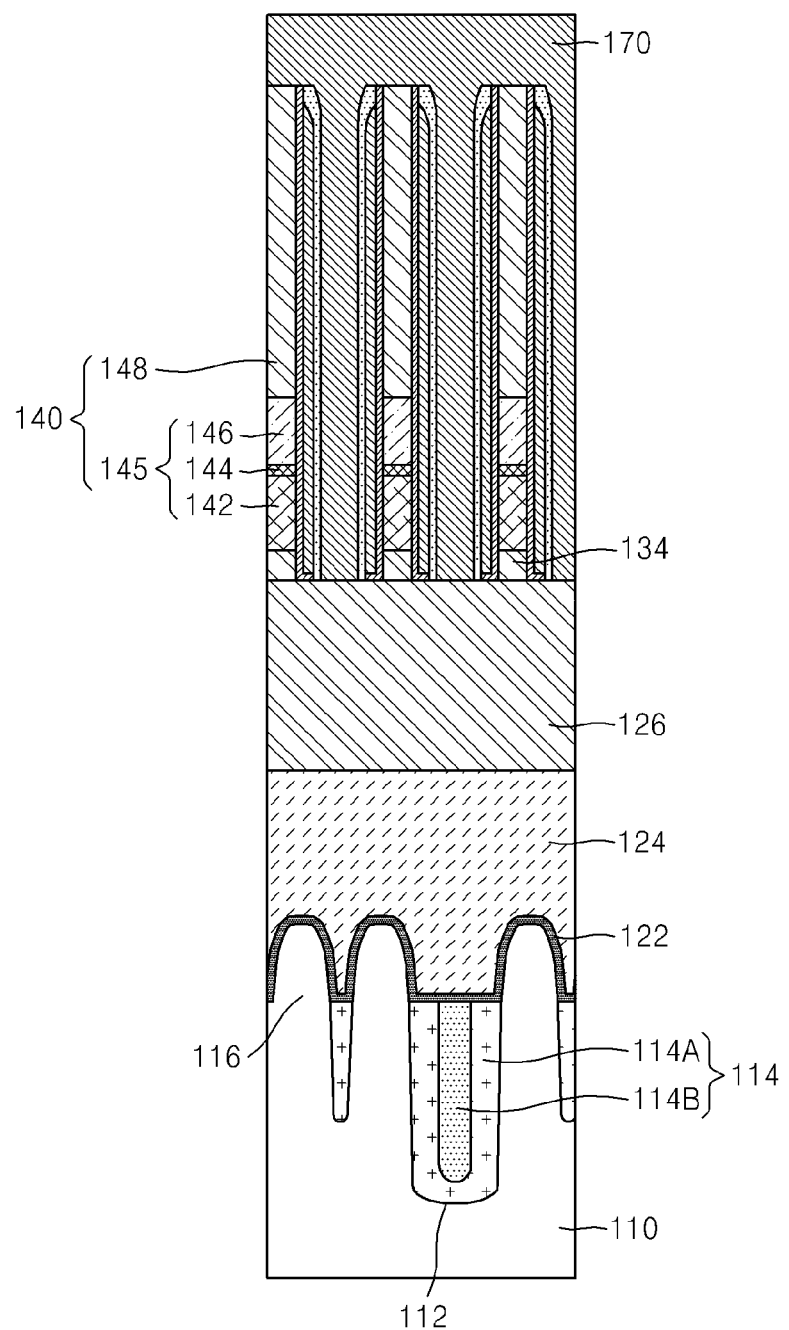
Figure 9C:
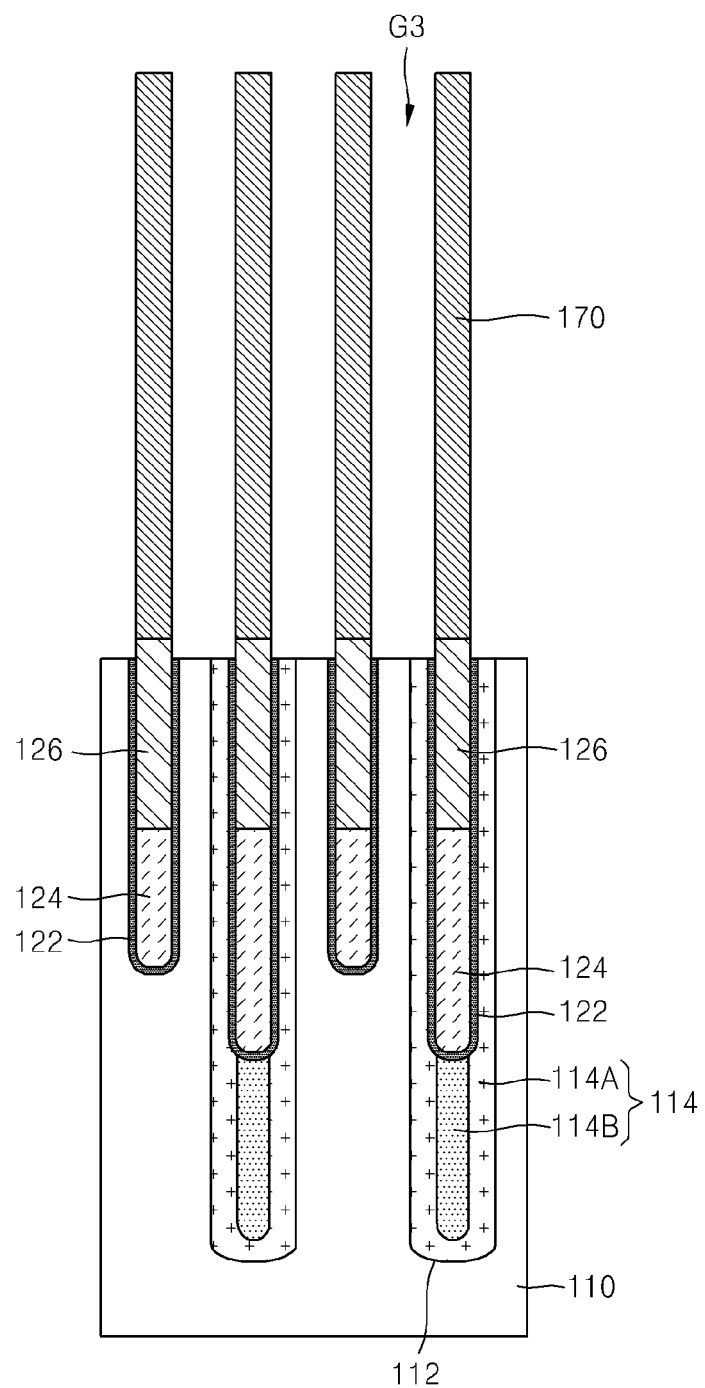

Referring to FIGS. 9A through 9C, a plurality of third grooves G3 opening the top surface of the active region 116 is formed by removing the sacrificial film 160 formed of an SOH material. As described above, the sacrificial film 160 may be removed via ashing and stripping processes. By removing the sacrificial film 160, the top surface of the active region 116 that was opened as shown in FIGS. 5A through 5C before the sacrificial film 160 was formed may be opened again through the third groove G3.

When the active region 116 is opened by removing a sacrificial film formed of an oxide material, unlike removing the sacrificial film 160 formed of an SOH material, an LAL lift off etching process is generally preformed. However, during the LAL lift off etching process, an outermost layer of the multi-film spacer 150, i.e., the second spacer 156 formed of a nitride material, is etched and thus a loss may be generated. In other words, since an etch selectivity of a nitride film to an oxide film is not high, the second spacer 156 formed of a nitride material is etched and lost during the LAL lift off etching process and the first spacer 154 may be exposed via the loss of the second spacer 156. Since the first spacer 154 is formed of an oxide material, the first spacer 154 may be etched with the sacrificial film, and thus the multi-film spacer 150 may be partially crushed or removed. If the multi-film spacer 150 is partially crushed or removed, a device defect, such as exposure of a bit line, may be generated.

Meanwhile, since the device isolating film 114 is also formed of an oxide material, the device isolating film 114 exposed on a bottom surface of the third groove G3 may be etched during the LAL lift off etching process, and thus a recess may be formed.

However, in the method according to at least one example, the sacrificial film 160 formed of an SOH material having a high etch selectivity to the multi-film spacer 150 is used, and thus the active region 116 may be easily and stably opened without damaging the multi-film spacer 150. In other words, by removing the sacrificial film 160 formed of an SOH material via the ashing and stripping processes, the second spacer 156 of the multi-film spacer 150 may not be lost while opening the active region 116 and a recess may be mitigated (or alternatively, prevented from being formed) on the device isolating film 114 exposed on the bottom surface of the third groove G3.

Figure 10A:
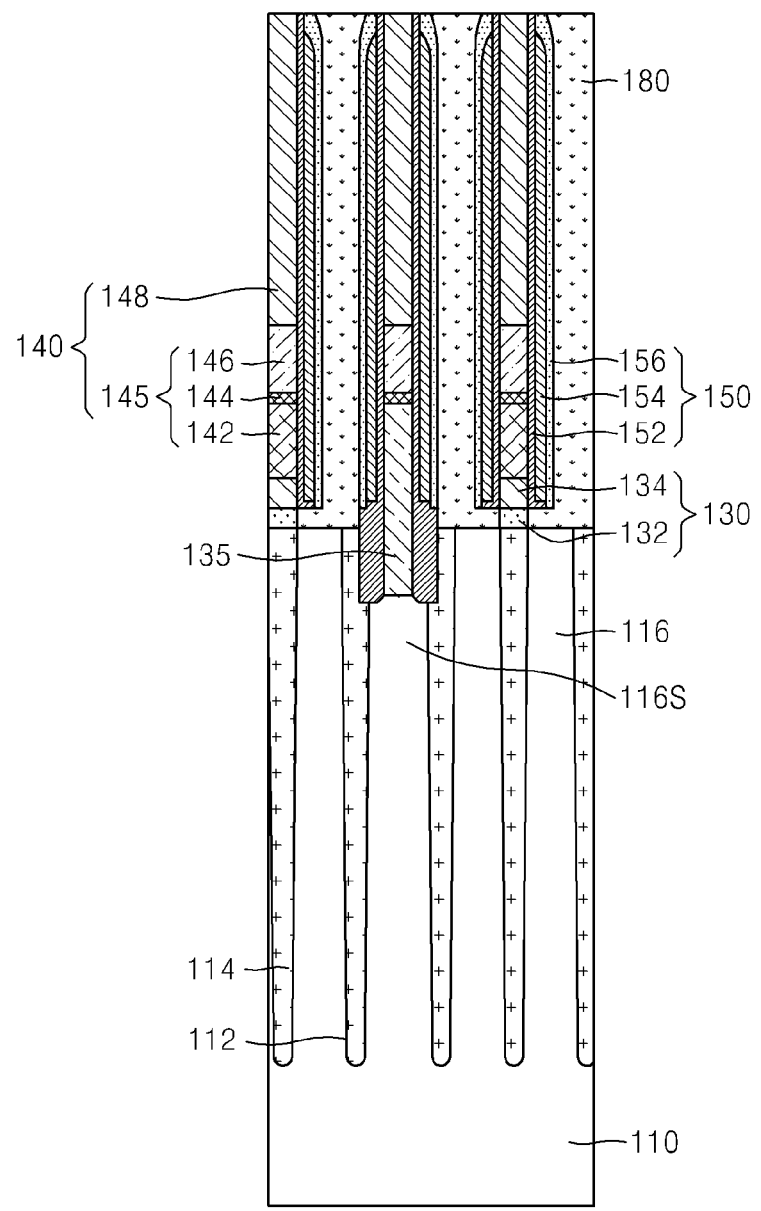
Figure 10B:
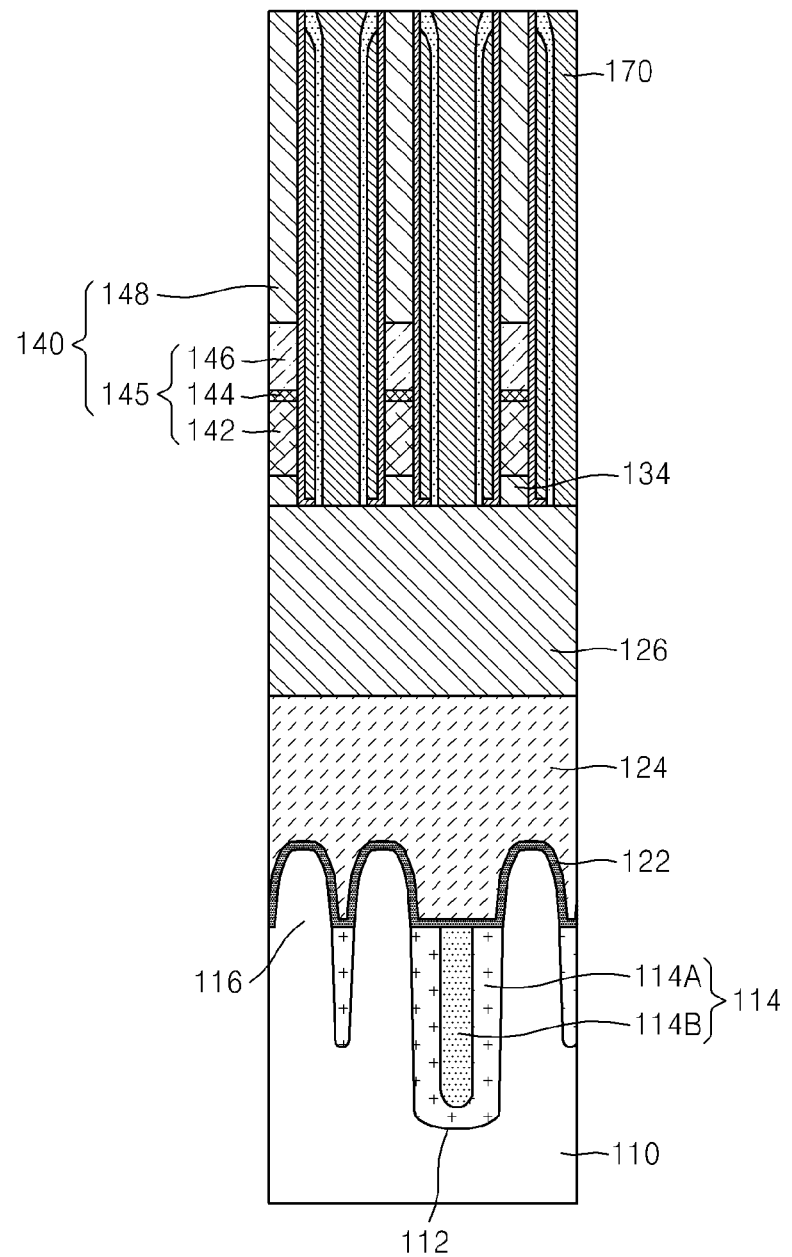
Figure 10C:
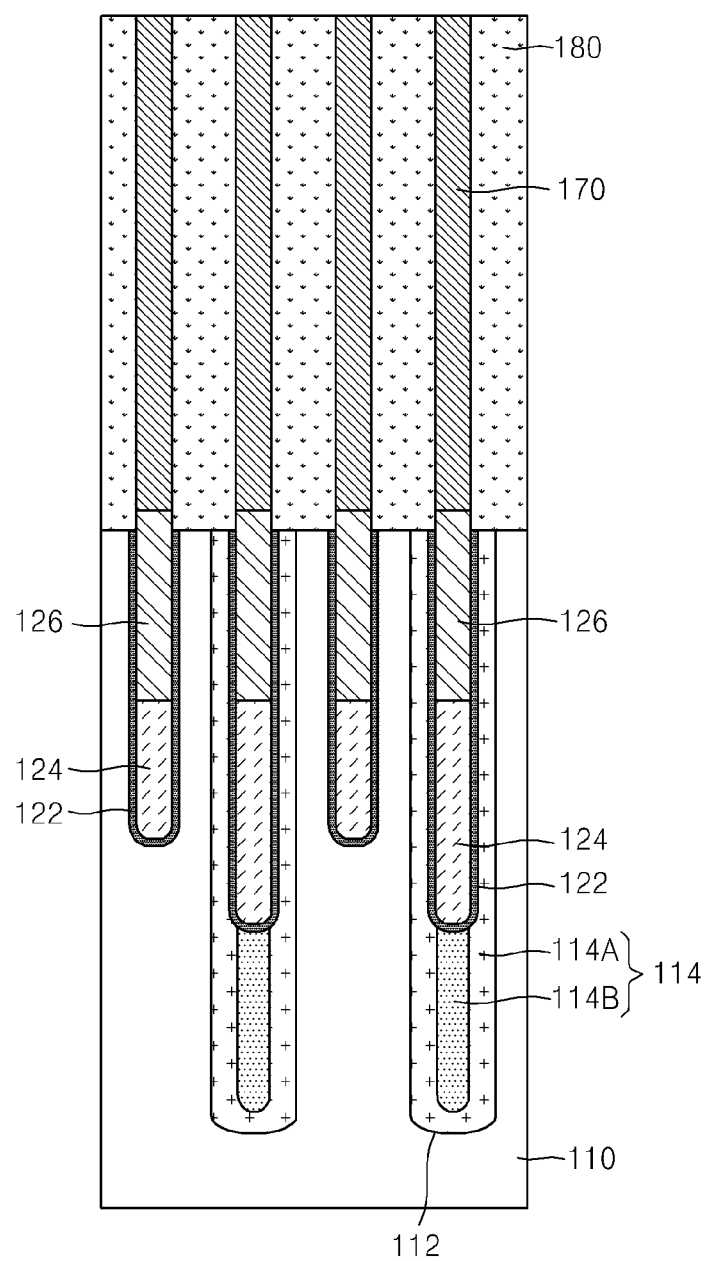

Referring to FIGS. 10A through 10C, a conductive material film (not shown) filling the third groove G3 and covering top surfaces of the bit line structure 140 and multi-film spacer 150 is formed. Then, a top portion of the conductive material film is removed via CMP to expose the top surfaces of the bit line structure 140 and multi-film spacer 150, thereby forming a plurality of buried contacts 180.

The buried contact 180 may be formed of polysilicon. Here, the polysilicon may be impurity-doped polysilicon. According to circumstances, the buried contact 180 may be formed of a metal, a metal silicide, a metal nitride, or a combination thereof. The buried contact 180 may include a barrier film (not shown) covering an inner wall of the third groove G3 and a conductive film filling the third groove G3 on the barrier film. According to one or more example embodiments, the barrier film may have a Ti/TiN stacked structure.

When the buried contact 180 is formed of a metal material, a metal silicide film (not shown) may be formed between the buried contact 180 and the active region 116. For example, the metal silicide film may be a cobalt (Co) silicide film. However, the metal silicide film is not limited thereto. In other words, the metal silicide film may be formed of any one of various metal silicides.

According to one or more example embodiments, following processes may be performed to form the buried contact 180. First, after washing a result product obtained by forming the third groove G3, the barrier film covering the inner wall of the third groove G3 may be formed on the entire result product. Next, a conductive film having a sufficient thickness to fill the third groove G3 is formed on the barrier film, and then the conductive film is polished via CMP until the barrier film is exposed, thereby forming the buried contact 180 in the third groove G3.

Figure 11A:
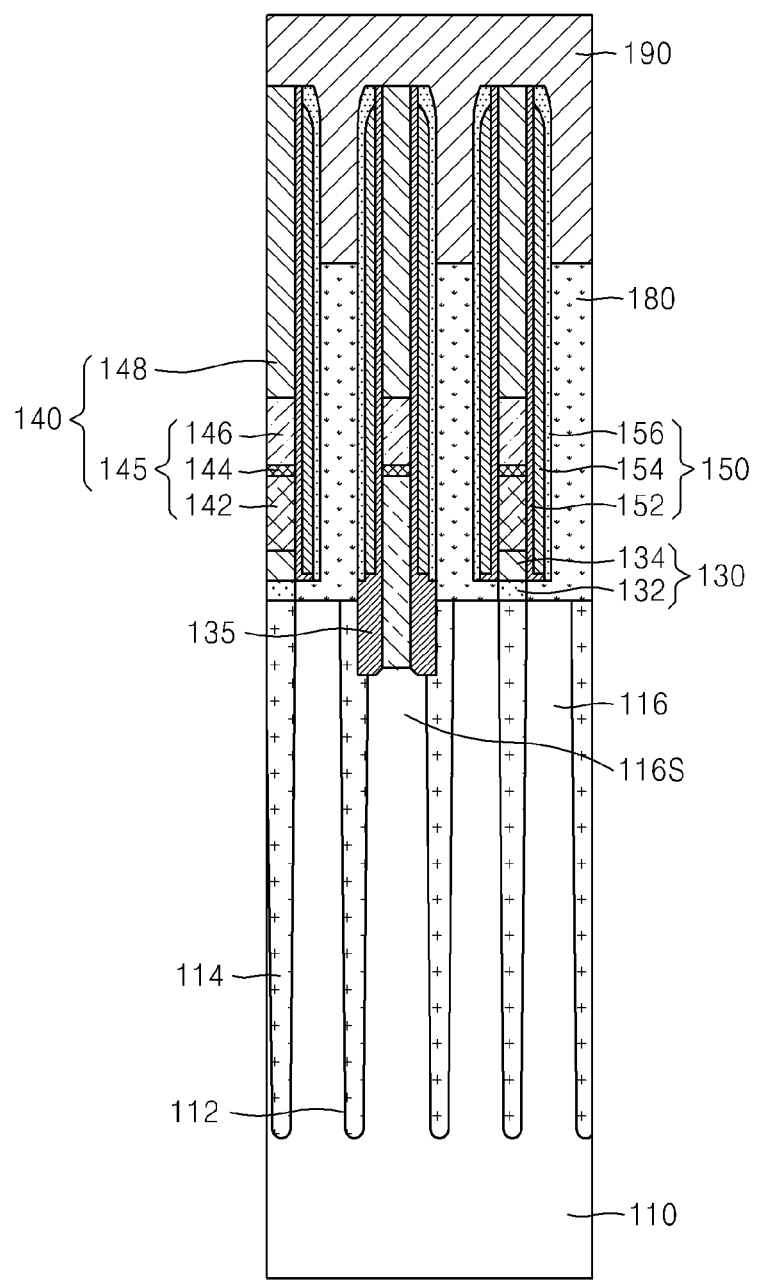
Figure 11B:
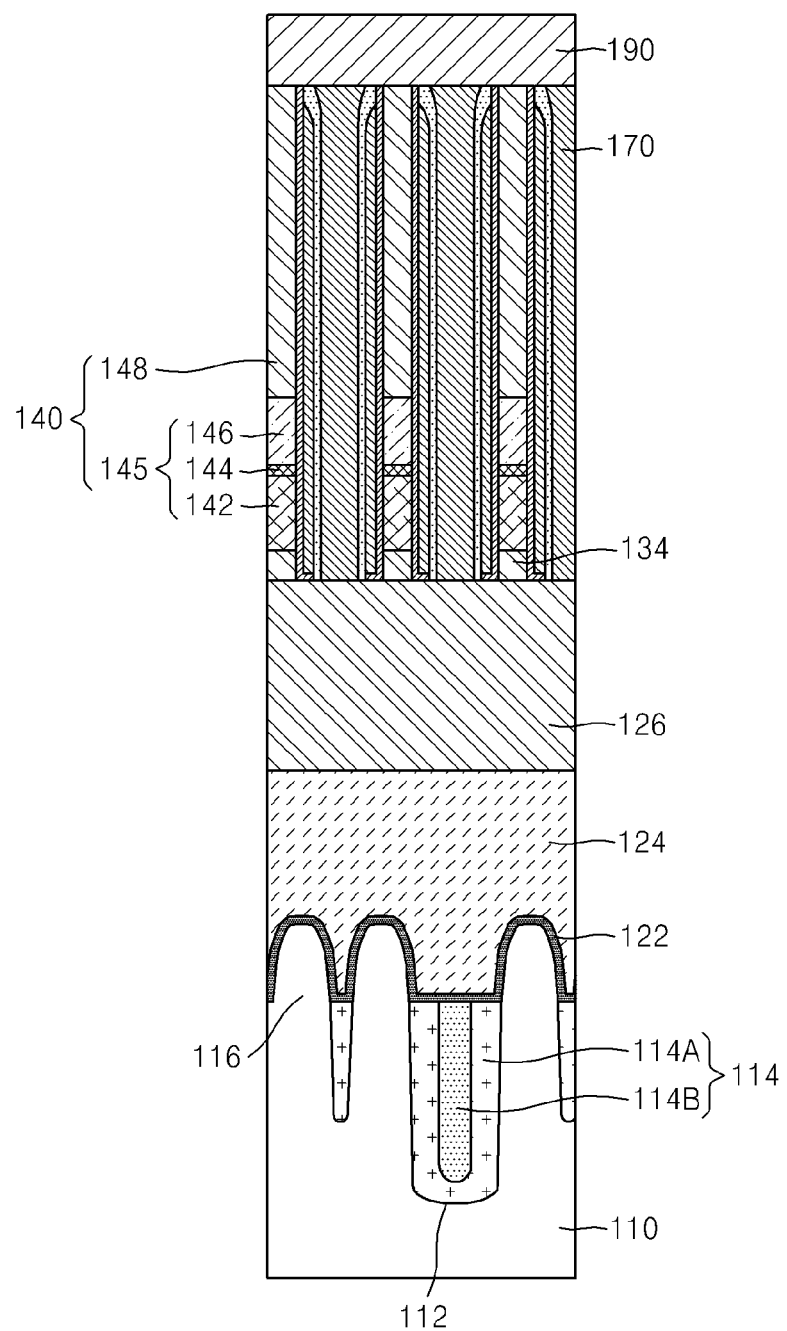
Figure 11C:
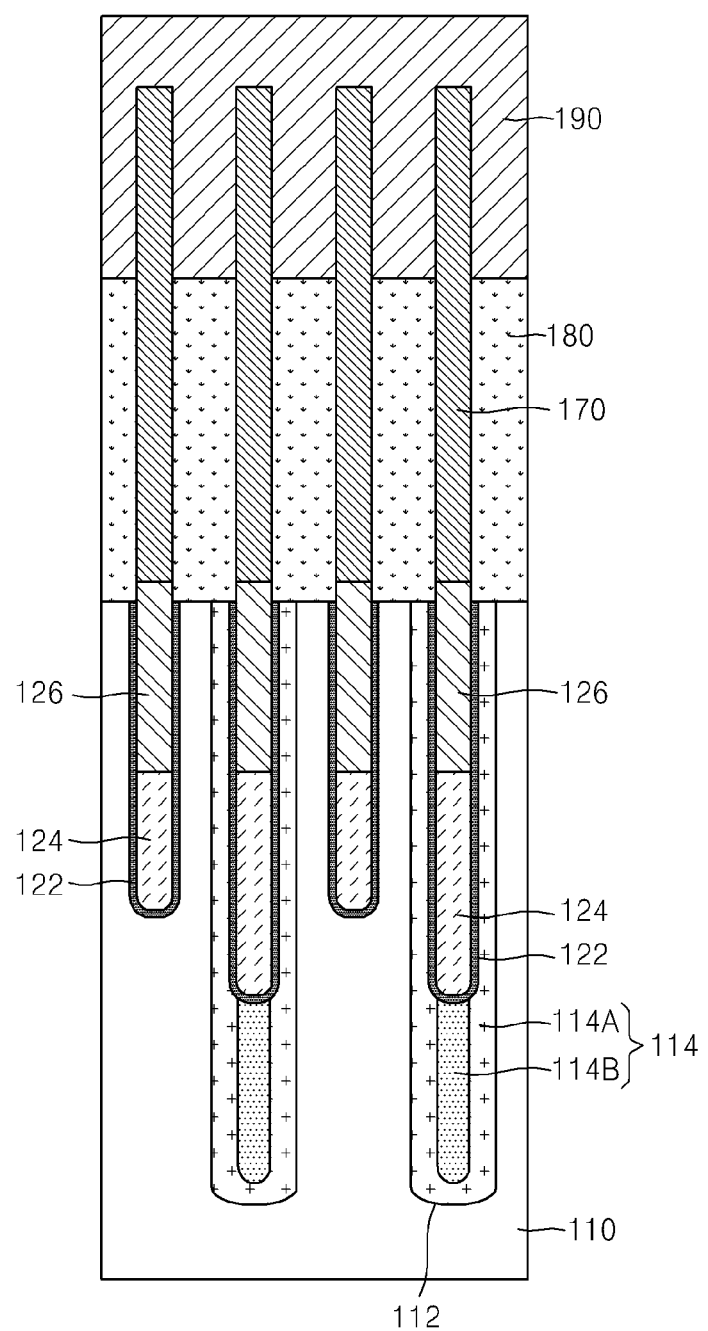

Referring to FIGS. 11A through 11C, a top portion of the buried contact 180 is removed via etch-back to form a groove (not shown). A metal film 190 filling the groove and covering the top surfaces of the bit line structure 140 and multi-film spacer 150 is formed.

The metal film 190 may include a metal silicide film (not shown) in a region contacting the buried contact 180. For example, the metal silicide film may be a Co silicide film. However, as described above, the metal silicide film is not limited thereto.

According to one or more example embodiments, following processes may be performed to form the metal silicide film. First, a metal material film is formed on a surface of the buried contact 180 formed of polysilicon and exposed on a bottom surface of the groove, and then a first rapid thermal silicidation (RTS) process is performed. The first RTS process may be performed at a temperature from about 450° C. to about 550° C. Then, a metal material film that does not react with Si atoms during the first RTS process is removed, and a second RTS process is performed at a temperature higher than that of the first RTS process, for example, from about 800° C. to about 950° C., thereby forming the metal silicide film. If a Co film is formed as the metal material film, the Co silicide film may be formed.

The metal film 190 may include a barrier film (not shown) covering the inner wall of the groove and the top surfaces of the bit line structure 140 and multi-film spacer 150, an inner metal film filling the groove on the barrier film, and an upper metal film covering the top surfaces of the bit line structure 140 and multi-film spacer 150 on the barrier film. According to one or more example embodiments, the barrier film may have a Ti/TiN stacked structure as described above. Also, according to one or more example embodiments, at least one of the inner metal film and the upper metal film may include W (tungsten).

According to one or more example embodiments, following processes may be performed to form the metal film 190. First, a result product obtained by forming the groove via etch-back is washed, and then the barrier film covering the inner wall of the groove may be formed throughout the result product. Next, a metal material film filling the groove and covering the top surfaces of the bit line structure 140 and multi-film spacer 150 is formed on the barrier film and then flattened to form the inner metal film and the upper metal film. Alternatively, according to circumstances, the inner metal film and the upper metal film may be separately formed. For example, after forming the metal material film, the inner metal film may be formed in the groove by etching back or polishing the metal material film until the barrier film is exposed. Then, the metal material film is formed again on the barrier film and the inner metal film and then flattened to form the upper metal film.

Figure 12A:
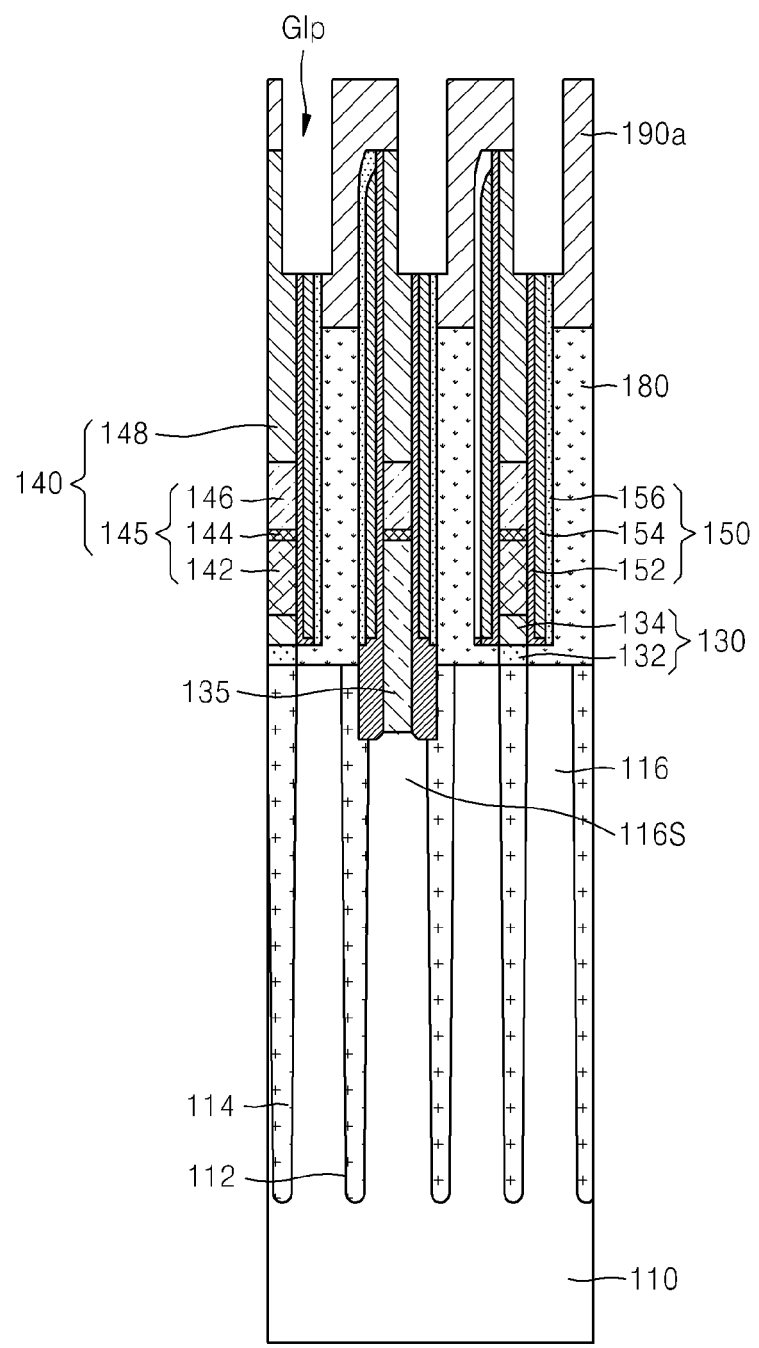
Figure 12B:
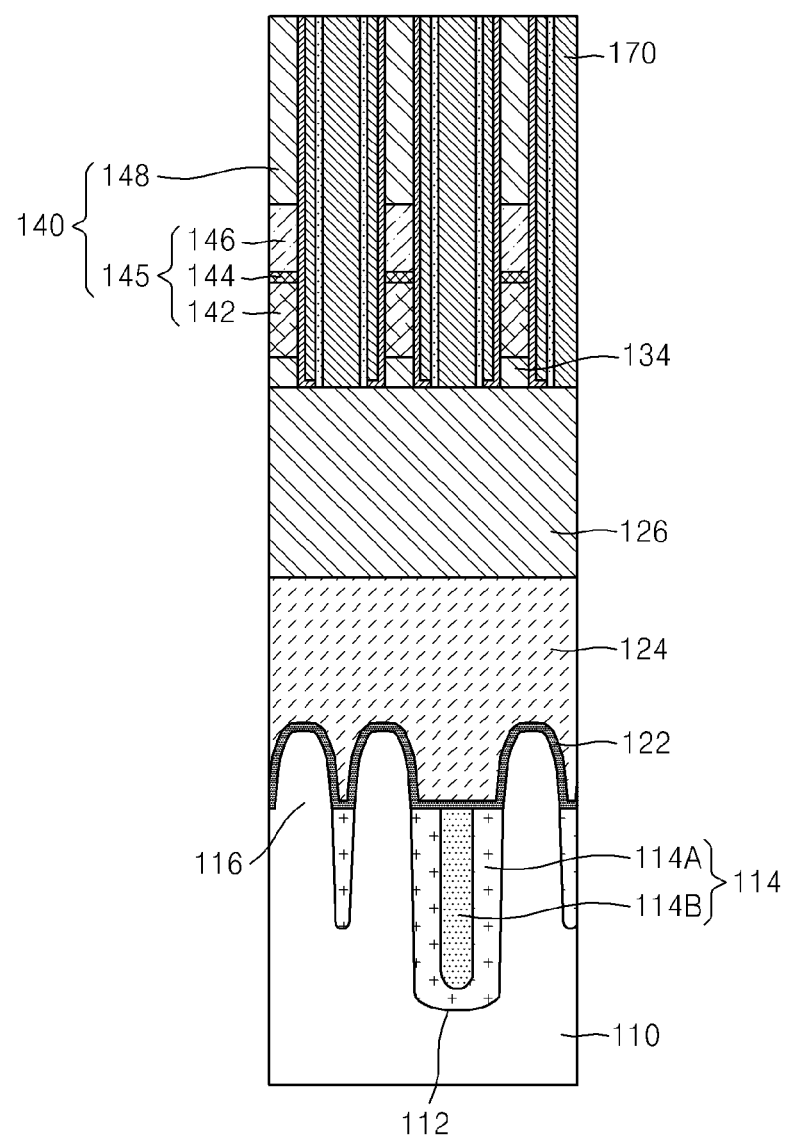
Figure 12C:
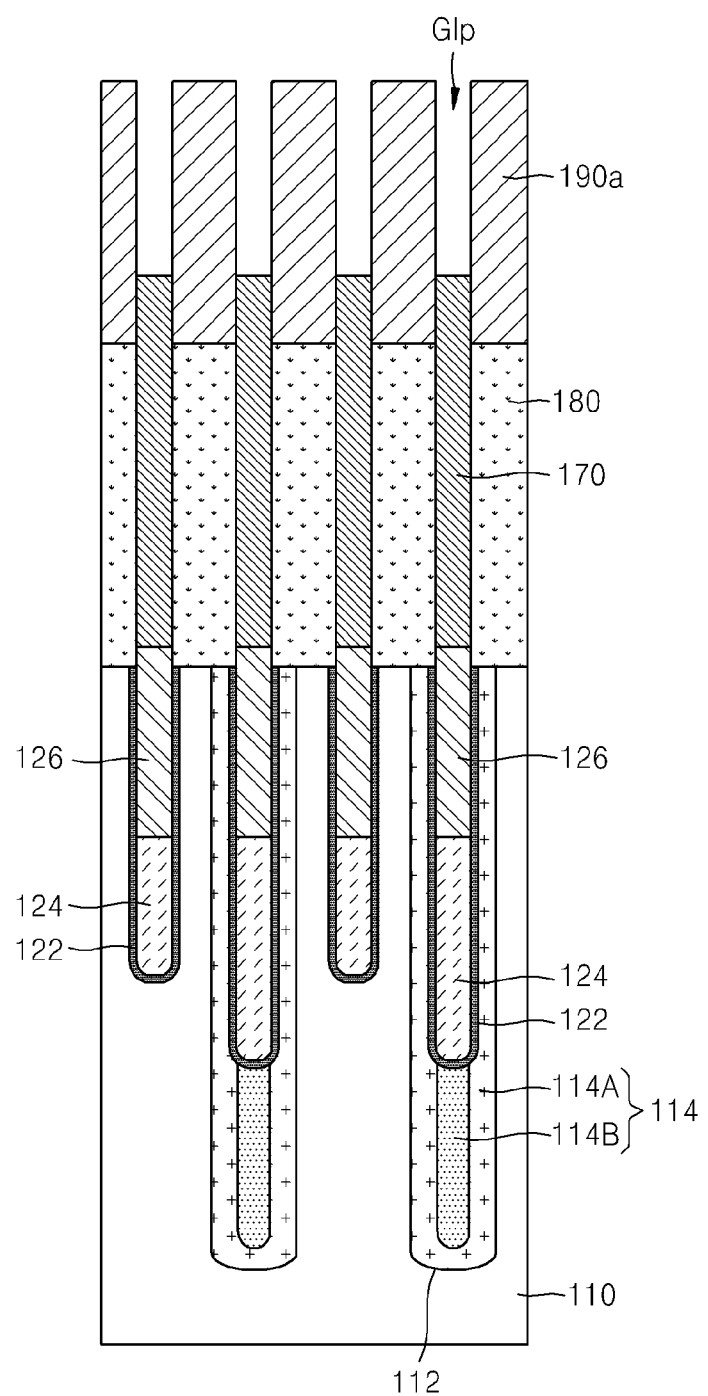

Referring to FIGS. 12A through 12C, a mask pattern (not shown) is formed on the metal film 190, and then the metal film 190 and parts of the bit line structure 140 and multi-film spacer 150 below the metal film 190 are etched by using the mask pattern as an etch mask to form a plurality of landing pads 190a each connected to the buried contact 180.

The mask pattern may have island shapes separated from each other like the landing pads LP shown in FIG. 1. Accordingly, while forming the landing pads 190a by using the mask pattern as an etch mask, landing pad grooves Glp shown in FIGS. 12A and 12C are formed, and the landing pads 190a are separated from each other and electrically insulated from each other through the landing pad grooves Glp. Also, a side surface of the bit line structure 140 and a top surface of the multi-film spacer 150 may be exposed through the landing pad groove Glp.

In detail, while forming the landing pad 190a, i.e., while forming the landing pad groove Glp, a top portion of the insulating capping line 148 of the bit line structure 140 and a top portion of the multi-film spacer 150 formed on a side wall of the insulating capping line 148 are removed, and thus the side wall of the insulating capping line 148 and the top surface of the multi-film spacer 150 may be exposed through the landing pad groove Glp.

Meanwhile, as shown in FIGS. 12A through 12C, while forming the landing pad groove Glp, a right side surface of the insulation capping line 148 may be removed, and only a top portion of the multi-film spacer 150 on the right side surface of the insulation capping line 148 may be removed. Accordingly, the landing pad 190a may have a structure covering a left portion of the insulation capping line 148 and the multi-film spacer 150 on a left side wall of the insulation capping line 148. Of course, the landing pads 190a arranged on another line adjacent to the line I-I' of FIG. 1 may have an opposite structure covering a right portion of the insulation capping line 148 and the multi-film spacer 150 on a right side wall of the insulation capping line 148.

Accordingly, similar to the landing pad LP of FIG. 1, the landing pad 190a may be arranged in the zigzag form L1 of FIG. 1 alternately covering the multi-film spacer 150 on a left side wall of the bit line structure 140 and the multi-film spacer 150 on a right side wall of the bit line structure 140 along the first direction (y direction), and may cover the multi-film spacer 150 formed on side walls of the bit line structure 140 in the same direction along the second direction (x direction).

The mask pattern is removed after forming the landing pad 190a.

Figure 13A:
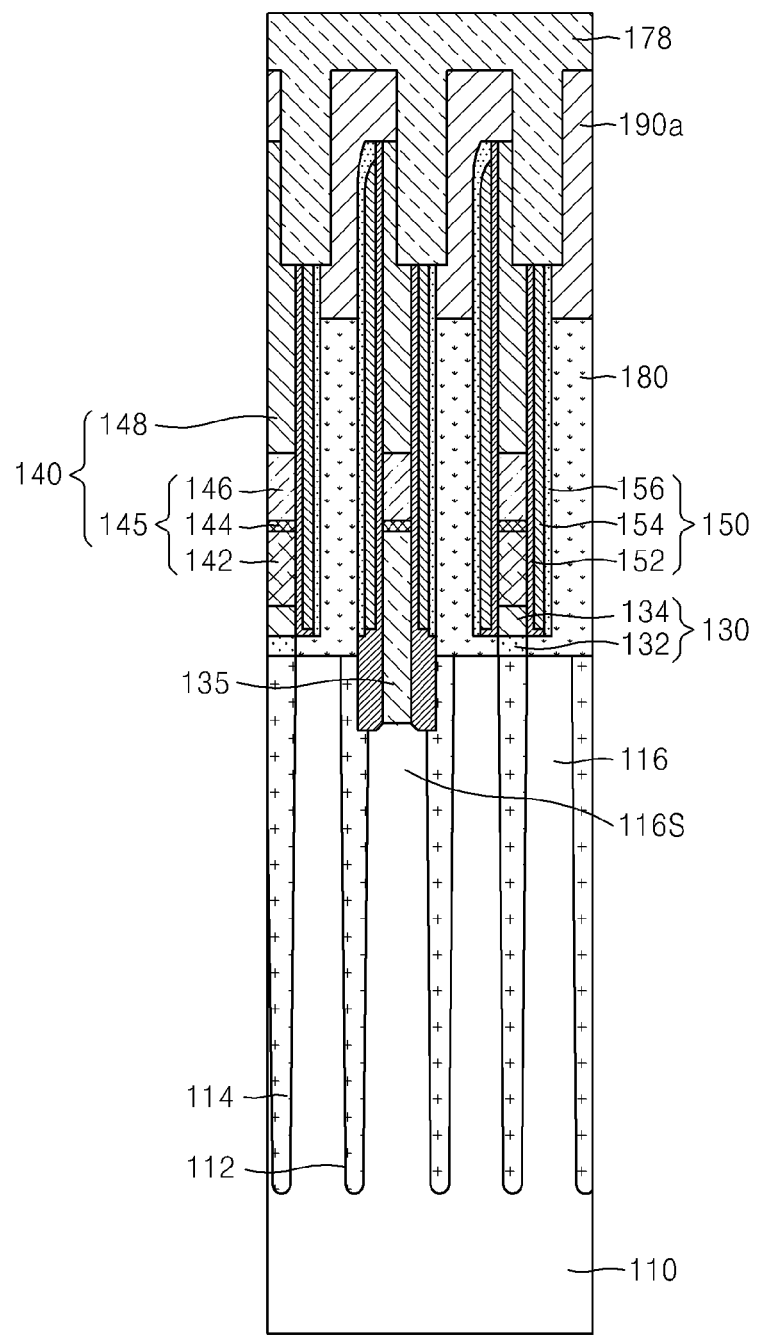
Figure 13B:
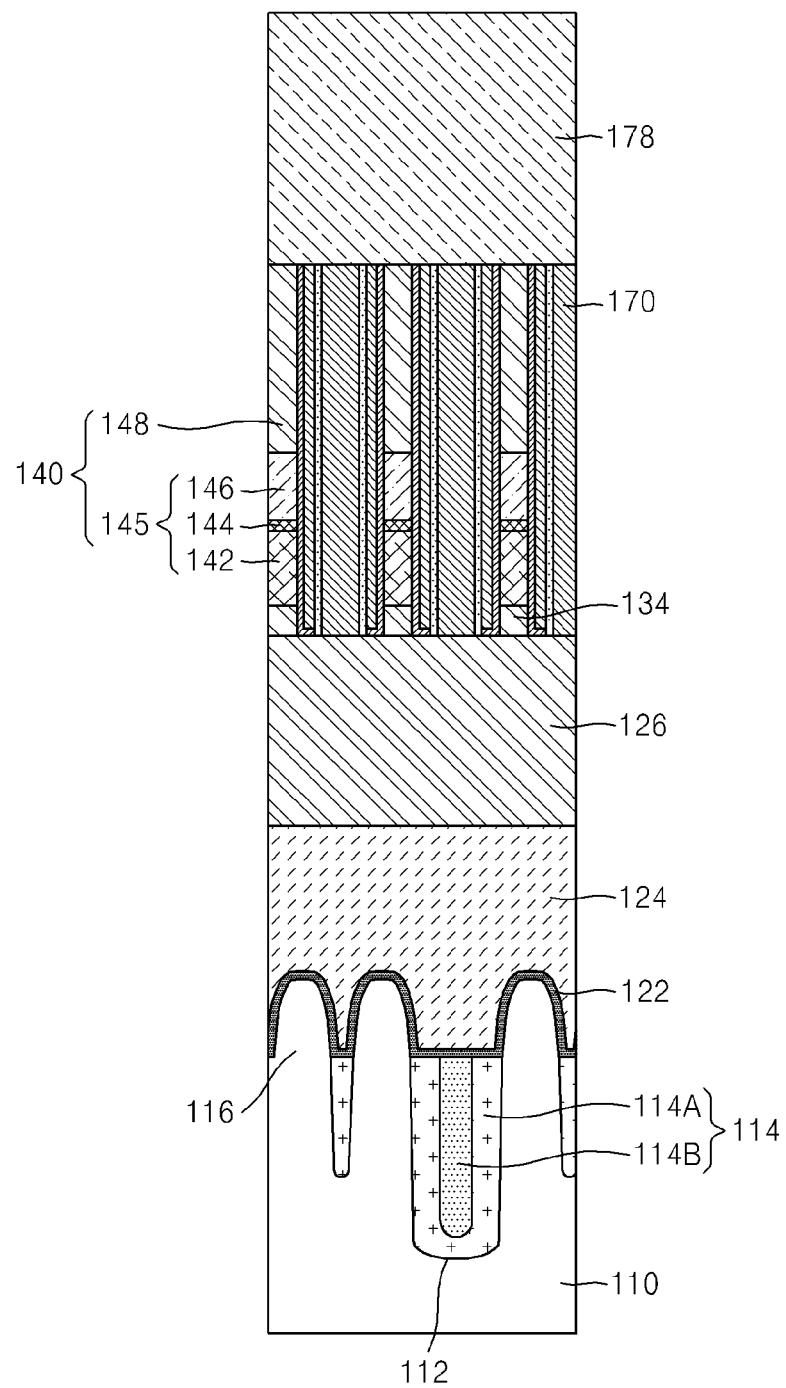
Figure 13C:
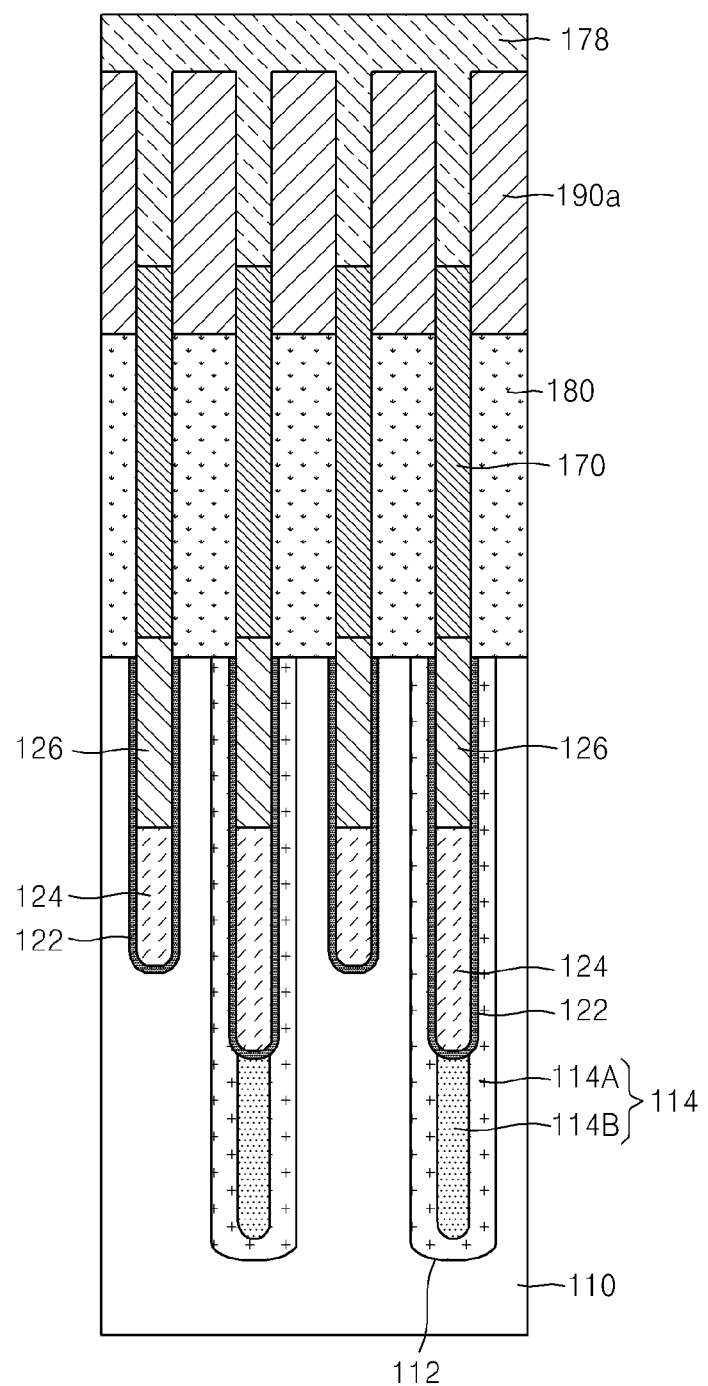

Referring to FIGS. 13A through 13C, after removing the mask pattern, a capping insulating film 178 filing the landing pad groove Glp and covering a top surface of the landing pad 190a is formed. The capping insulating film 178 may be formed of an oxide or nitride insulating material.

After forming the capping insulating film 178, a plurality of capacitors (not shown) electrically connected to the landing pads 190a through the capping insulating film 178 may be formed. For reference, the bit line 145 and the landing pad 190a may respectively correspond to the bit line BL and the landing pad LP of FIG. 1, and the buried contact 180 and the direct contact 135 may respectively correspond to the buried contact BC and the direct contact DC of FIG. 1.

Figure 14A:
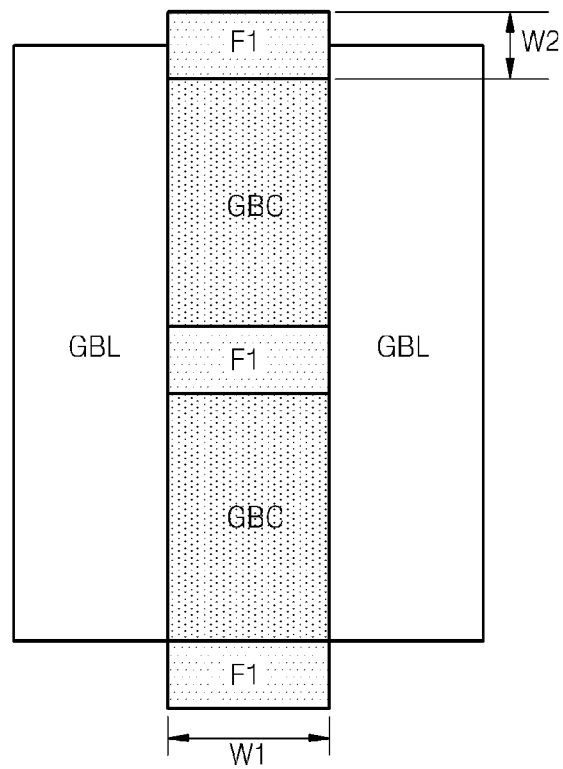
FIGS. 14A and 14B are plan views of semiconductor devices according to at least one example embodiment of the inventive concepts.
Figure 14B:
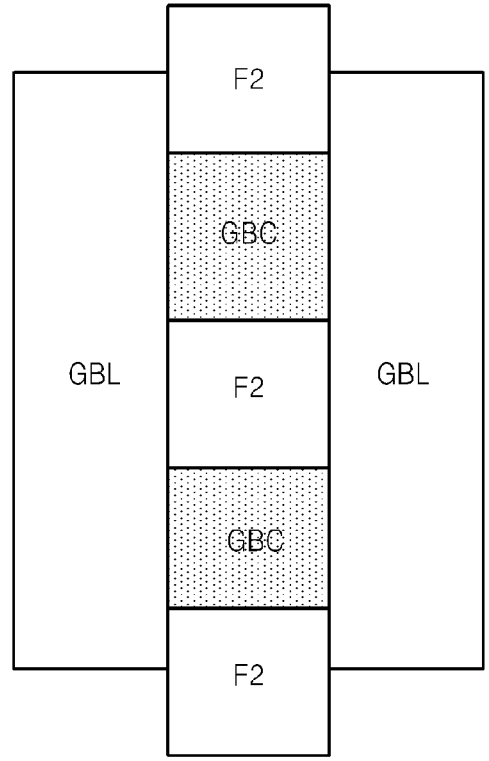

FIGS. 14A and 14B are plan views of semiconductor devices according to at least one example embodiment of the inventive concepts. Here, FIG. 14A may correspond to a plan view of FIG. 10A or 27A, and FIG. 14B may correspond to a plan view of FIG. 16A.

FIG. 14A illustrates the top surfaces of the bit line structure 140 and multi-film spacer 150 exposed by removing the top portion of the conductive material film via CMP after forming the conductive material film in FIGS. 10A through 10C. Here, a global buried contact GBC corresponds to the buried contact 180, a global bit line GBL corresponds to the bit line structure 140 and the multi-film spacer 150, and a fence F1 corresponds to the first insulating film 170 formed of an oxide material. As described above, a fence in which the first insulating film 170 surrounds two sides of the buried contact 180 in the first direction (y direction) is formed.

For reference, G in GBC and GBL stands for global, and may mean that a bit line in a cell region is formed on the same level as a word line in a peripheral region or core region as the word line has an embedded structure in the cell region according to at least one example embodiment. Meanwhile, as shown in FIG. 10A or 10B, the top surface of the insulation capping line 148 formed of a nitride material may be exposed in the bit line structure 140, and the top surfaces of the insulating liner 152 and second spacer 156, each formed of a nitride material, may also be exposed in the multi-film spacer 150. Accordingly, since the exposed top surfaces of the bit line structure 140 and multi-film spacer 150 are both formed of a nitride material, the bit line structure 140 and the multi-film spacer 150 correspond to the global bit line GBL.

Accordingly, in the semiconductor device of at least one example embodiment, the global buried contact GBC may have a structure whose left and right side surfaces in the second direction (x direction) are surrounded by the global bit line GBL formed of a nitride material and top and bottom side surfaces in the first direction (y direction) are surrounded by the fence F1 formed of an oxide material. Since an energy bandgap of an oxide material is higher than a nitride material, when the fence F1 is formed of an oxide material, the fence F1 may have a thinner width than a fence formed of a nitride material. Accordingly, a first direction width W2 of the fence F1 formed of an oxide material may be reduced and thus a first direction width of the global buried contact GBC is increased, thereby reducing contact resistance.

Figure 27A:
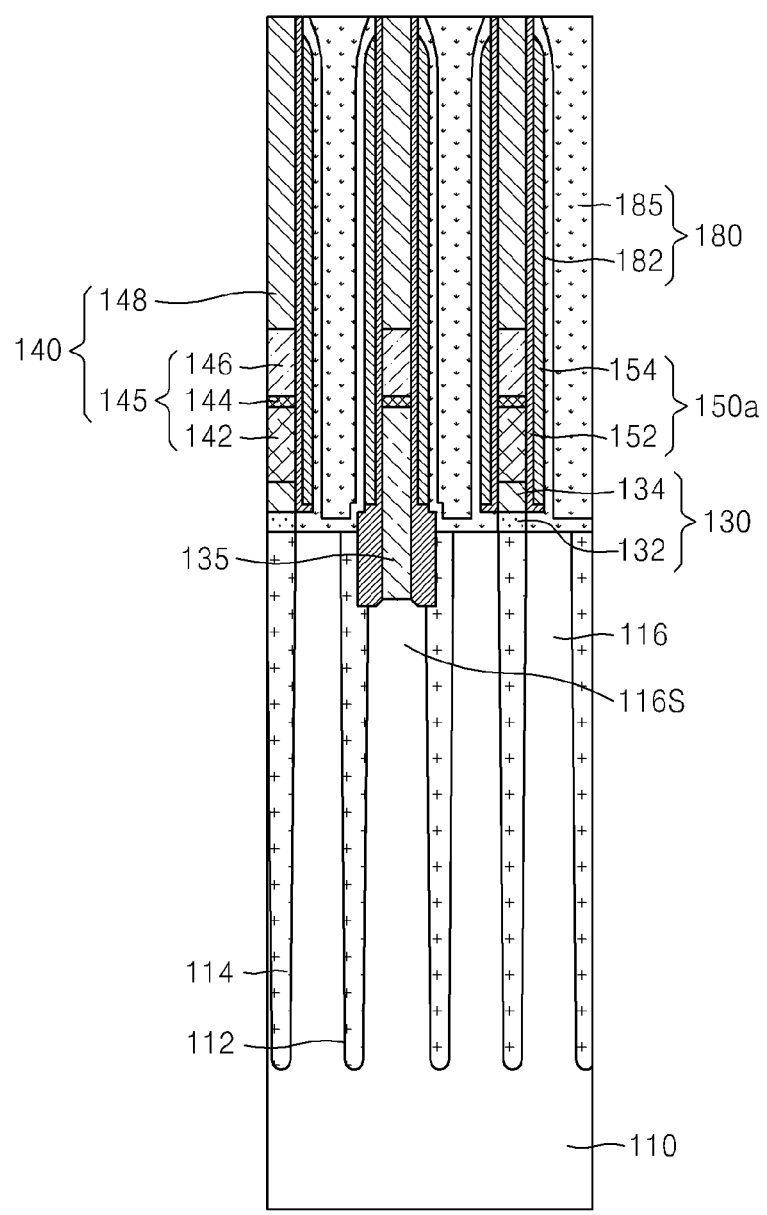
Figure 27B:
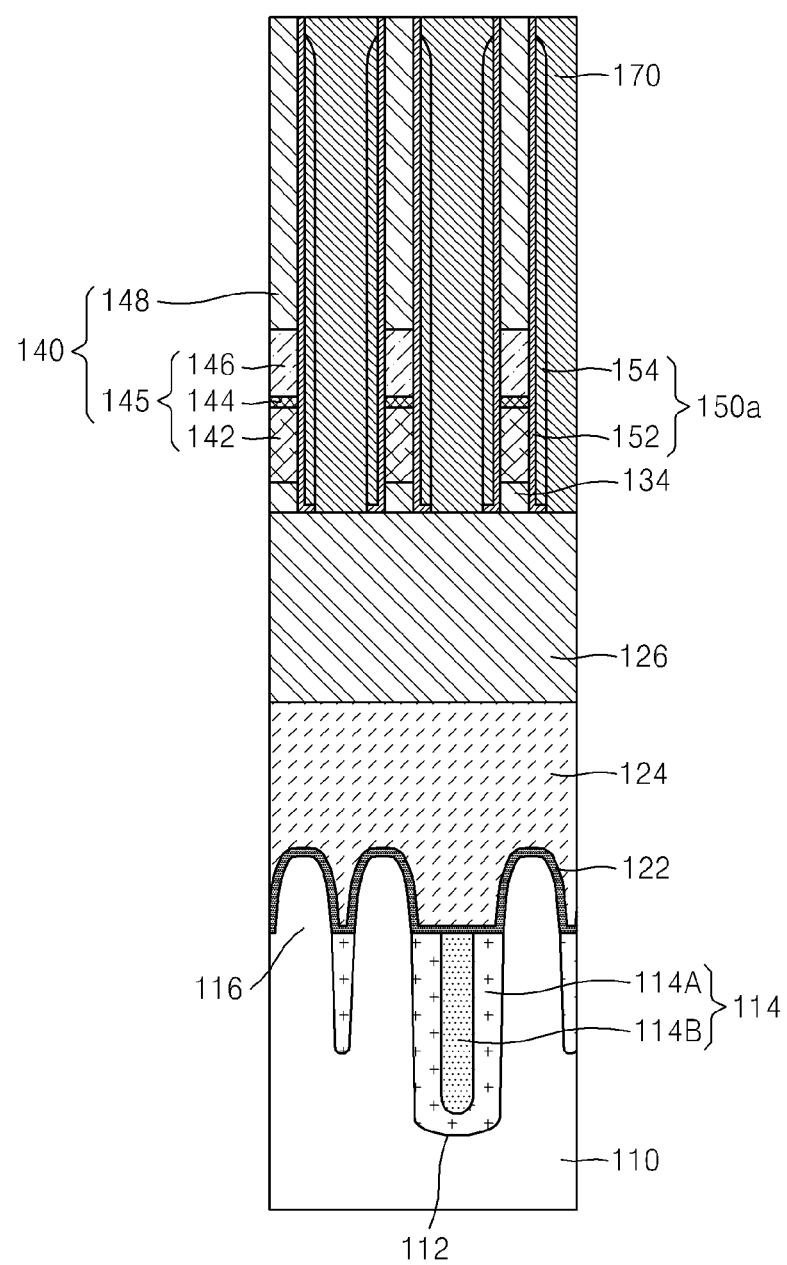
Figure 27C:
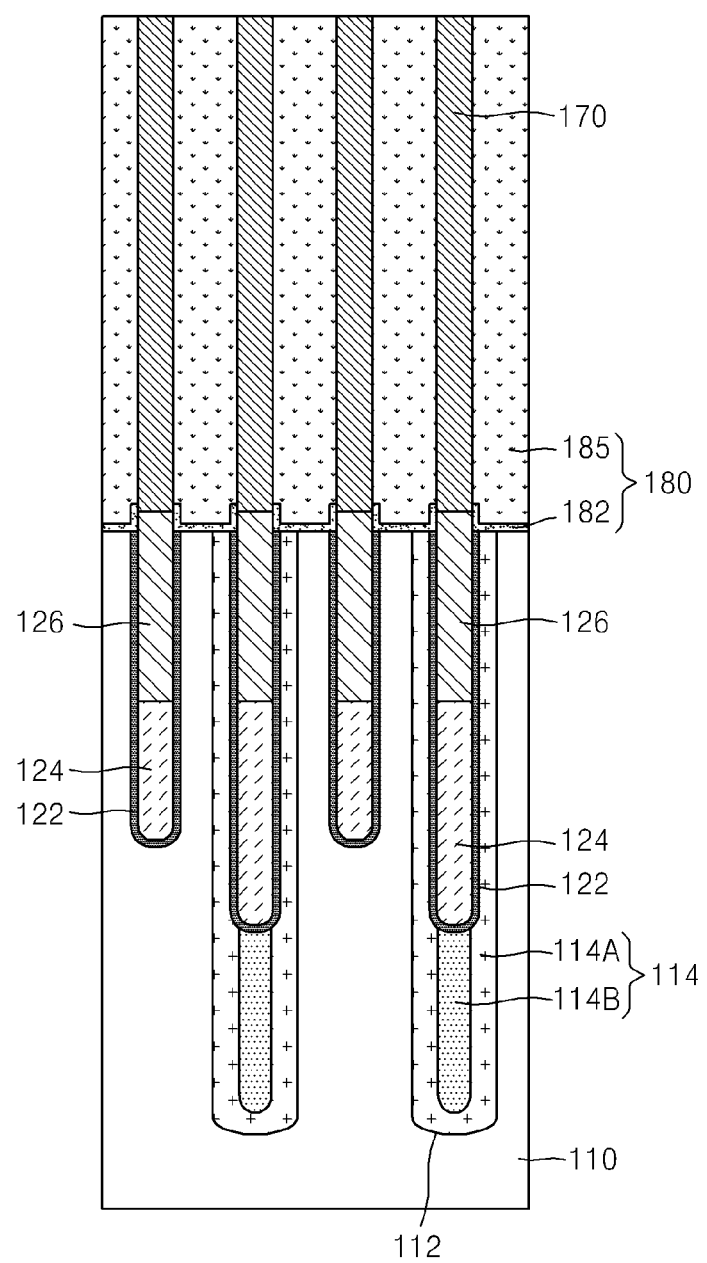

As described above, the plan view of FIG. 14A may correspond to the top surfaces of the bit line structure 140 and multi-film spacer 150 exposed by removing the top portions of the conductive material film and first insulating film 170 via CMP after depositing polysilicon or growing polysilicon via selective epitaxial growth (SEG) as the conductive material film as shown in FIGS. 27A through 27C.

When the plan view of FIG. 14A corresponds to FIGS. 27A through 27C, the second spacer 156 is removed and does not exist as will be described below, and thus a second direction width W1 of the fence F1 may increase twice a thickness of the second spacer 156, and the second direction width W1 of the global buried contact GBC may also increase.

Figure 16A:
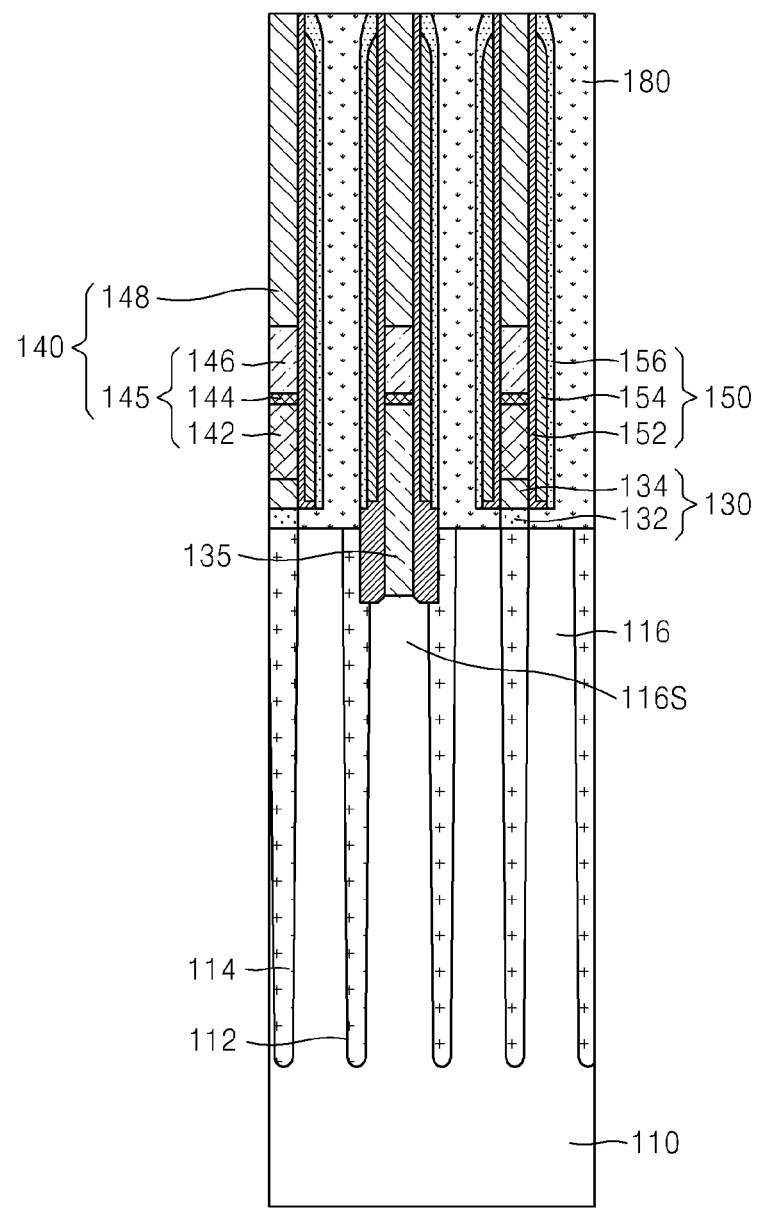
Figure 16B:
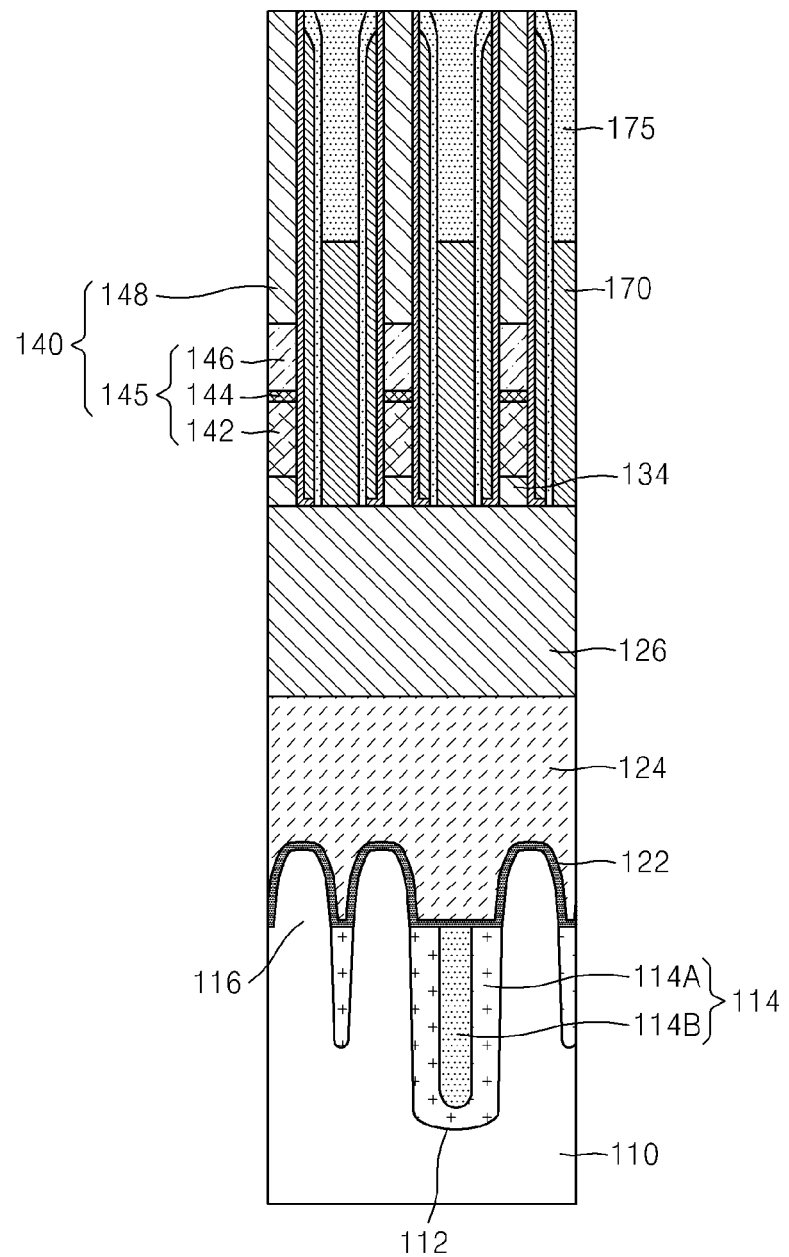
Figure 16C:
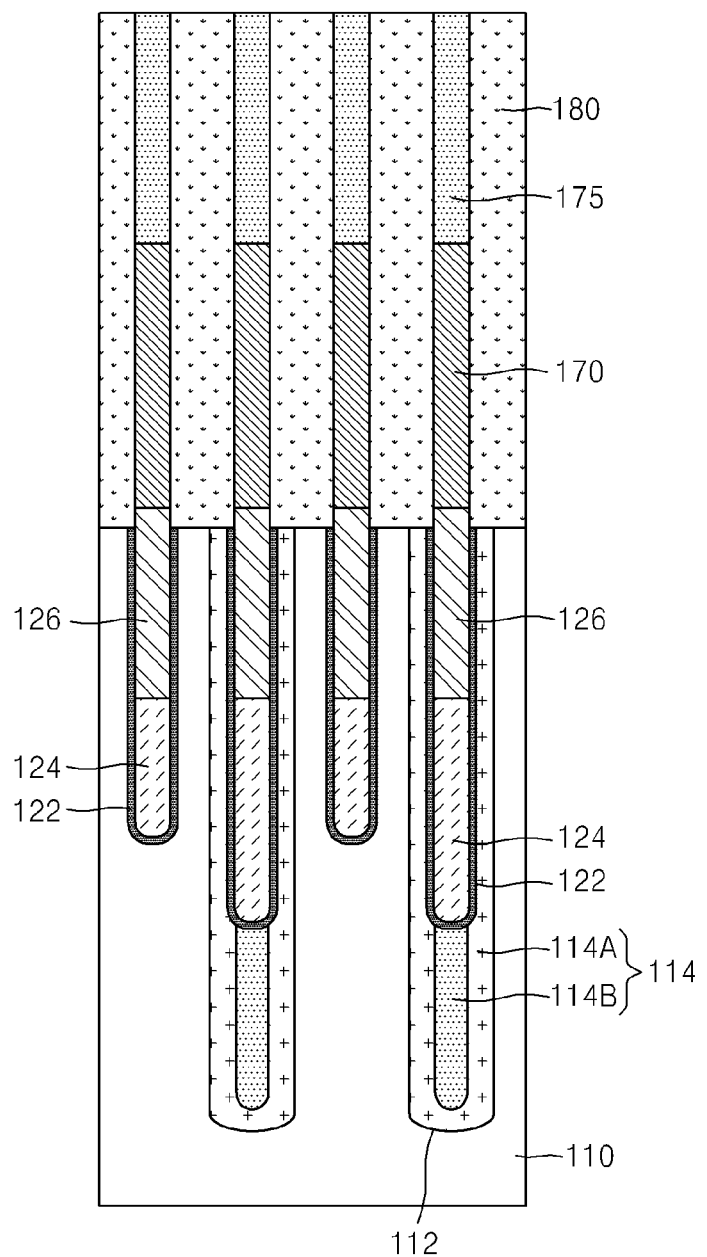

FIG. 14B illustrates the top surfaces of the bit line structure 140 and multi-film spacer 150 exposed by filing a fourth groove G4 with a material film formed of a nitride material and removing a top portion of the material film via CMP as in FIGS. 16A through 16C. Accordingly, a fence F2 may correspond to a second insulating film 175 formed of a nitride material, wherein the second insulating film 175 may be a fence surrounding two side surfaces of the buried contact 180 in the first direction (y direction), together with the first insulating film 170 below the second insulating film 175.

Accordingly, in the semiconductor device of at least one example embodiment, the global buried contact GBC may have a structure whose left and right side surfaces in the second direction (x direction) are surrounded by the global bit line GBL formed of a nitride material and top and bottom side surfaces in the first direction (y direction) are surrounded by the fence F2 formed of a nitride material, and thus four surfaces of the global buried contact GBC may be surrounded by a nitride film.

FIGS. 15A through 19C are cross-sectional views for describing a method of manufacturing a semiconductor device, according to at least one example embodiment of the inventive concepts. Here, FIGS. 15A, 16A, . . . , and 19A are cross-sectional views taken along the line I-I' of FIG. 1, FIGS. 15B, 16B, . . . , and 19B are cross-sectional views taken along the line II-II' of FIG. 1, and FIGS. 15C, 16C, . . . , and 19C are cross-sectional views taken along the line III-III' of FIG. 1. Like reference numerals denote like elements in FIGS. 2A through 13C and FIGS. 15A through 19C, and thus overlapping descriptions are not provided here.

Figure 15A:
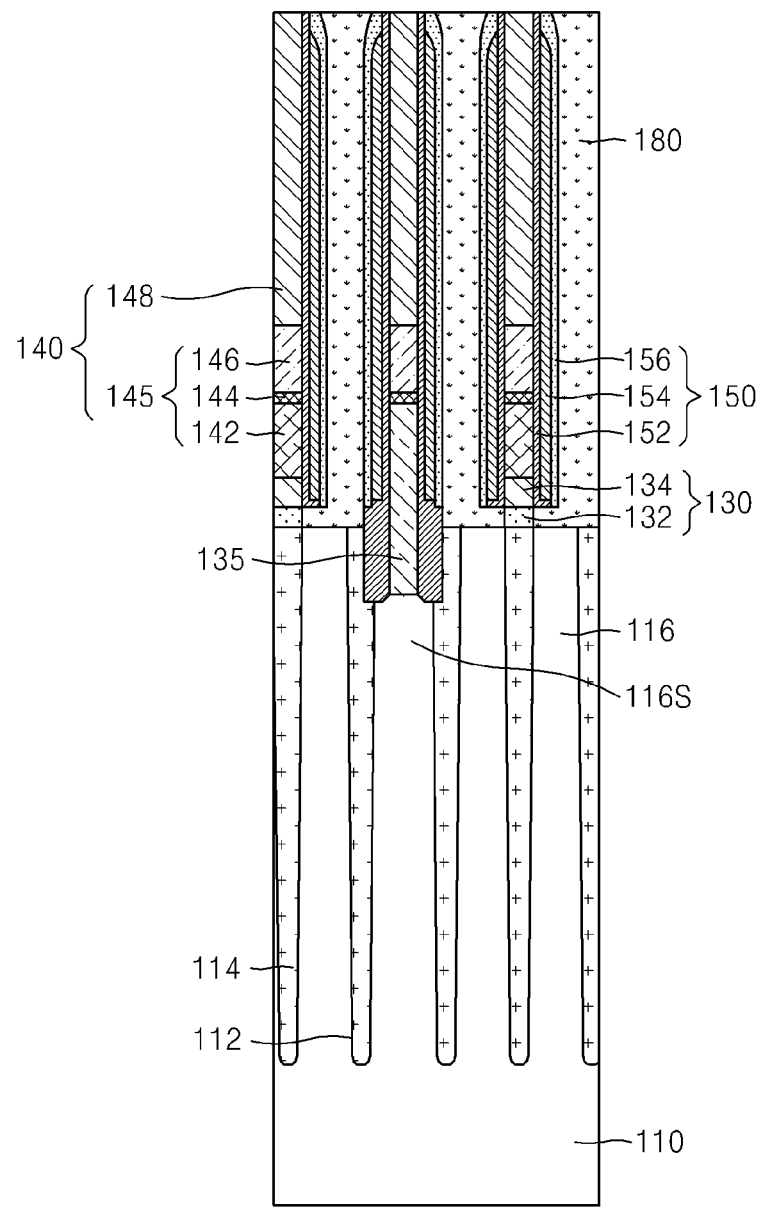
FIGS. 15A through 19C are cross-sectional views for describing a method of manufacturing a semiconductor device, according to at least one example embodiment of the inventive concepts.
Figure 15B:
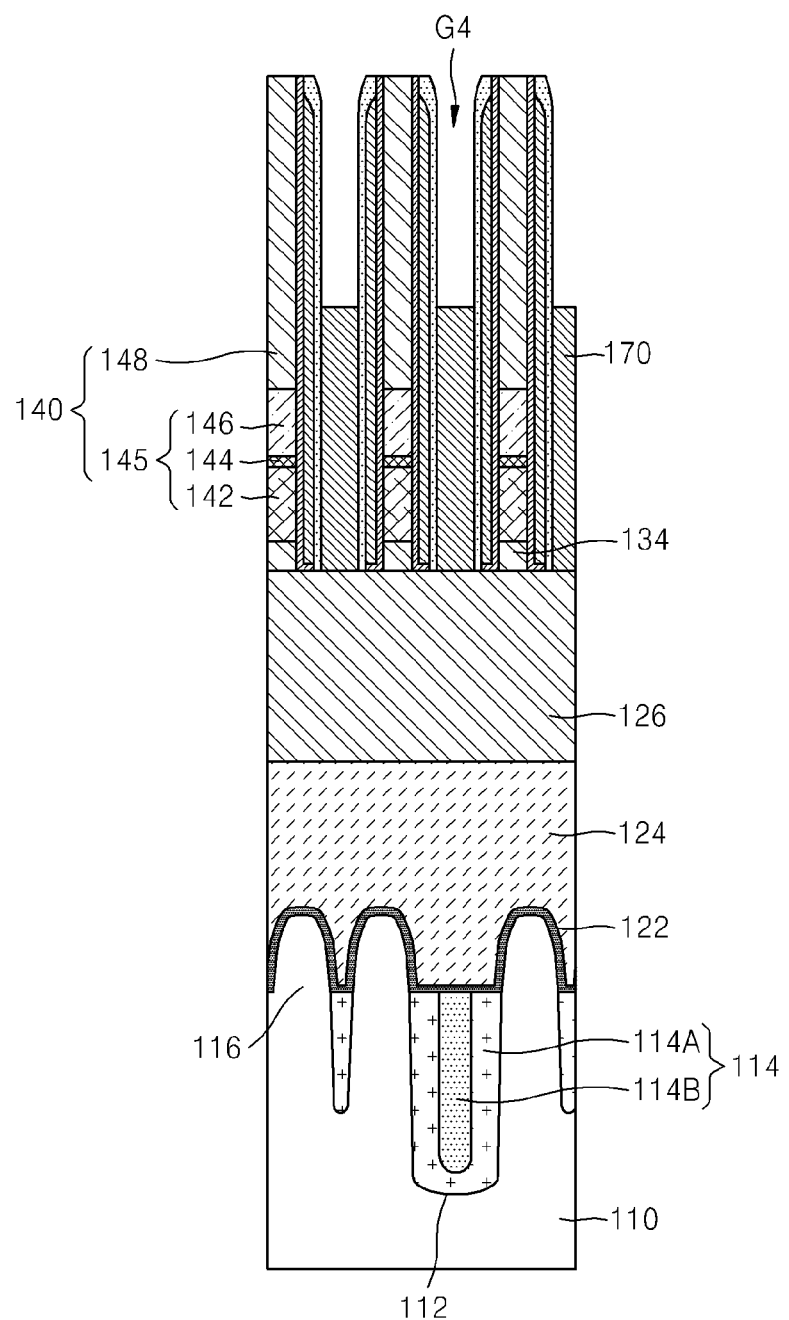
Figure 15C:
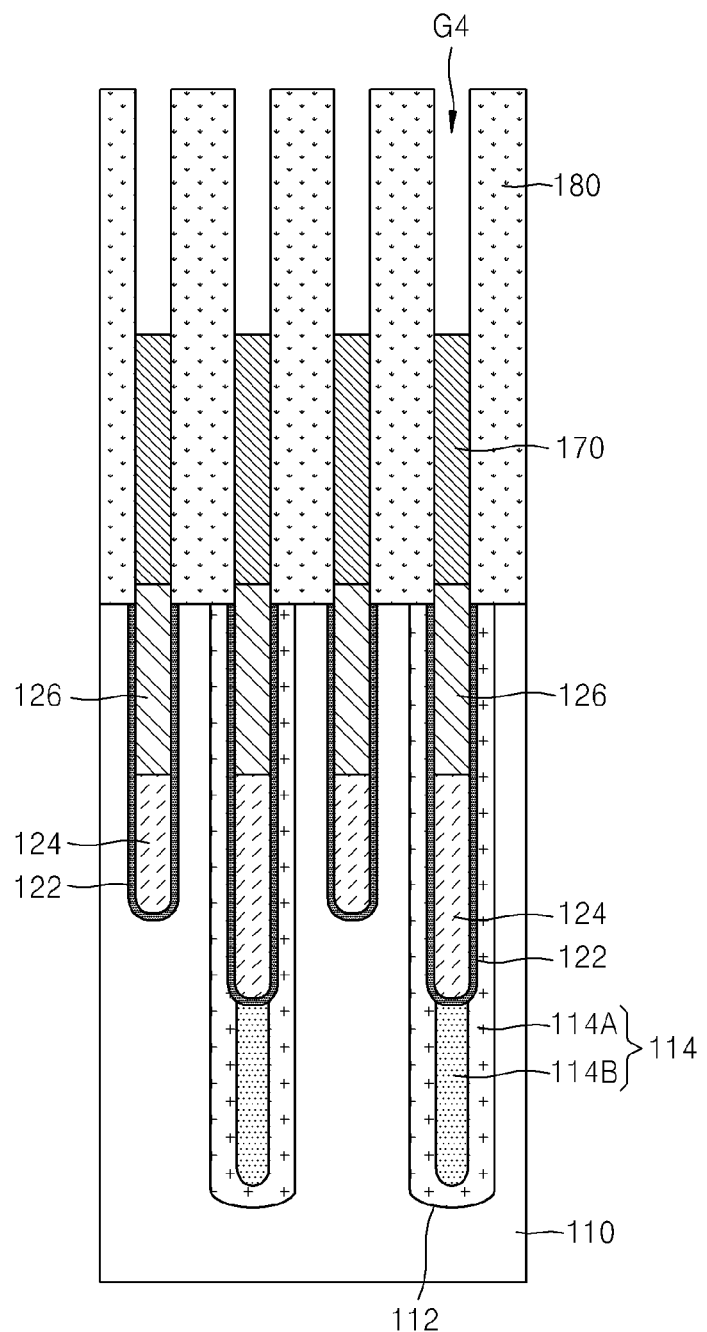

Referring to FIGS. 15A through 15C, as described above with reference to FIGS. 2A through 10C, the top portion of the conductive material film is removed to expose the top surfaces of the bit line structure 140 and multi-film spacer 150 via CMP so as to form the plurality of buried contacts 180, and then the top portion of the first insulating film 170 is removed to form the fourth groove G4.

As described above, since the first insulating film 170 is formed of an oxide material, the first insulating film 170 may be removed via dry etching or etch-back by using the buried contact 180 formed of a polysilicon material and the bit line structure 140 and multi-film spacer 150 formed of a nitride material as an etch mask. Meanwhile, as shown in FIG. 17C, the top surface of the first insulating film 170 remained via etching may maintain a lower level than the top surface of the buried contact 180 remained via etch-back later. However, a height of the top surface of the first insulating film 170 is not limited thereto. For example, the top surface of the first insulating film 170 may maintain the same or higher level than the top surface of the buried contact 180 after etch-back. However, if the top surface of the first insulating film 170 is to maintain the same or higher level than the top surface of the buried contact 180 after etch-back, the first insulating film 170 should not be exposed through the landing pad groove Glp while forming the landing pad 190a later.

Referring to FIGS. 16A through 16C, a material film (not shown) formed of a nitride material, filling the fourth groove G4, and covering the top surfaces of the bit line structure 140 and multi-film spacer 150 is formed. Then, a top portion of the material film is removed such that the top surfaces of the bit line structure 140 and multi-film spacer 150 are exposed via CMP so as to form the second insulating film 175 formed of a nitride material.

The second insulating film 175 may protect the first insulating film 170 formed of an oxide material below the second insulating film 175 while forming the air spacer later.

Figure 17A:
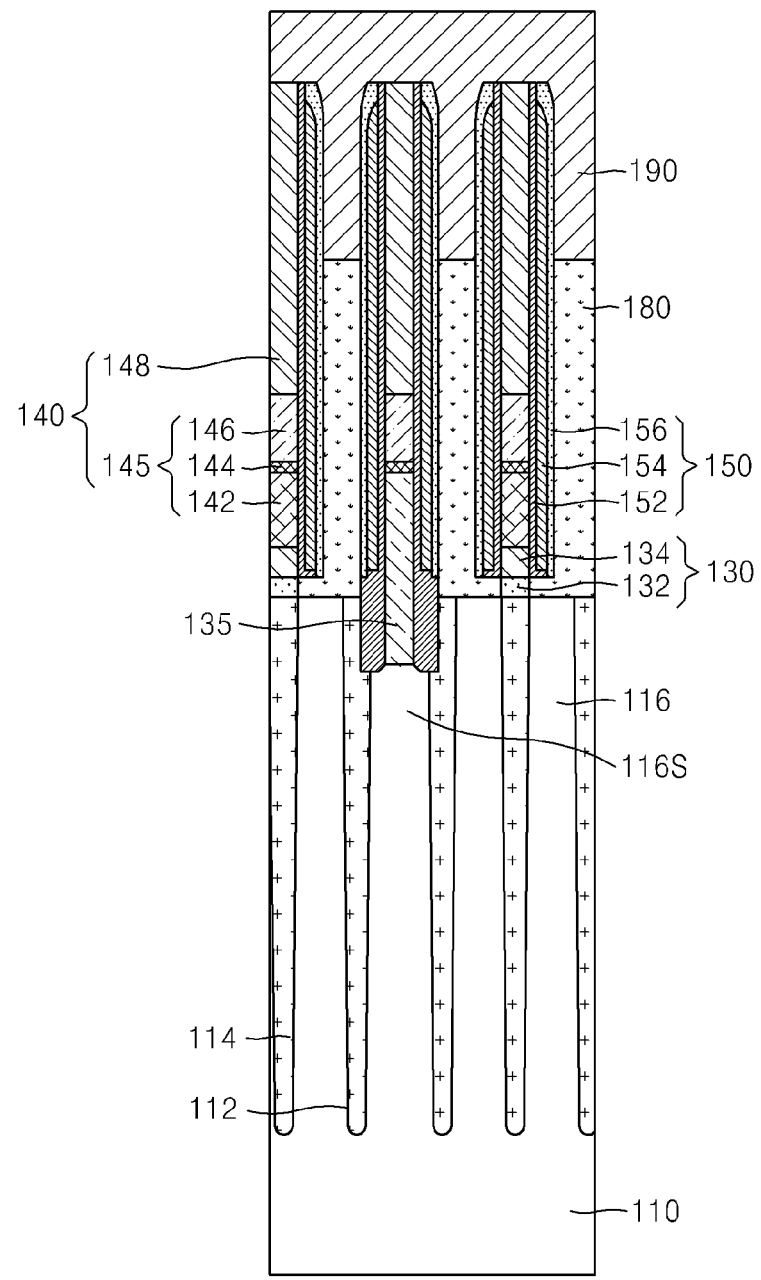
Figure 17B:
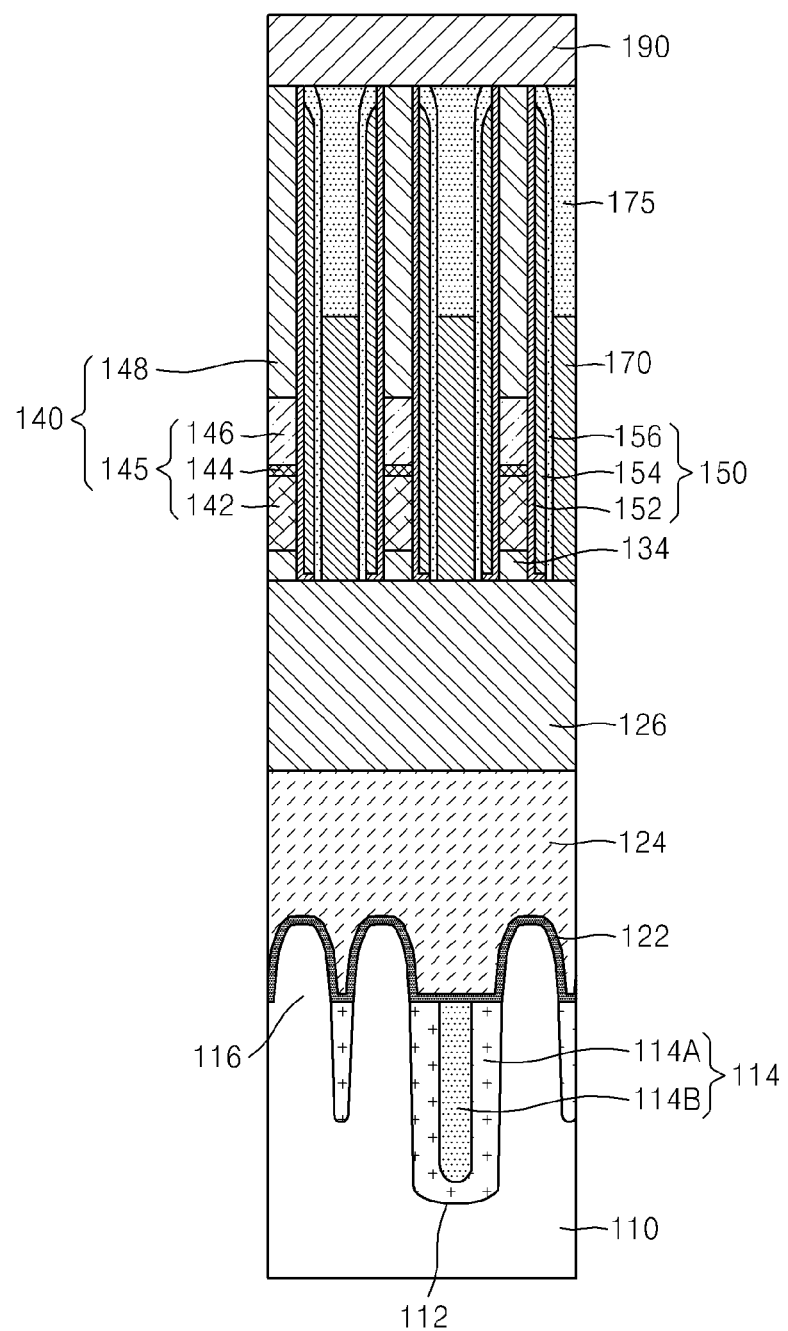
Figure 17C:
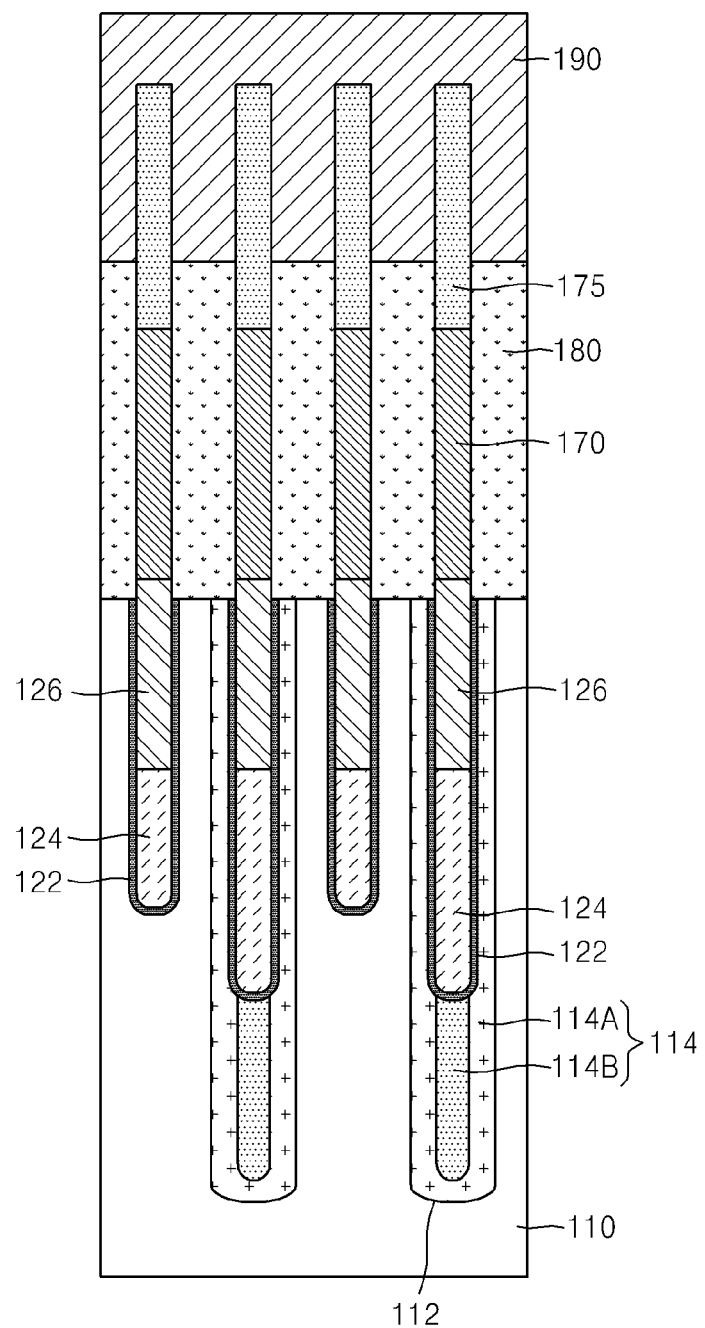

Referring to FIGS. 17A through 17C, the metal film 190 is formed as described above with reference to FIGS. 11A through 11C. In other words, a groove (not shown) is formed by removing the top portion of the buried contact 180 via etch-back, and then the metal film 190 filling the groove and covering the top surfaces of the bit line structure 140 and multi-film spacer 150 is formed.

The metal film 190 may include a metal silicide film (not shown) in a region contacting the buried contact 180. For example, the metal silicide film may be a Co silicide film. The metal film 190 may include a barrier film (not shown) covering an inner surface of the groove and the top surfaces of the bit line structure 140 and multi-film spacer 150, an inner metal film filing the groove on the barrier film, and an upper metal film covering the top surfaces of the bit line structure 140 and multi-film spacer 150 on the barrier film. According to one or more example embodiments, the barrier film may have a Ti/TiN stacked structure as described above. Also, according to one or more example embodiments, at least one of the inner metal film and the upper metal film may include W.

Figure 18A:
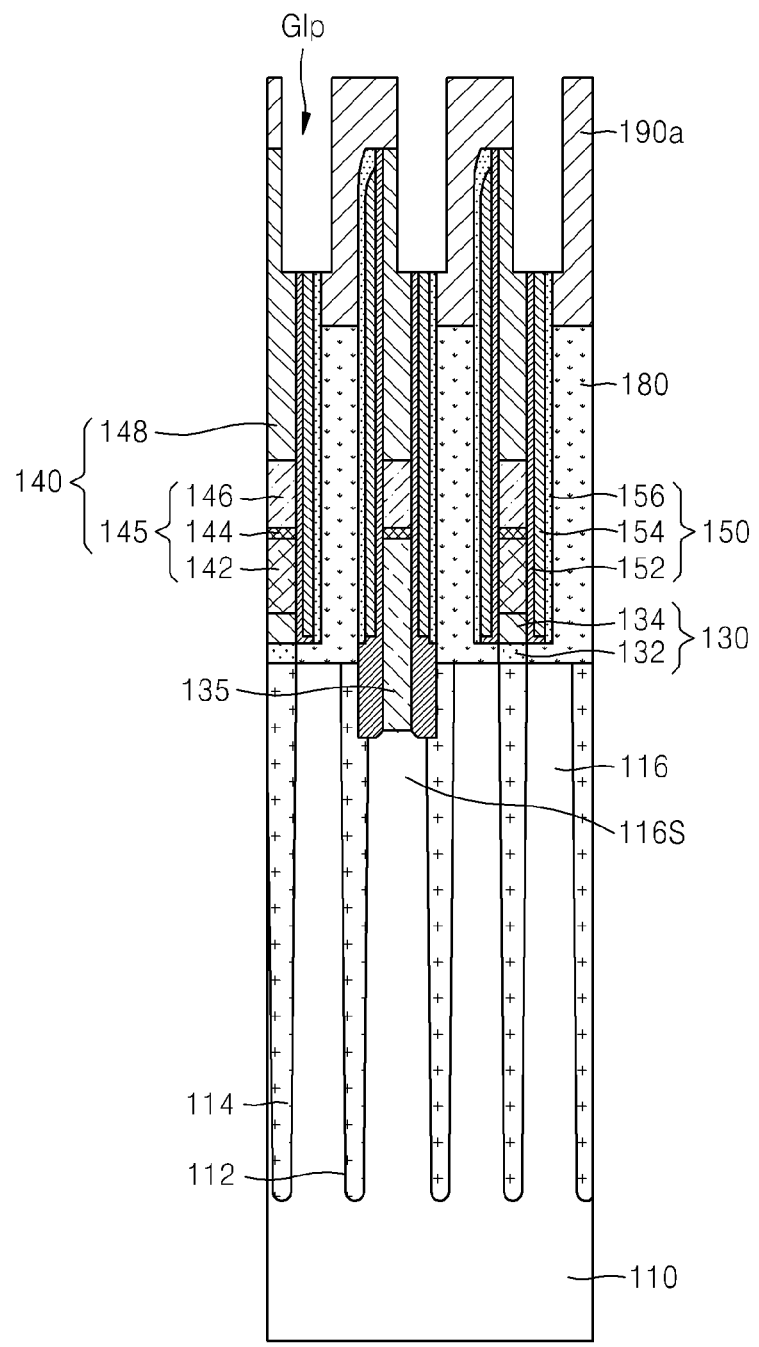
Figure 18B:
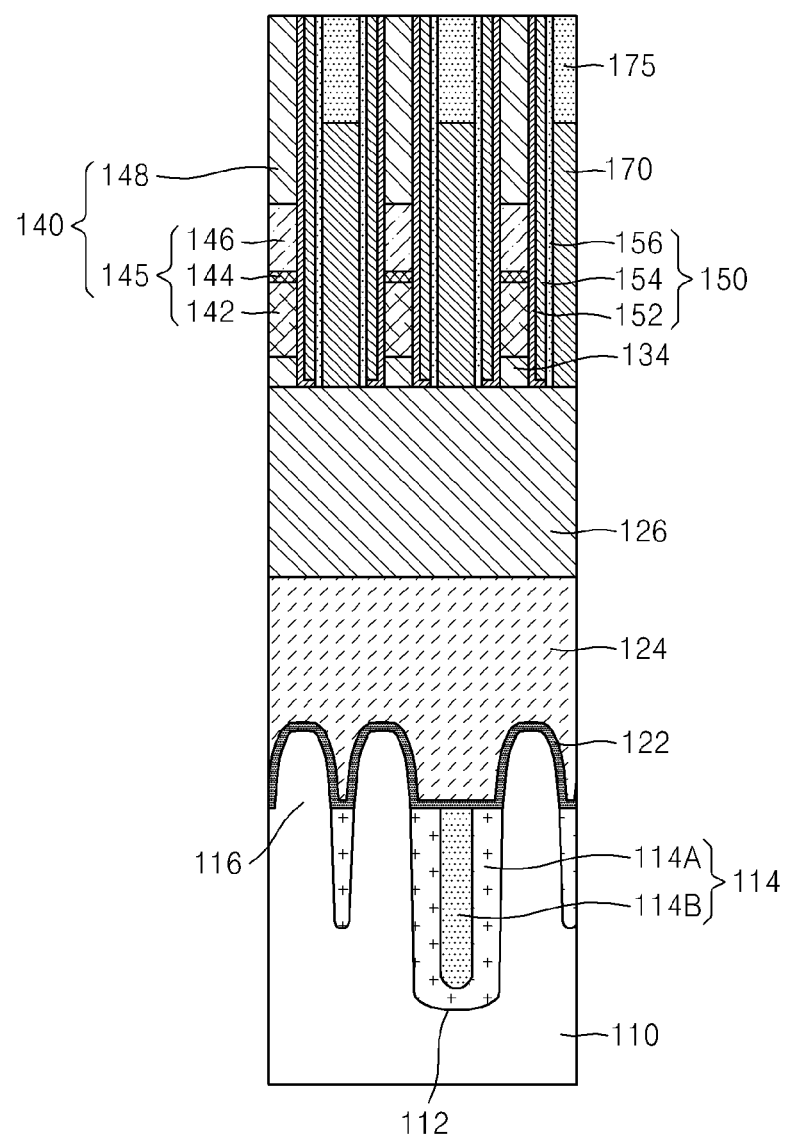
Figure 18C:
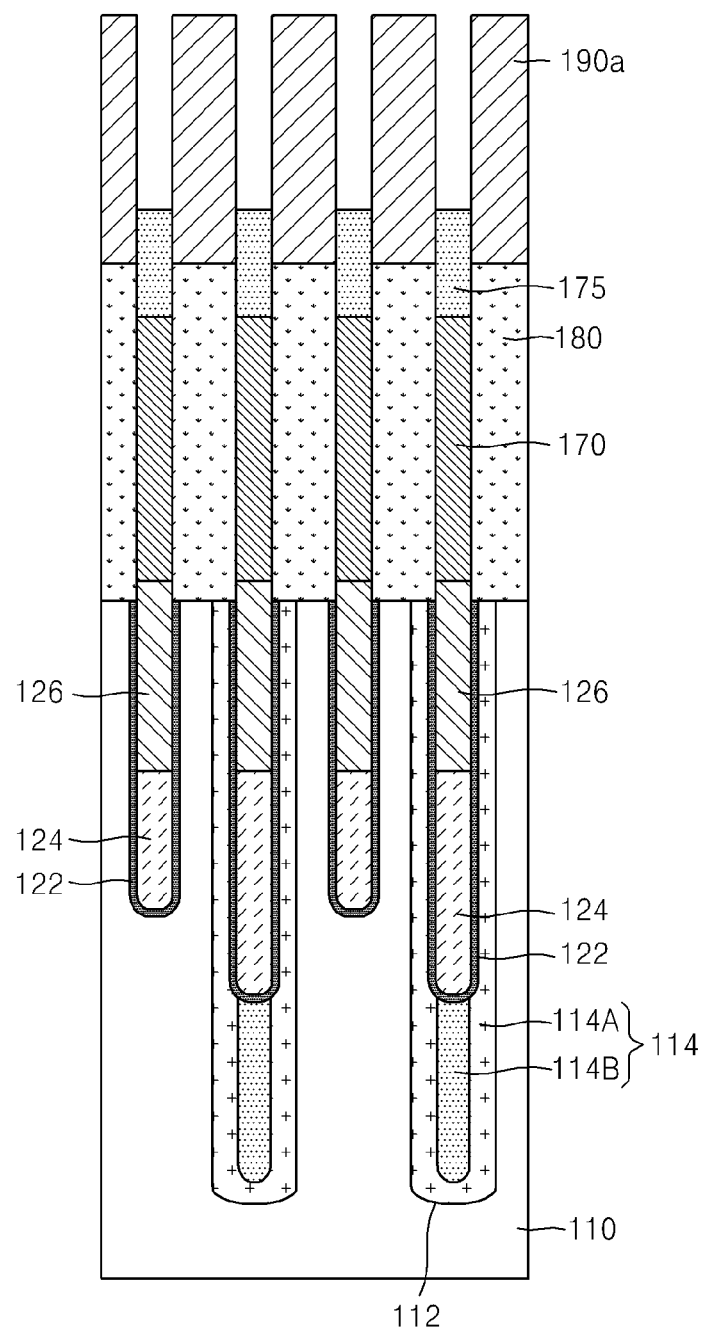

Referring to FIGS. 18A and 18C, the landing pad 190a is formed as described above with reference to FIGS. 12A through 12C. In other words, a mask pattern (not shown) is formed on the metal film 190 and then the landing pad groove Glp is formed by etching the metal film 190 and parts of the bit line structure 140 and multi-film spacer 150 below the metal film 190 by using the mask pattern as an etch mask, thereby forming the plurality of landing pads 190a each connected to the buried contact 180, electrically insulated from each other, and physically separated from each other.

The forming of the landing pad 190a in FIGS. 18A through 18C may be different from the forming of the landing pad 190a in FIGS. 12A through 12C in that a part of the second insulating film 175 is etched and removed in FIGS. 18A through 18C. In other words, in FIGS. 12A through 12C, the top portion of the first insulating film 170 formed of an oxide material is removed with the bit line structure 140 and the multi-film spacer 150, but in FIGS. 18A through 18C, the top portion of the second insulating film 175 formed of a nitride material may be removed with the bit line structure 140 and the multi-film spacer 150.

Similar to the landing pad LP of FIG. 1, the landing pad 190a may also be arranged in the zigzag form L1 of FIG. 1 alternately covering the multi-film spacer 150 on a left side wall of the bit line structure 140 and the multi-film spacer 150 on a right side wall of the bit line structure 140 along the first direction (y direction), and may cover the multi-film spacer 150 formed on side walls of the bit line structure 140 in the same direction along the second direction (x direction).

The mask pattern is removed after the landing pad 190a is formed.

Figure 19A:
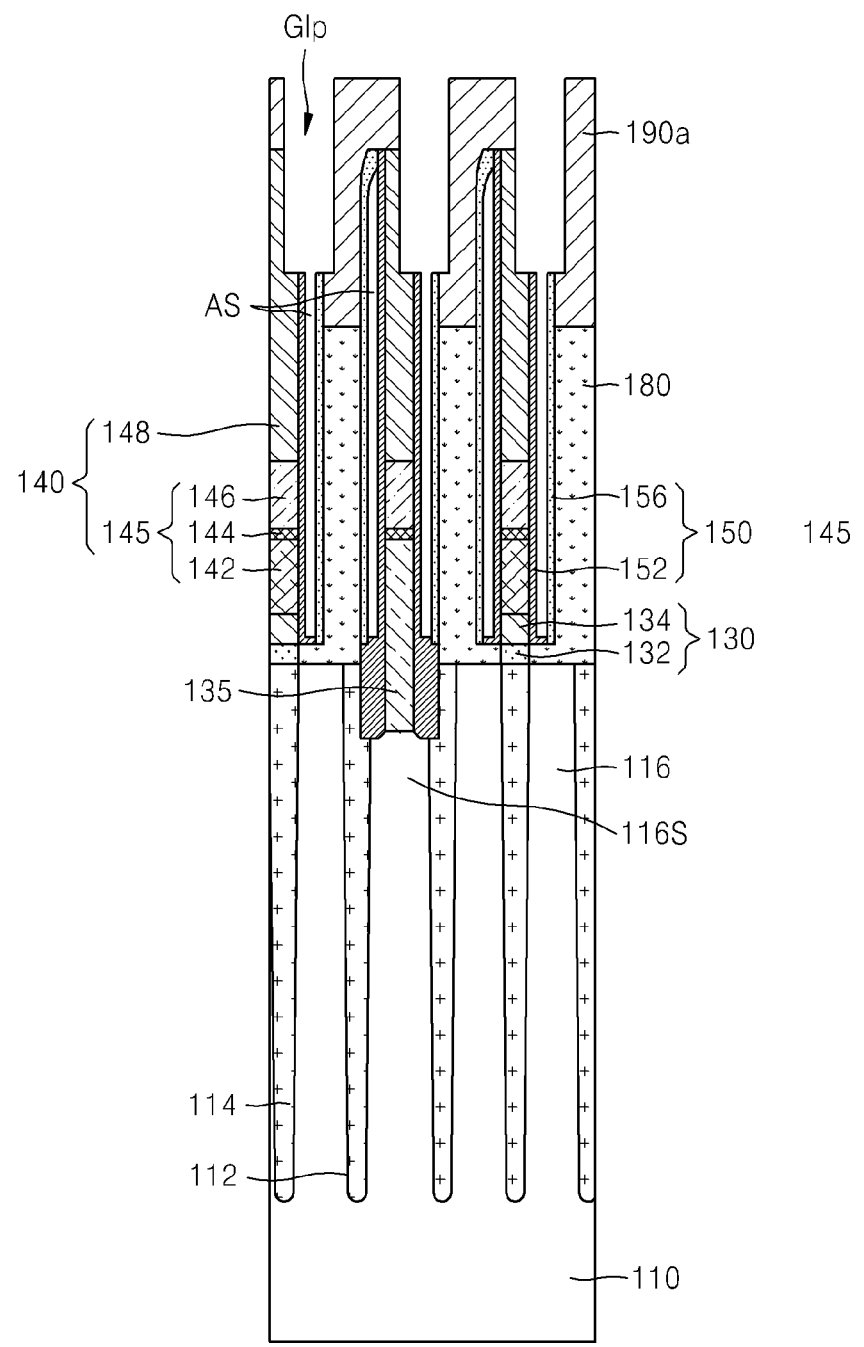
Figure 19B:
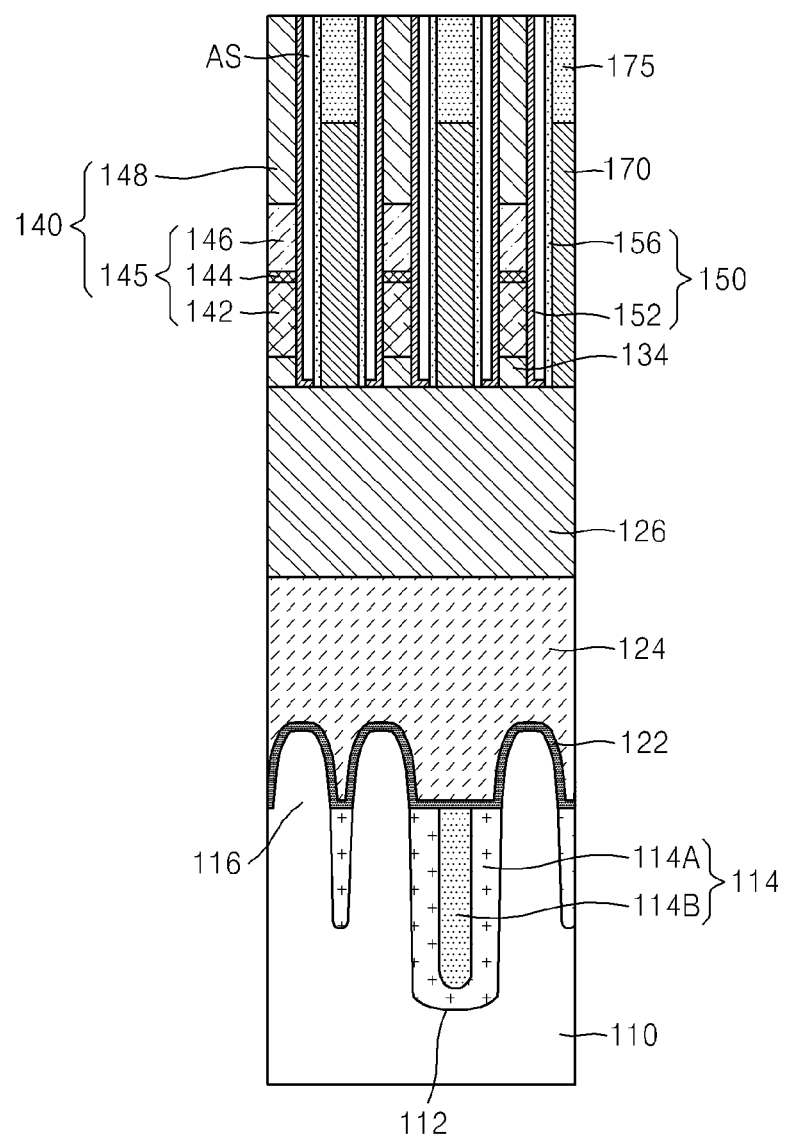
Figure 19C:
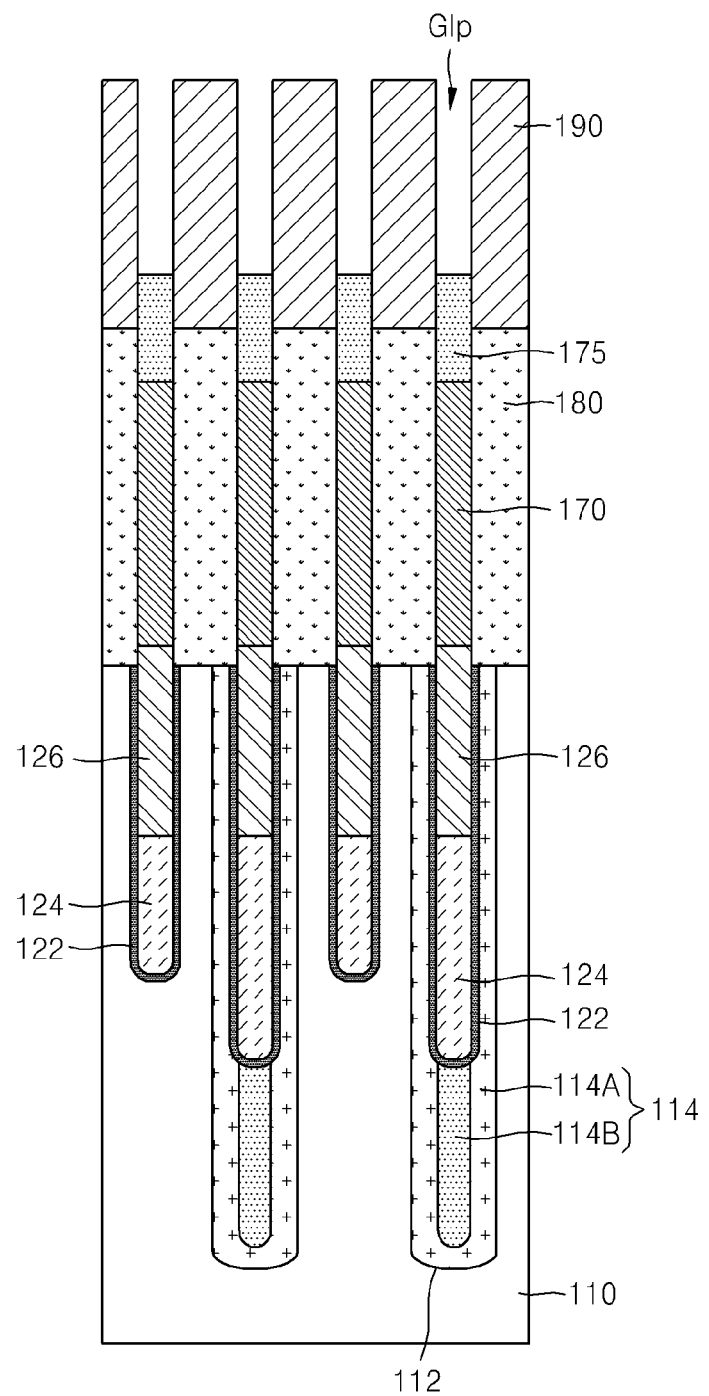

Referring to FIGS. 19A through 19C, a plurality of air spacers AS are formed by removing the first spacer 154 formed of an oxide material exposed through the landing pad groove Glp. The air spacer AS may be formed, for example, via wet etching. Alternatively, the first spacer 154 may be removed via dry etching.

As described above, while performing wet etching to form the air spacer AS, the second insulating film 175 reduces (or alternatively, prevents) the first insulating film 170 therebelow from being etched. In other words, if the second insulating film 175 is not formed, the first insulating film 170 may be exposed through the landing pad groove Glp. Since the first insulating film 170 is formed of an oxide material, the first insulating film 170 may be etched with the first spacer 154 during a wet etching process for forming the air spacer AS. If the first insulating film 170 operating as a fence is etched, the buried contact 180 adjacent to the first insulating film 170 may be exposed and damaged.

Meanwhile, in order to increase a width of the air spacer AS, parts of the insulating liner 152 and second spacer 156 formed of a nitride material may be further removed via wet etching or dry etching. Also, while increasing the width of the air spacer AS, a top portion of the second insulating film 175 may also be removed.

Then, as shown in FIGS. 13A through 13C, the capping insulating film 178 filling the landing pad groove Glp and covering the top surface of the landing pad 190a may be formed. While forming the capping insulating film 178, an insulating material forming the capping insulating film 178 may be deposited in the air spacer AS whose upper portion is exposed through the landing pad groove Glp. Accordingly, a capping liner (not shown) formed of the same material as the capping insulating film 178 may be formed on an inner wall of the air spacer AS. However, according to circumstances, the capping liner may not be formed in the air spacer AS.

FIGS. 20A through 27C are cross-sectional views for describing a method of manufacturing a semiconductor device, according to at least one example embodiment of the inventive concepts. Here, FIGS. 20A, 21A, . . . , and 27A are cross-sectional views taken along the line I-I' of FIG. 1, FIGS. 20B, 21B, . . . , and 27B are cross-sectional views taken along the line II-II' of FIG. 1, and FIGS. 20C, 21C, . . . , and 27C are cross-sectional views taken along the line III-III' of FIG. 1. Also, FIGS. 23D, 23D, 25D, and 26D are plan views corresponding to FIG. 1. Like reference numerals denote like elements in FIGS. 2A through 13C and FIGS. 20A through 27C, and thus overlapping descriptions are not provided here.

Figure 20A:
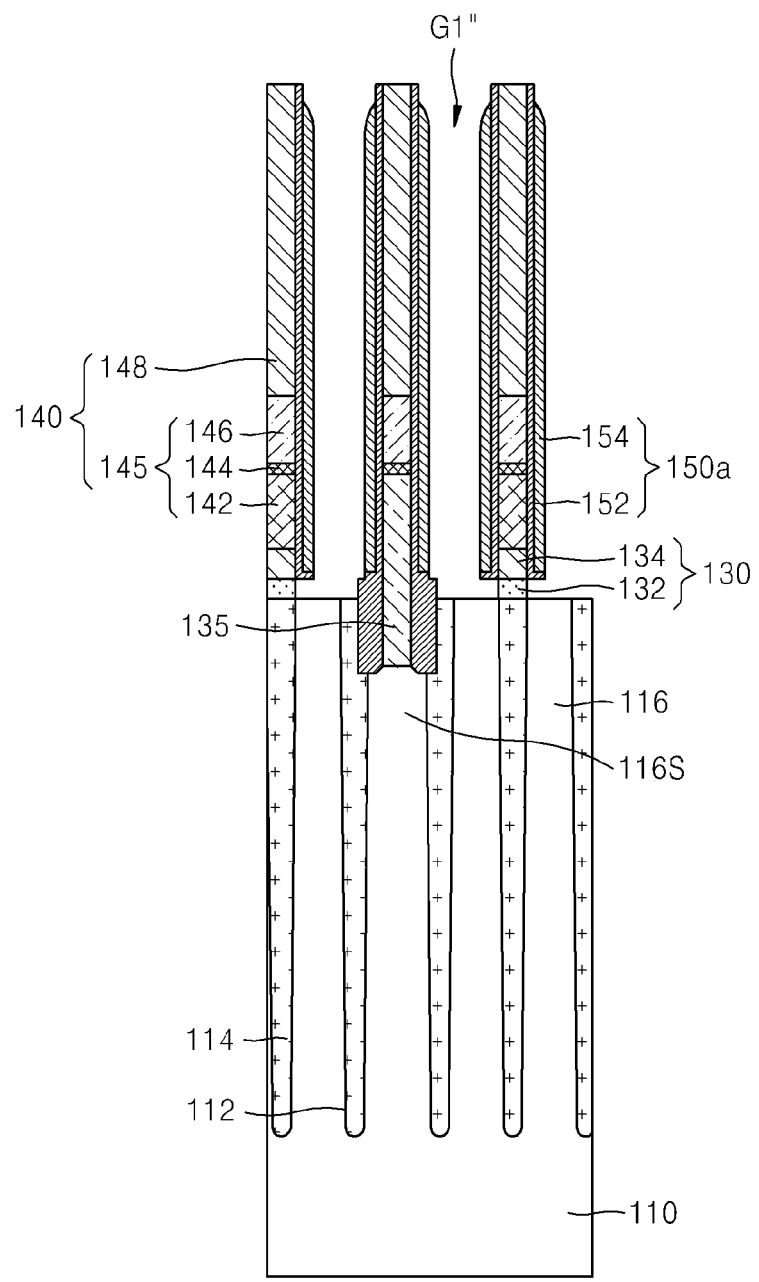
FIGS. 20A through 27C are cross-sectional views for describing a method of manufacturing a semiconductor device, according to at least one example embodiment of the inventive concepts.
Figure 20B:
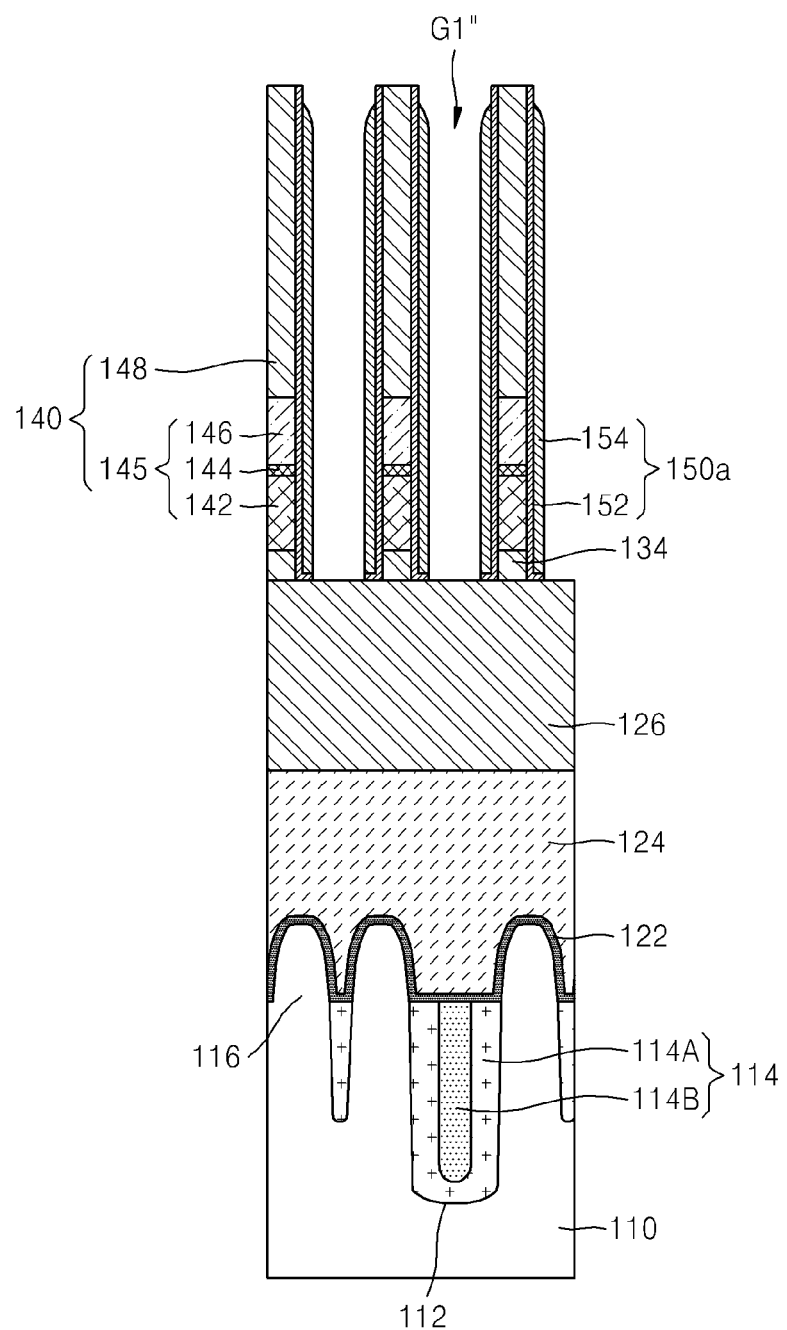
Figure 20C:
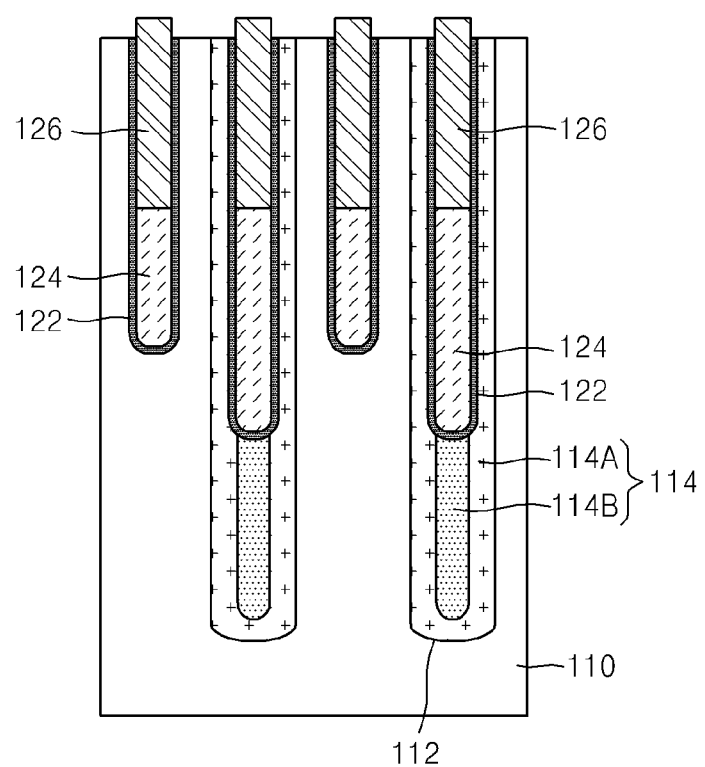

Referring to FIGS. 20A through 20C, the open area of the top surface of the active region 116 is increased by further performing wet etching on the SiO film 132, as described above with reference to FIGS. 2A through 5C, and then the outermost layer of the multi-film spacer 150, i.e., the second spacer 156 formed of a nitride material is removed.

Figure 21A:
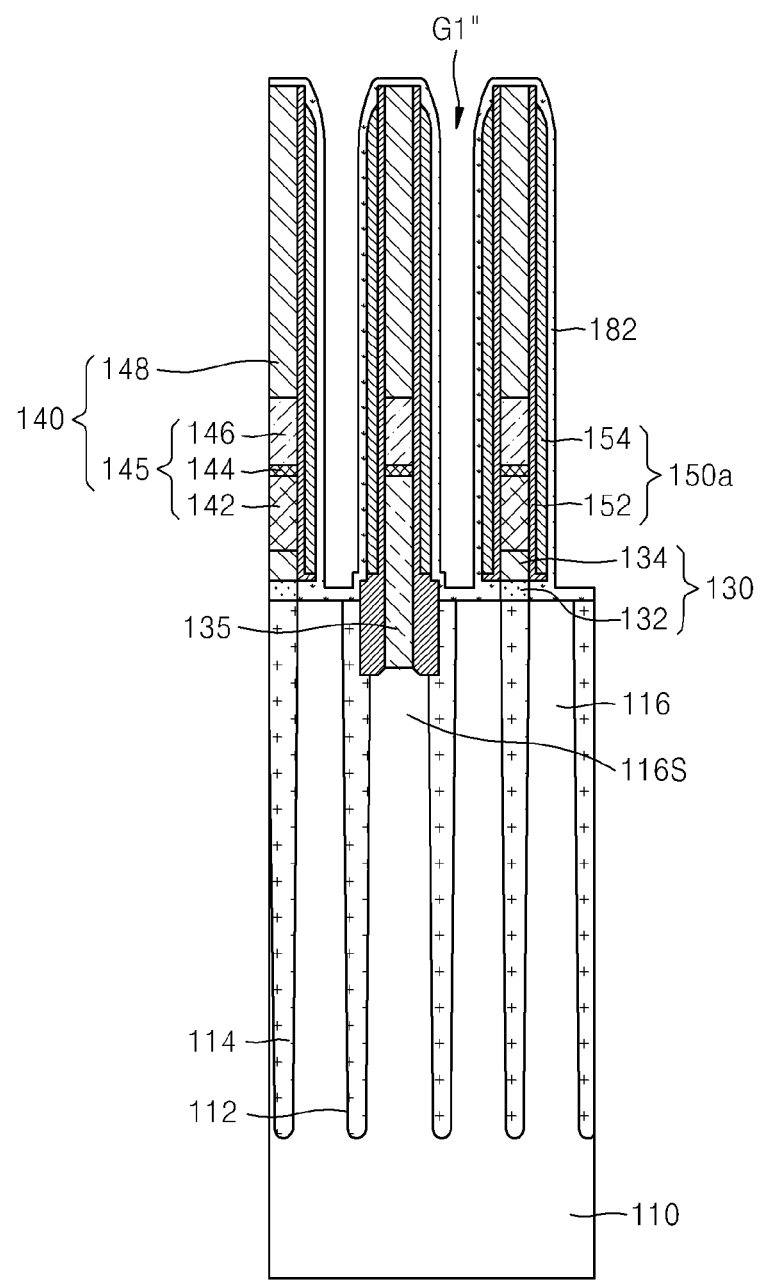
Figure 21B:
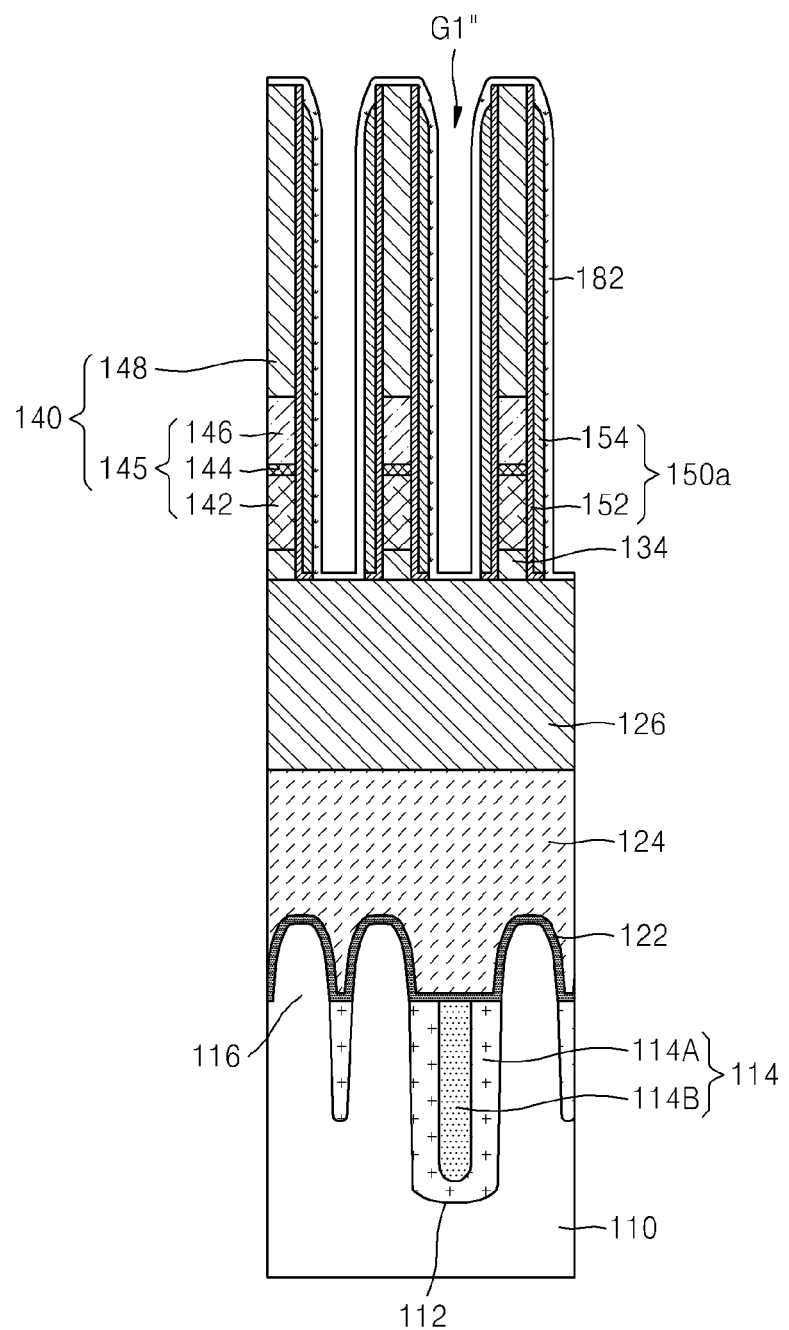
Figure 21C:
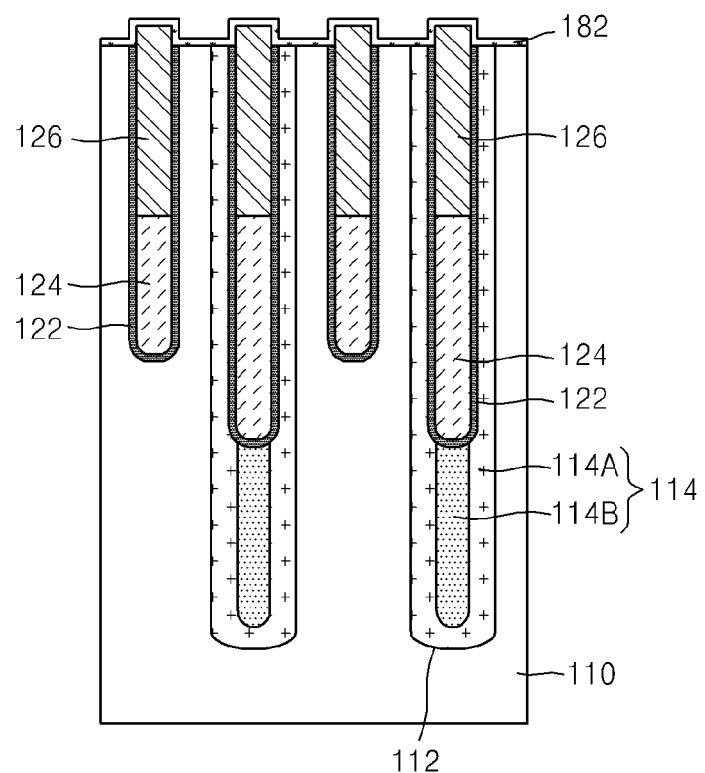

After removing the second spacer 156, the first spacer 154 may be exposed through the first groove G1". Also, a multi-film spacer 150a may include the insulating liner 152 and the first spacer 154, after the second spacer 156 is removed. Referring to FIGS. 21A through 21C, a conductive thin film 182 formed of a polysilicon material is formed throughout a result product obtained by removing the second spacer 156. In other words, the conductive thin film 182 covering an inner surface of the first groove G1" and the top surfaces of the bit line structure 140 and multi-film spacer 150a is formed. The conductive thin film 182 may have a thin thickness, for example, from several Å to tens of Å. The conductive thin film 182 formed of a polysilicon material may protect the first spacer 154 formed of an oxide material from an attack during a future etching process.

Also, when a buried contact is formed of a polysilicon material later, the conductive thin film 182 formed of a polysilicon material may also form a part of the buried contact. Meanwhile, when the buried contact is formed of a polysilicon material, the buried contact formed of a polysilicon material may be formed via an SEG process. Here, the conductive thin film 182 formed of a polysilicon material may operate as a seed layer.

Figure 22A:
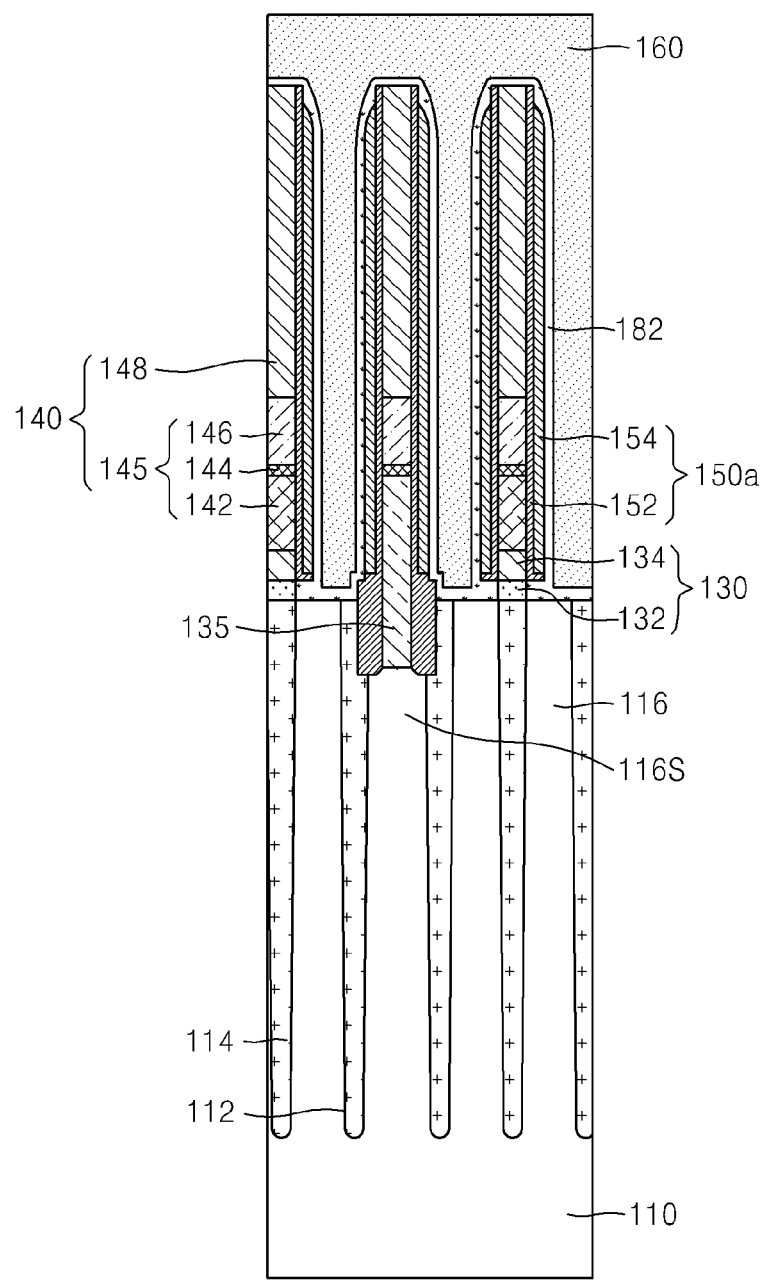
Figure 22B:
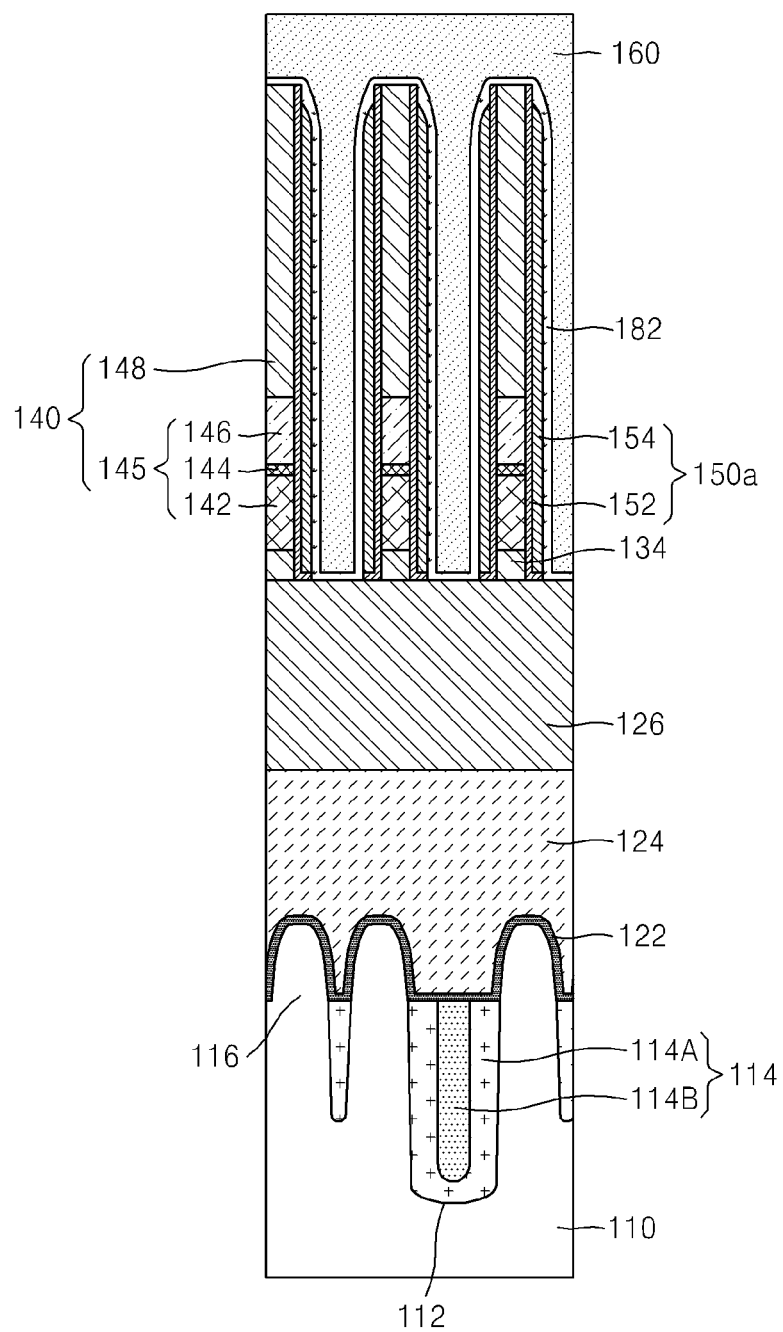
Figure 22C:
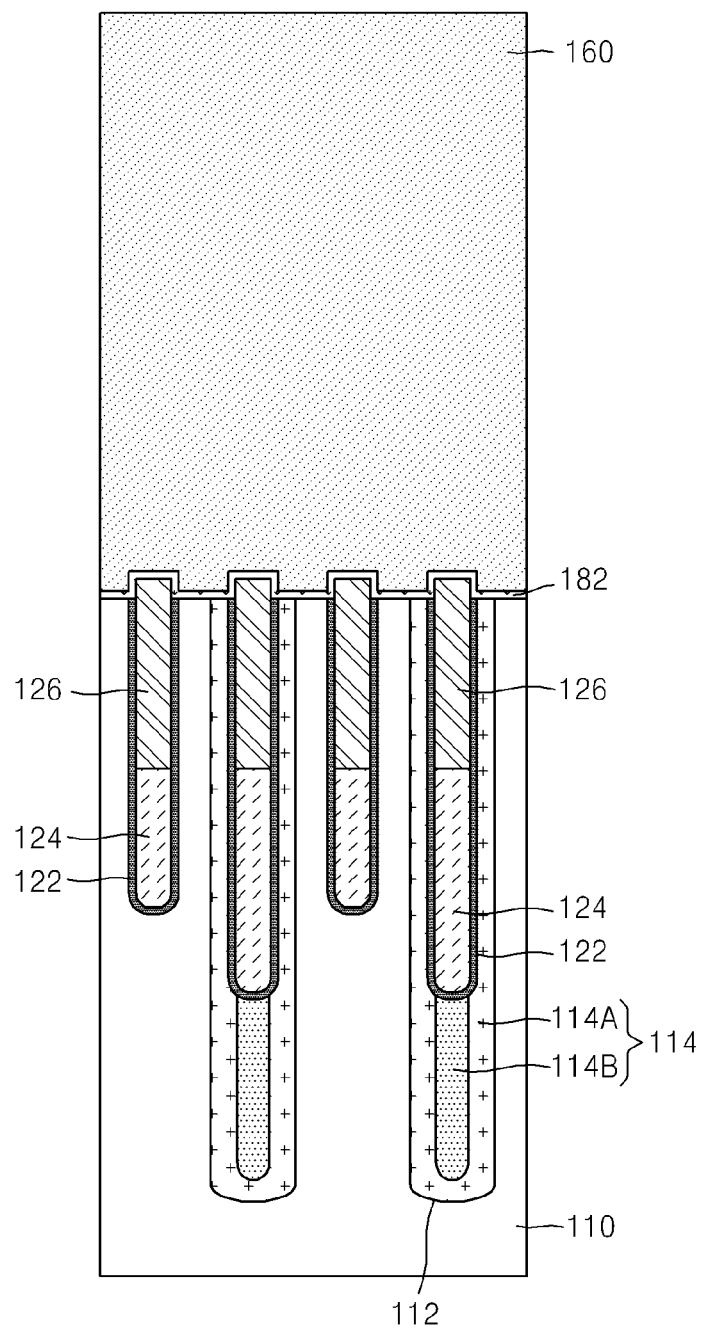

Referring to FIGS. 22A through 22C, the sacrificial film 160 formed of an SOH material, filling the first groove G1", and covering the top surfaces of the bit line structure 140 and multi-film spacer 150*a* is formed as described above with reference to FIGS. 6A through 6C. In detail, the sacrificial film 160 may be formed on the conductive thin film 182 formed of a polysilicon material in FIGS. 21A through 21C.

Since the sacrificial film 160 formed of an SOH material has a high etch selectivity to a polysilicon material, a future etching process may be easily and stably performed. Also, since the entire sacrificial film 160 may be easily removed via the ashing and stripping processes, a separate etching process for removing the sacrificial film 160 may not be performed.

After removing the sacrificial film 160 through ashing and stripping processes, the conductive thin film 182 formed of a polysilicon material may be exposed instead of the active region 116 being opened. Of course, as shown in FIGS. 24A through 24D, since a part of the conductive thin film 182 is removed before the ashing and stripping processes, a material film other than the conductive thin film 182 may be exposed through the removed part of the conductive thin film 182.

As described above, the sacrificial film 160 may be formed of an ACL material instead of an SOH material.

Referring to FIGS. 23A through 23D, similarly to FIGS. 7A through 7C, a mask pattern (not shown, refer to a mask pattern M of FIG. 30D) having a desired (or alternatively, predetermined) shape is formed on a result product obtained by forming the sacrificial film 160, and then a part of the sacrificial film 160 is removed by using the mask pattern as an etch mask so as to form the plurality of second grooves G2 exposing the conductive thin film 182. As described above, the mask pattern may have a line shape opening the region of the top surface of the sacrificial film 160 corresponding to the word line 124.

Figure 23A:
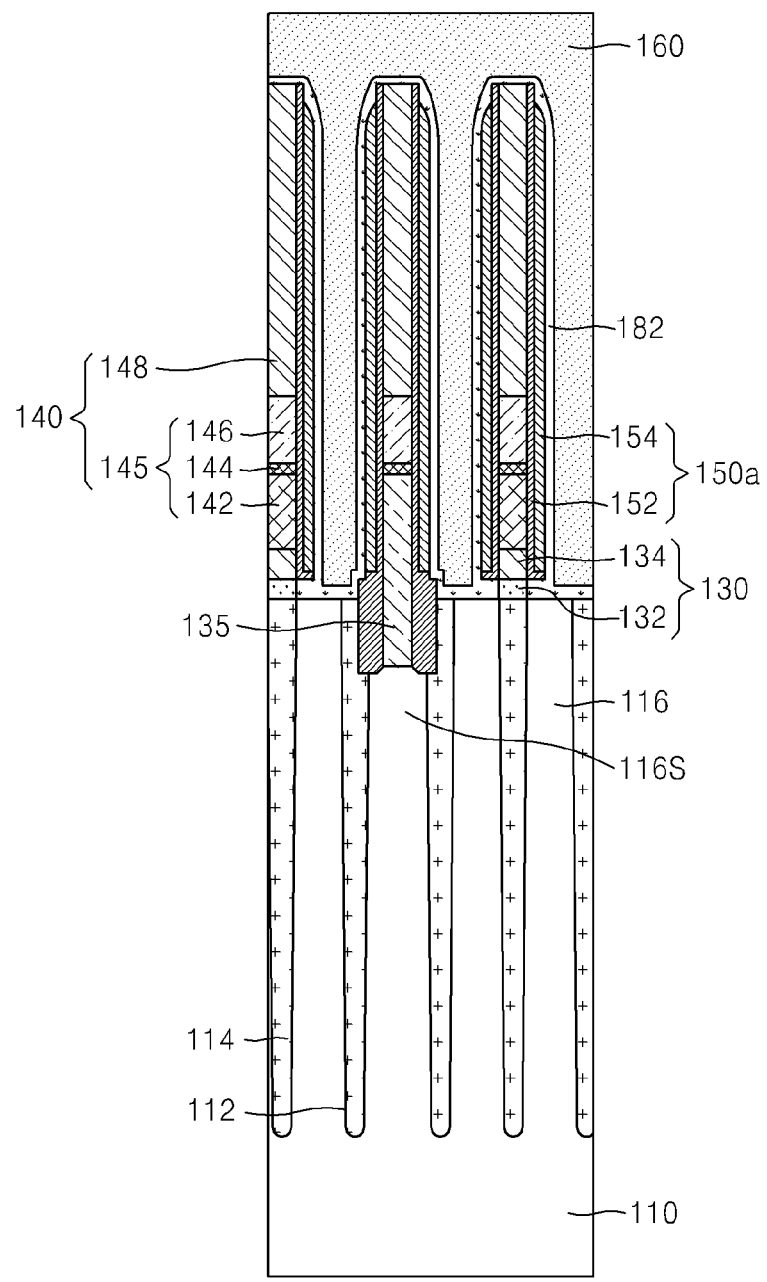
Figure 23B:
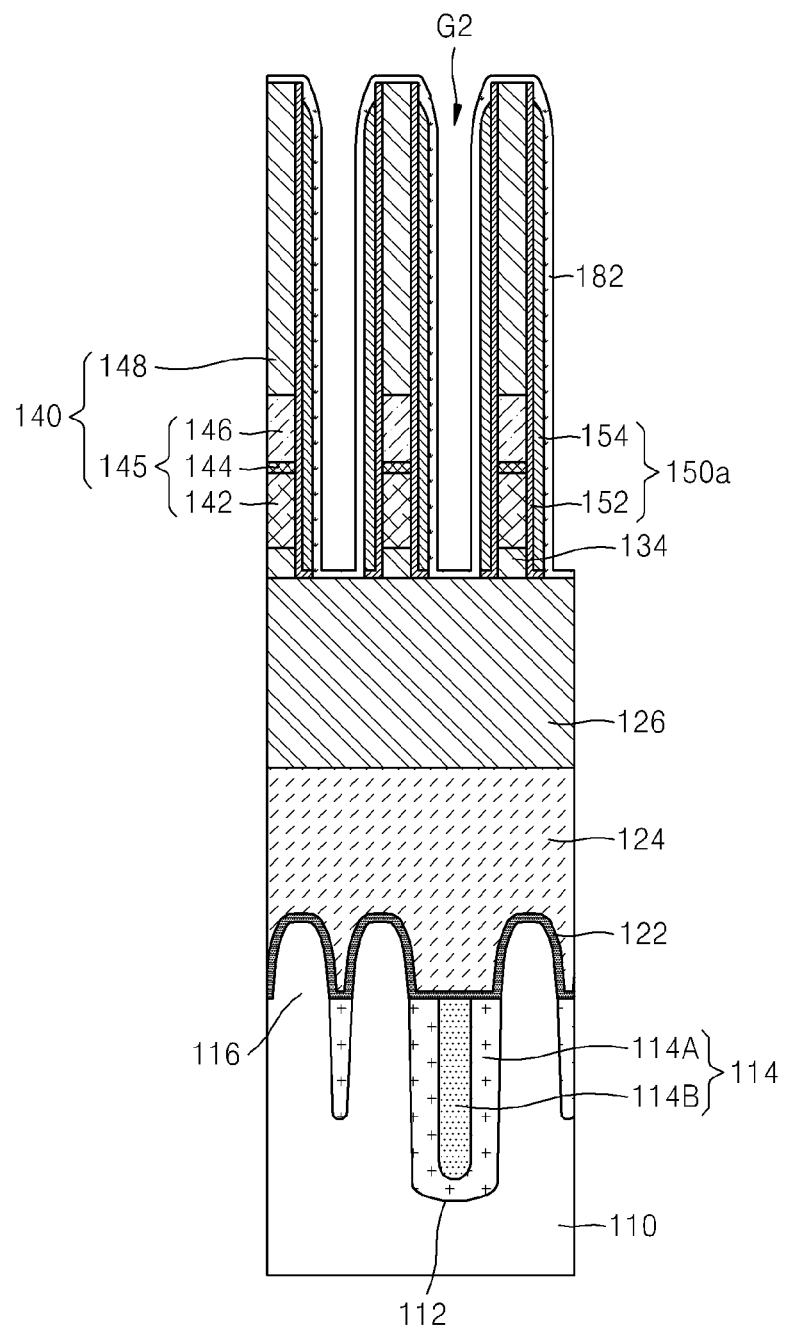
Figure 23C:
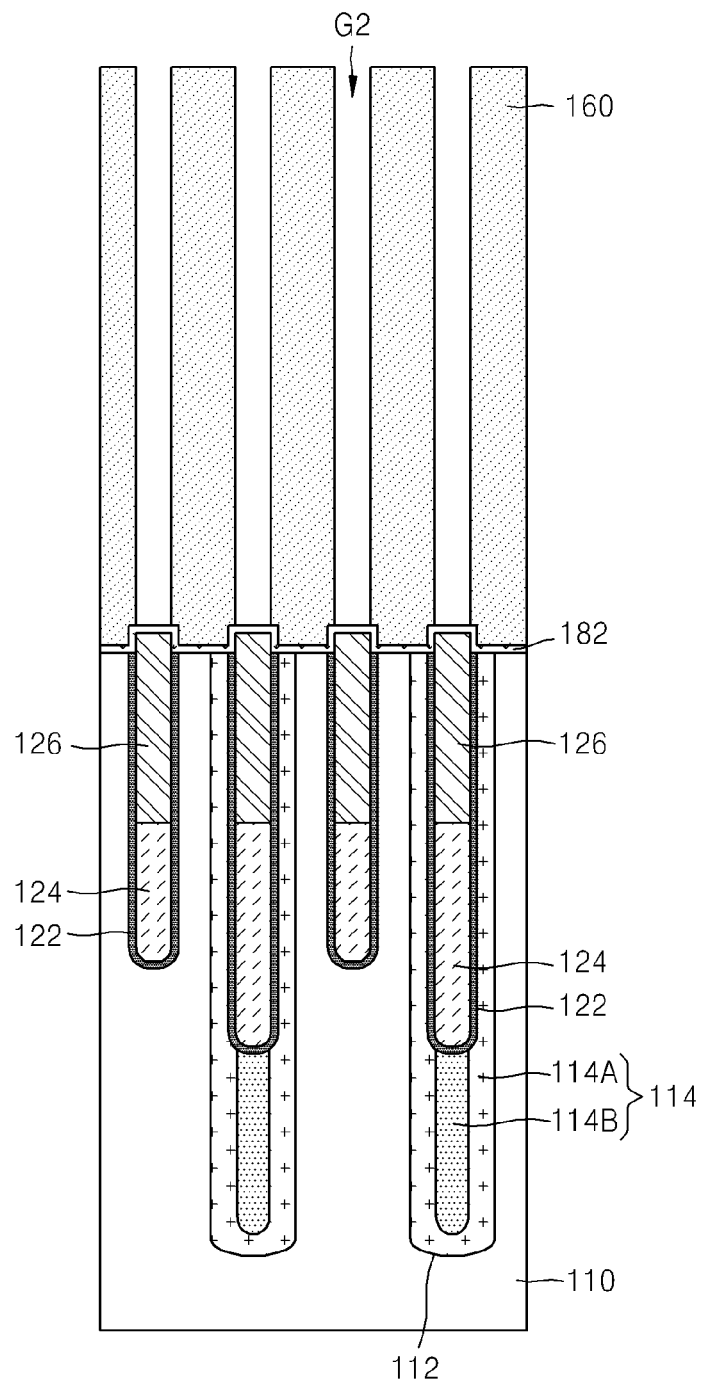

While forming the second groove G2, the conductive thin film 182 may operate as an etch mask together with the mask pattern. Accordingly, as shown in FIG. 23B, the conductive thin film 182 may be exposed on the inner surface of the second groove G2 and the top surfaces of the bit line structure 140 and multi-film spacer 150*a*.

Meanwhile, the conductive thin film 182 may extend in the first direction (y direction) while covering the bit line structure 140 and the multi-film spacer 150*a*, and the mask pattern may extend in the second direction perpendicular to the conductive thin film 182. Accordingly, as shown in FIG. 23D, the second groove G2 formed by using the conductive thin film 182 and the mask pattern as an etch mask may have a rectangular structure surrounded by the conductive thin film 182 and the sacrificial film 160.

Figure 23D:
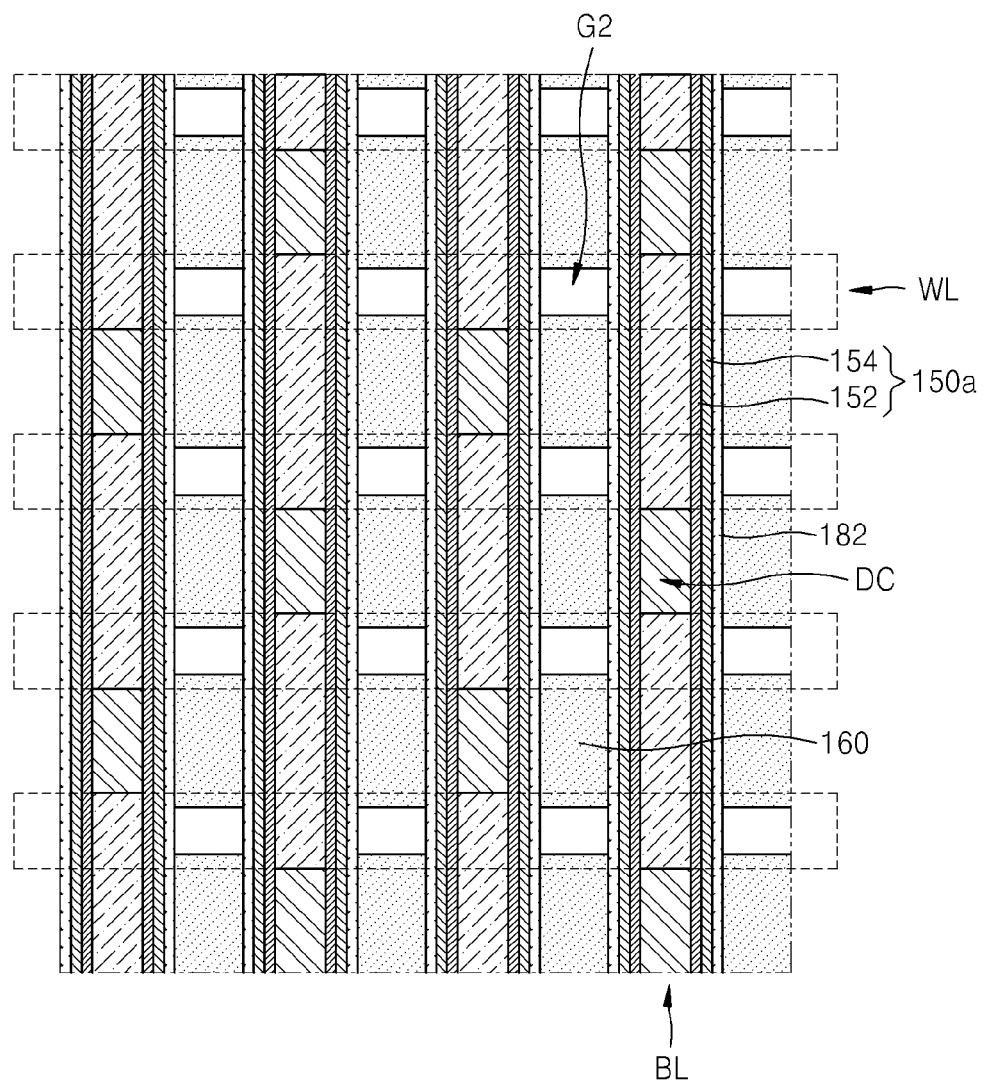

In FIG. 23D, the sacrificial film 160 exists on regions of the top surfaces of the bit line structure 140 and multi-film spacer 150*a* corresponding to the line I-I' of FIG. 1, and the conductive thin film 182 covers regions of the top surfaces of the bit line structure 140 and multi-film spacer 150*a* corresponding to the line II-IF of FIG. 1, but for convenience of understanding, the sacrificial film 160 and the conductive thin film 182 are not illustrated.

Meanwhile, the second groove G2 may correspond to a fence region surrounding the buried contact BC formed later. In other words, as described above with reference to FIG. 14A, the second groove G2 is filled by the first insulating film 170 formed of an oxide material, and the first insulating film 170 filling the second groove G2 may form the fence F1 surrounding two side walls of the buried contact BC in the first direction (y direction).

Referring to FIGS. 24A through 24D, the exposed portion conductive thin film 182 is removed. In detail, the conductive thin film 182 may be exposed through the top surfaces of the bit line structure 140 and multi-film spacer 150*a* and the inner surface of the second groove G2, which correspond to the line II-IF of FIG. 1. By removing the exposed portion of the conductive thin film 182, the conductive thin film 182 may have a spacer structure surrounding the side wall of the bit line structure 140, together with the multi-film spacer 150*a*.

Figure 24A:
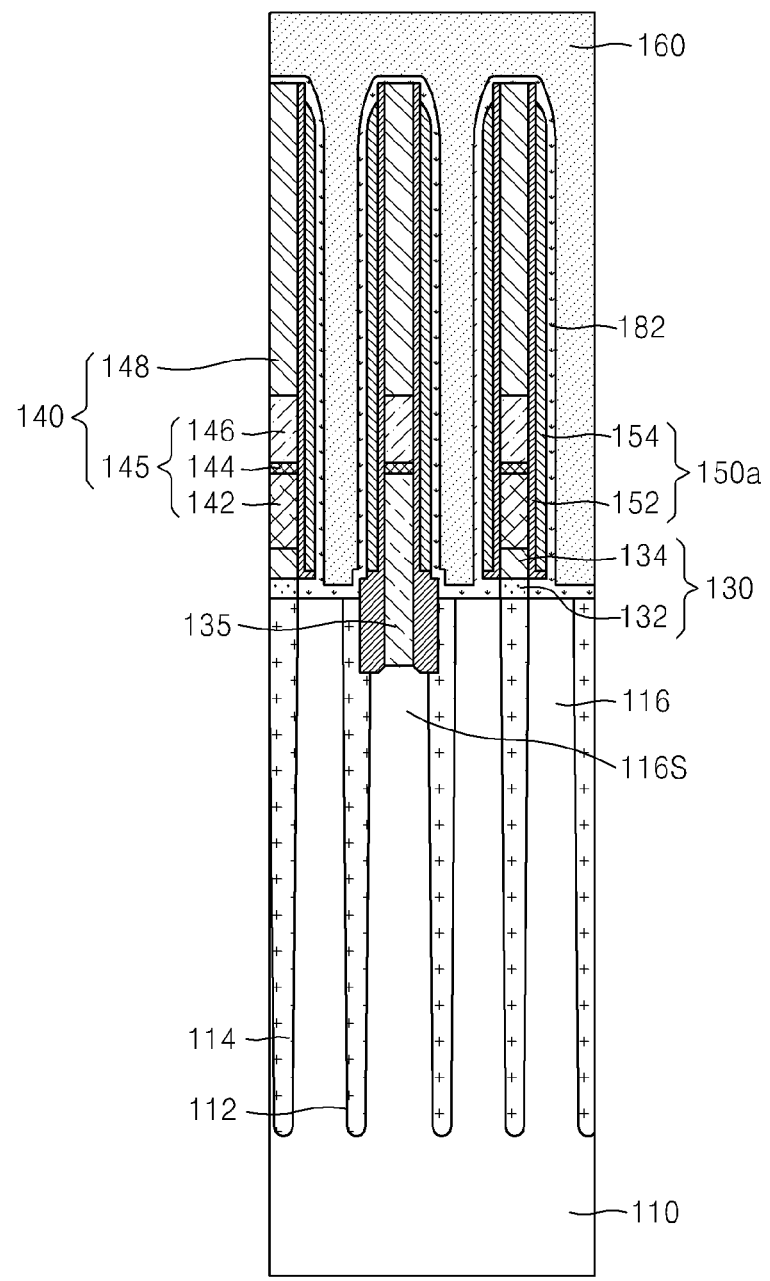
Figure 24B:
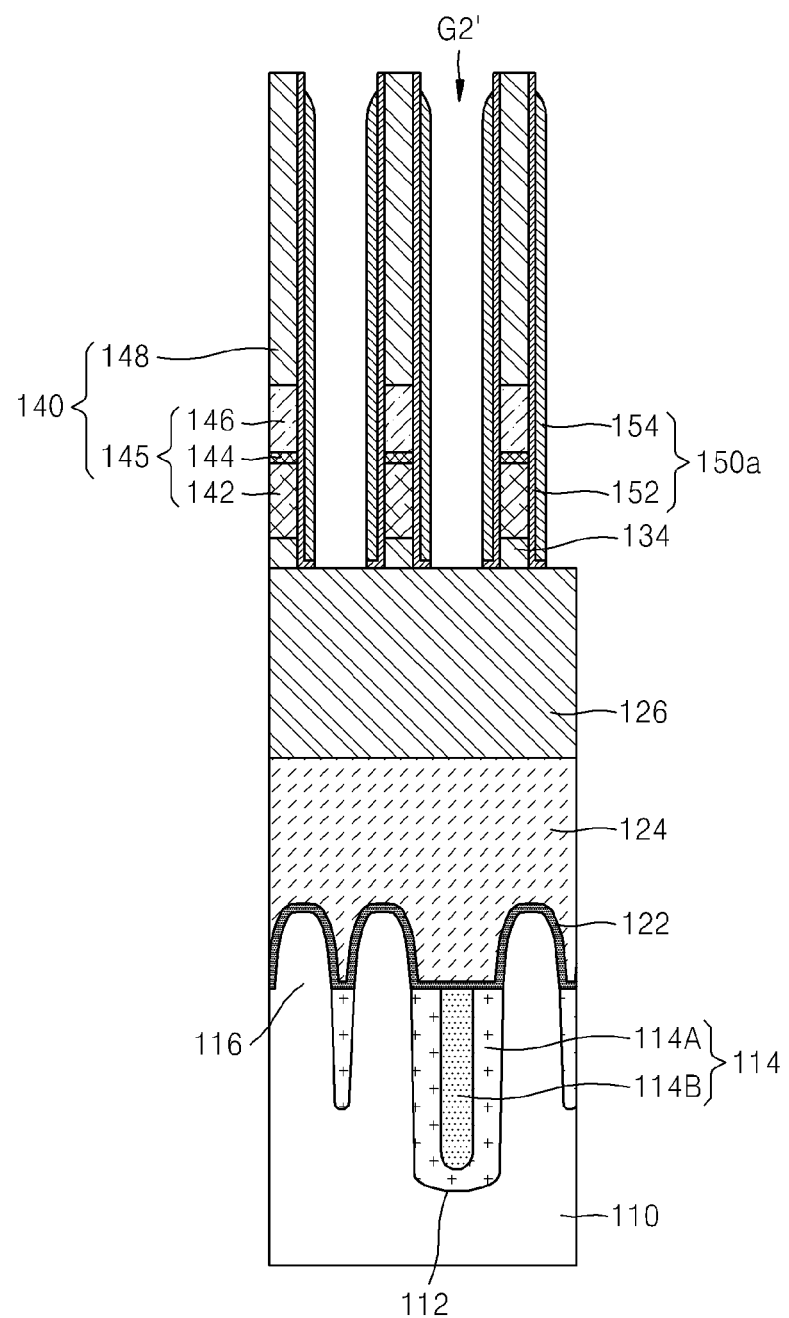
Figure 24C:
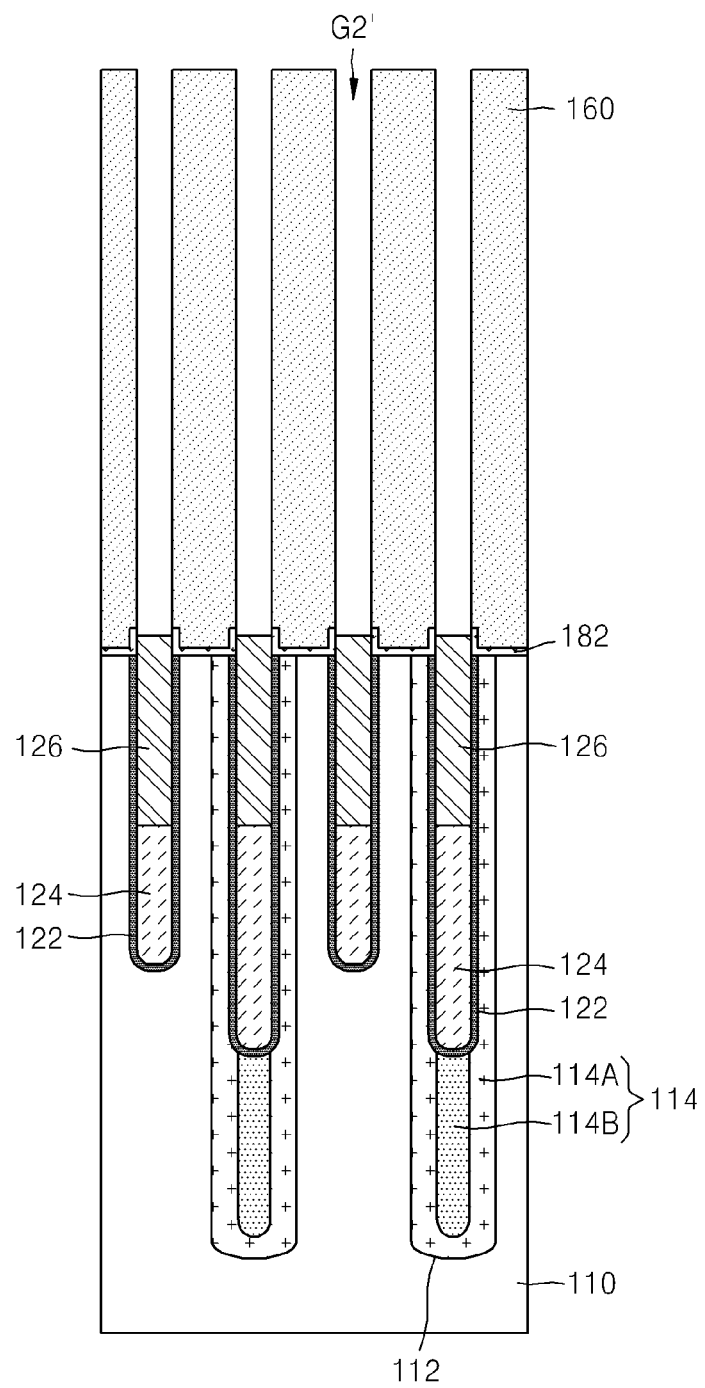
Figure 24D:
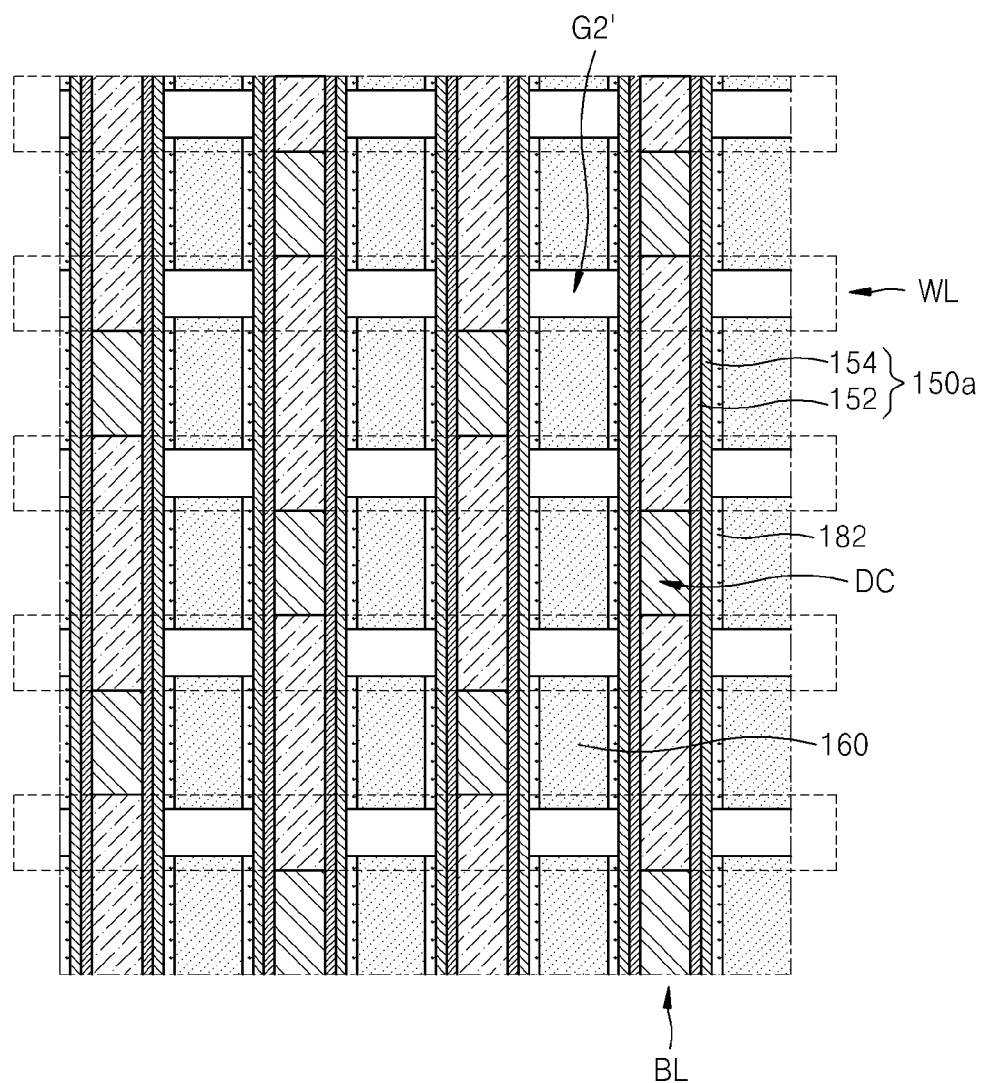

However, since the conductive thin film 182 exposed in the inner surface of the second groove G2 is also removed, the conductive thin film 182 may have several separated structures as shown in FIG. 24D. Also, as shown in FIG. 24B or 24C, after the conductive thin film 182 is removed, the multi-film spacer 150*a*, the sacrificial film 160, and the buried insulating film 126 may be exposed on an inner wall of a second groove G2'.

For reference, the conductive thin film 182 finally forms a part of the buried contact BC. Also, the buried contacts BC are electrically separated from each other. Accordingly, the conductive thin films 182 corresponding to the buried contacts BC are electrically separated from each other, and thus a separating process of the conductive thin films 182 may be performed.

Referring to FIGS. 25A through 25D, similarly to FIGS. 8A through 8C, the first insulating film 170 filling the second groove G2' and covering the top surfaces of the bit line structure 140 and multi-film spacer 150*a* is formed. The first insulating film 170 may be an insulating film formed of an oxide material. As described above, the first insulating film 170 operates as a fence surrounding two side surfaces of the buried contact BC later.

Figure 25A:
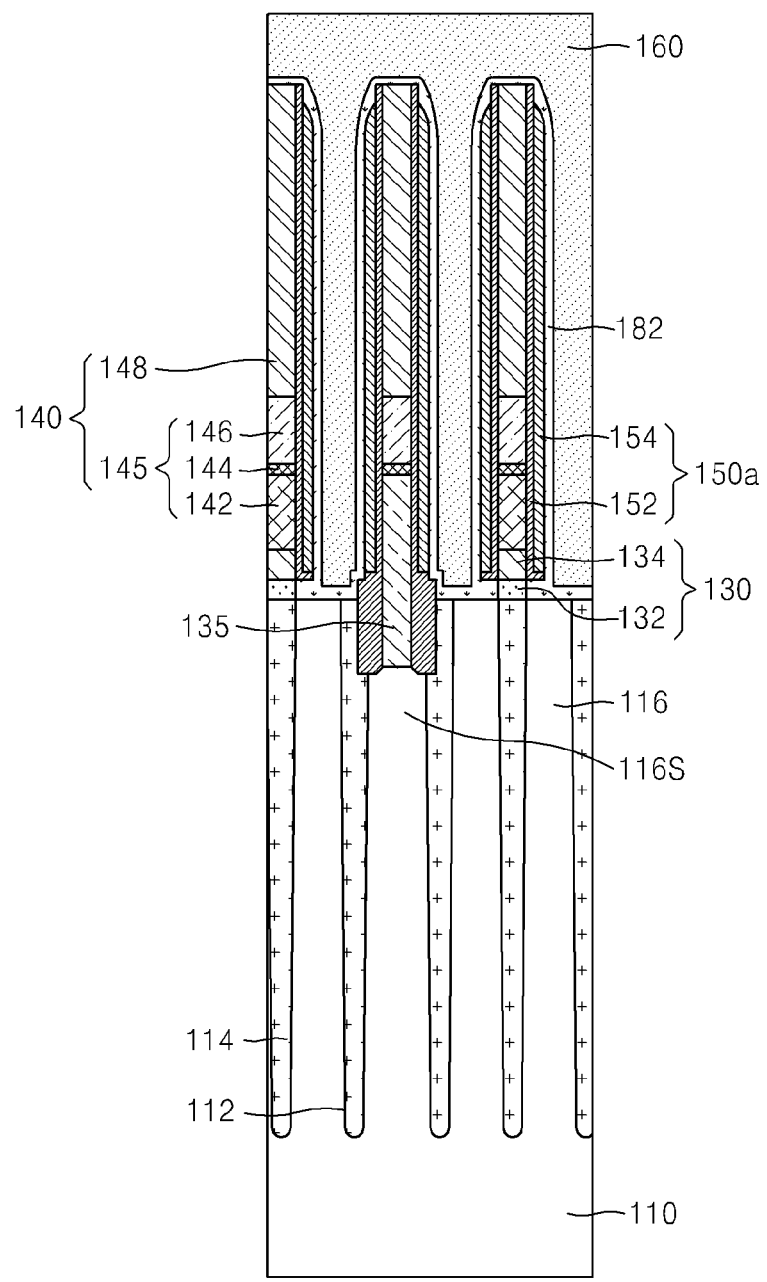
Figure 25B:
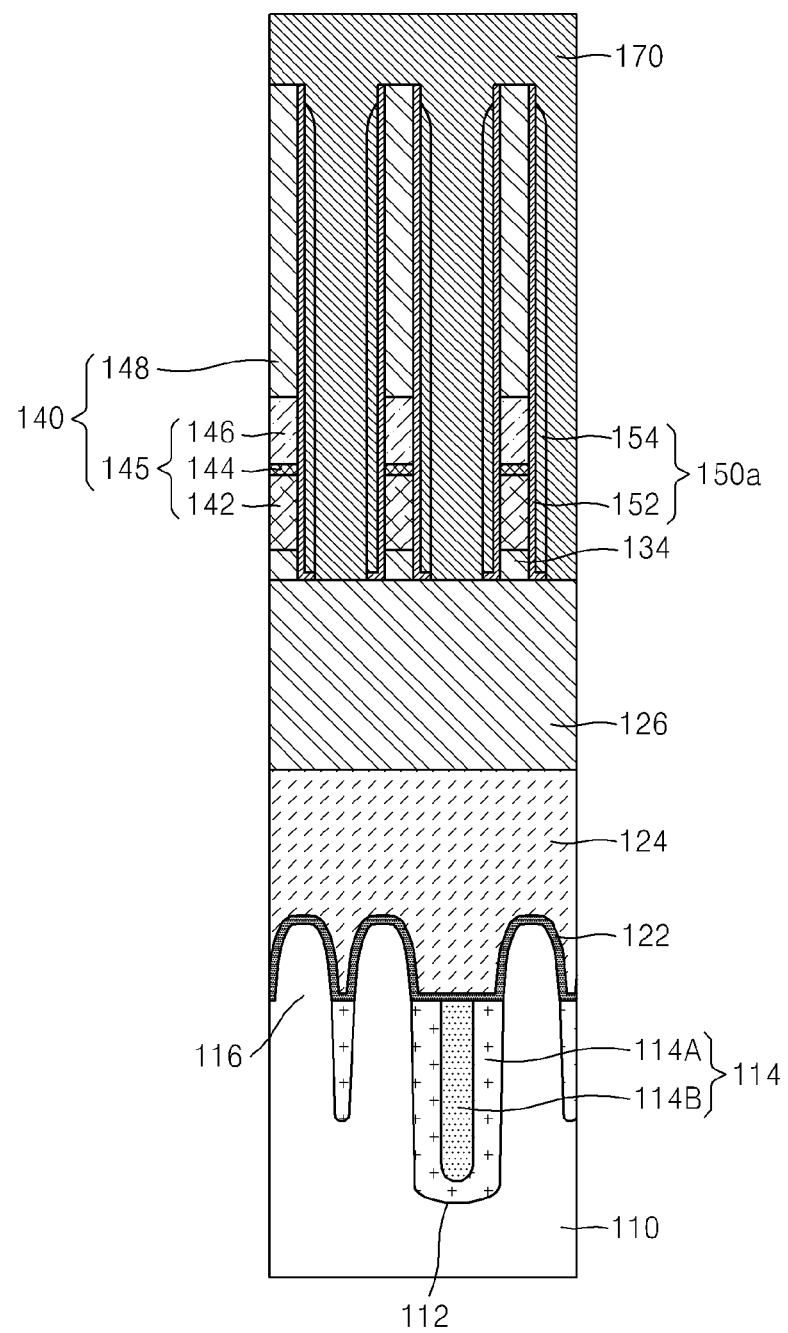
Figure 25C:
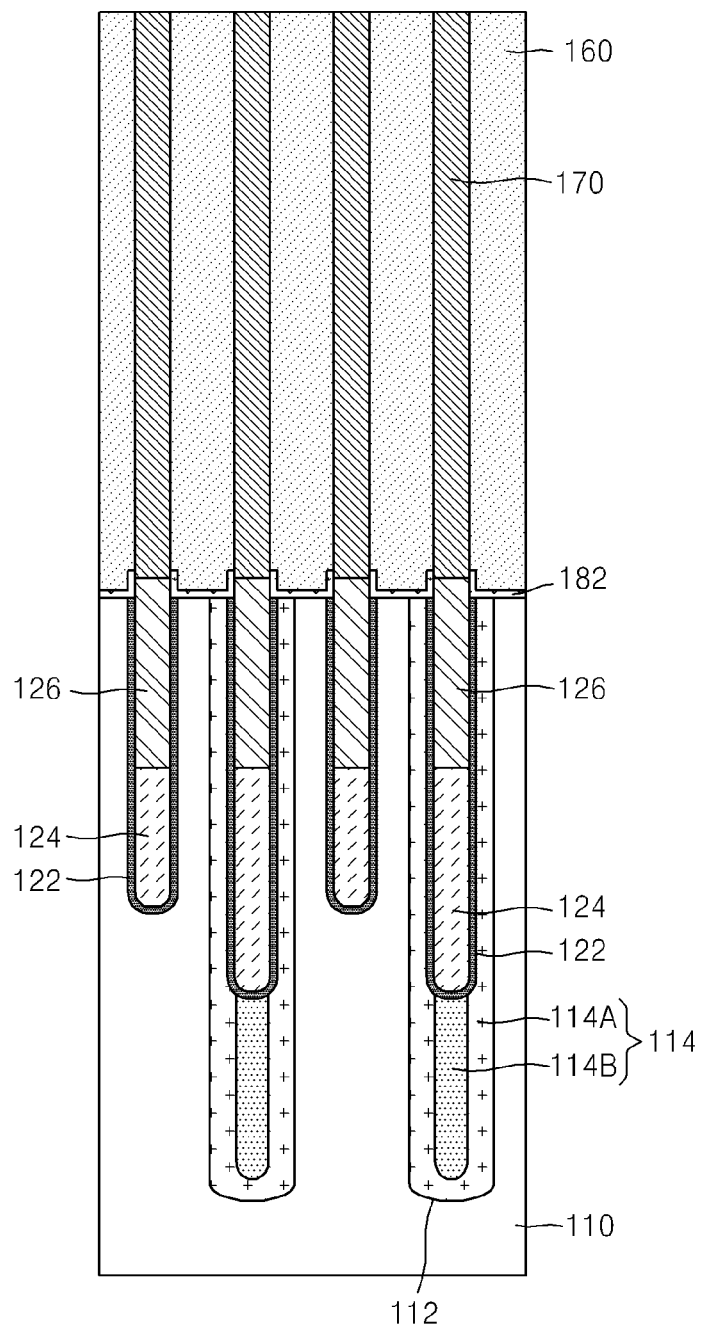
Figure 25D:
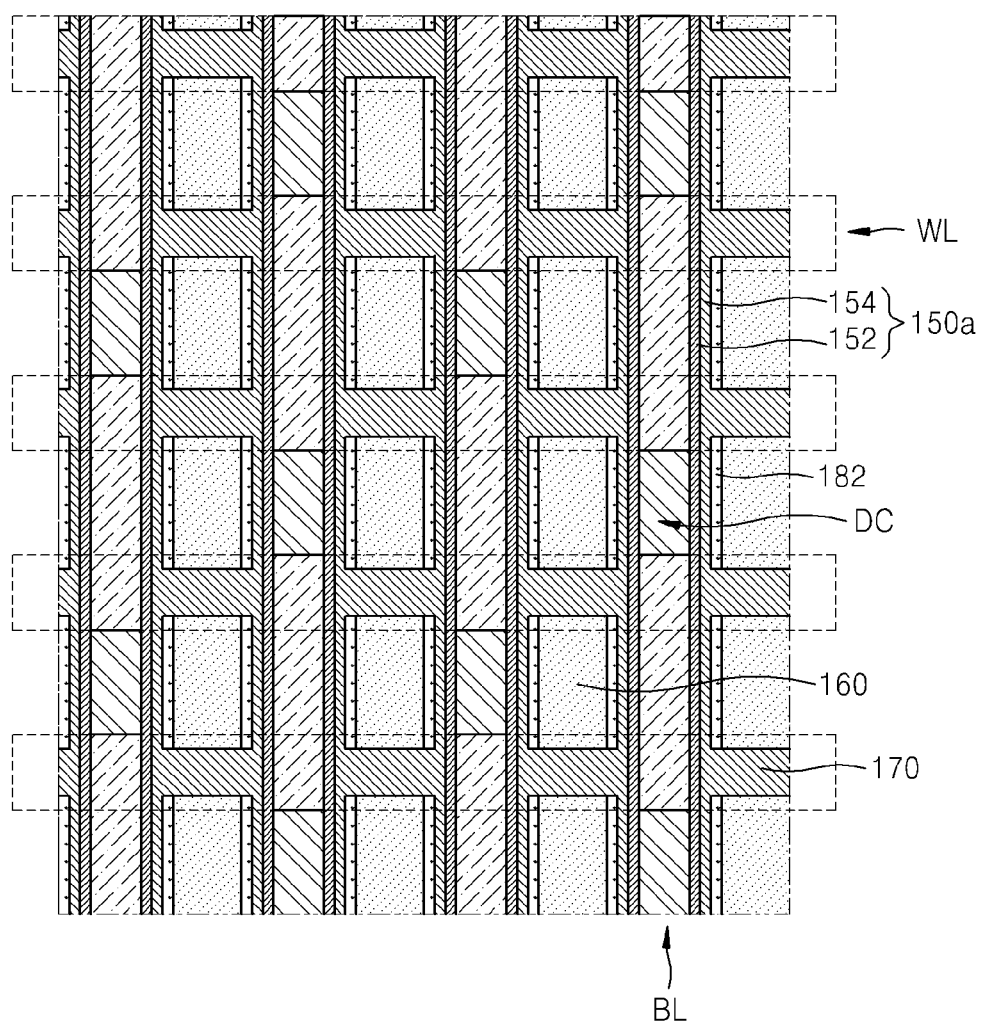

In FIG. 25B, the first spacer 154 and the first insulating film 170 are separately displayed for convenience of understanding. In other words, since the first spacer 154 and the first insulating film 170 are formed of the same oxide material, they are not classified from each other and may form one material film. Accordingly, in FIG. 26D, the first spacer 154 and the first insulating film 170 are displayed in one hatching and are not classified from each other.

Referring to FIGS. 26A through 26D, similarly to FIGS. 9A through 9C, the plurality of third grooves G3 opening a part of the conductive thin film 182 remained after removing the sacrificial film 160 formed of an SOH material is formed. As described above, the sacrificial film 160 may be removed via the ashing and stripping processes. By removing the sacrificial film 160, the conductive thin film 182 coated before forming the sacrificial film 160 may be opened through the third groove G3.

Figure 26A:
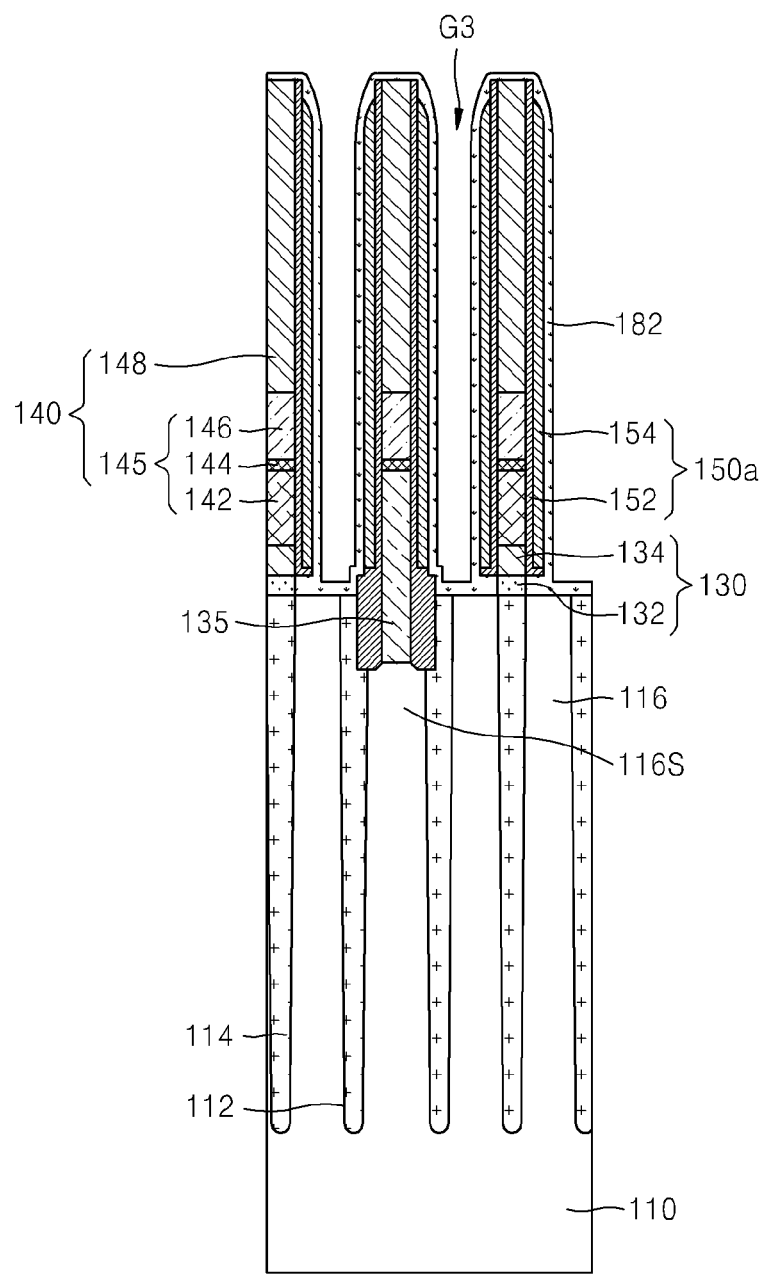
Figure 26B:
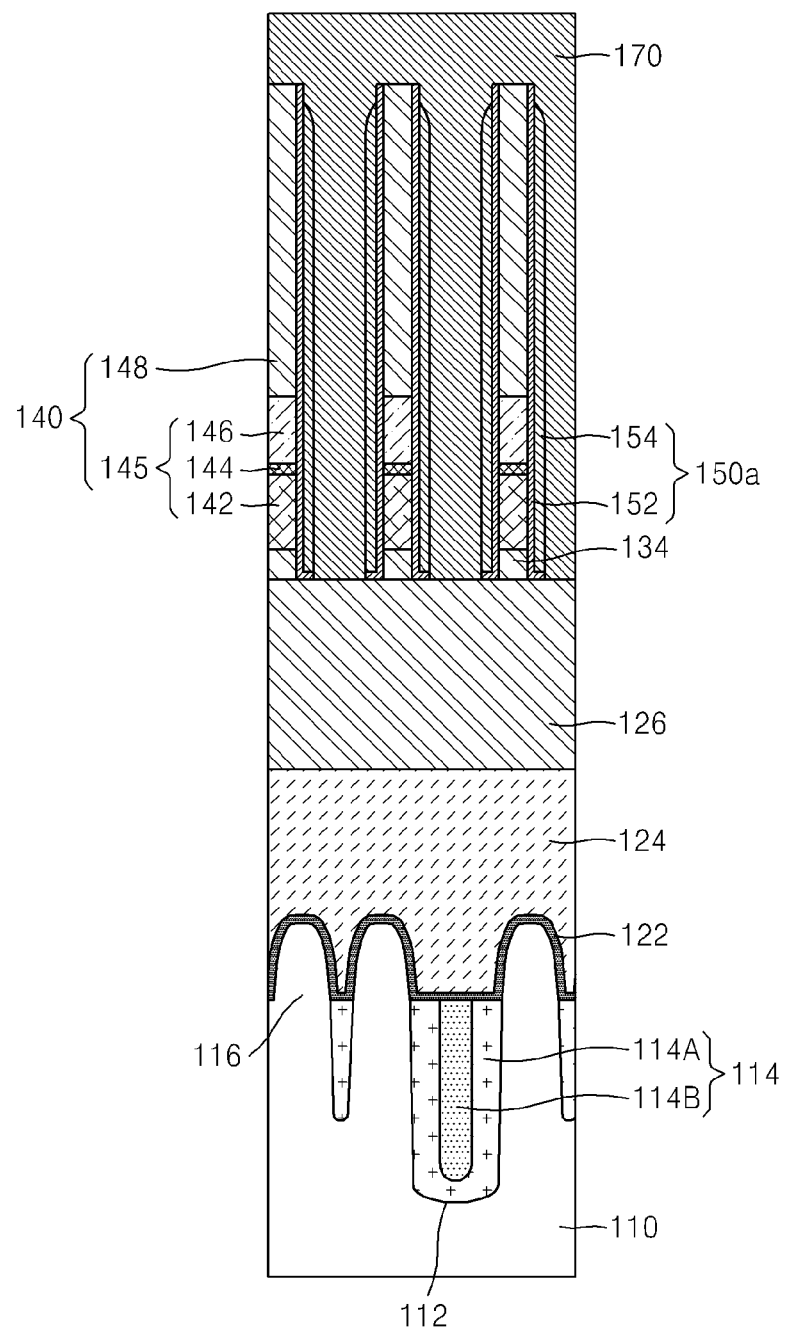
Figure 26C:
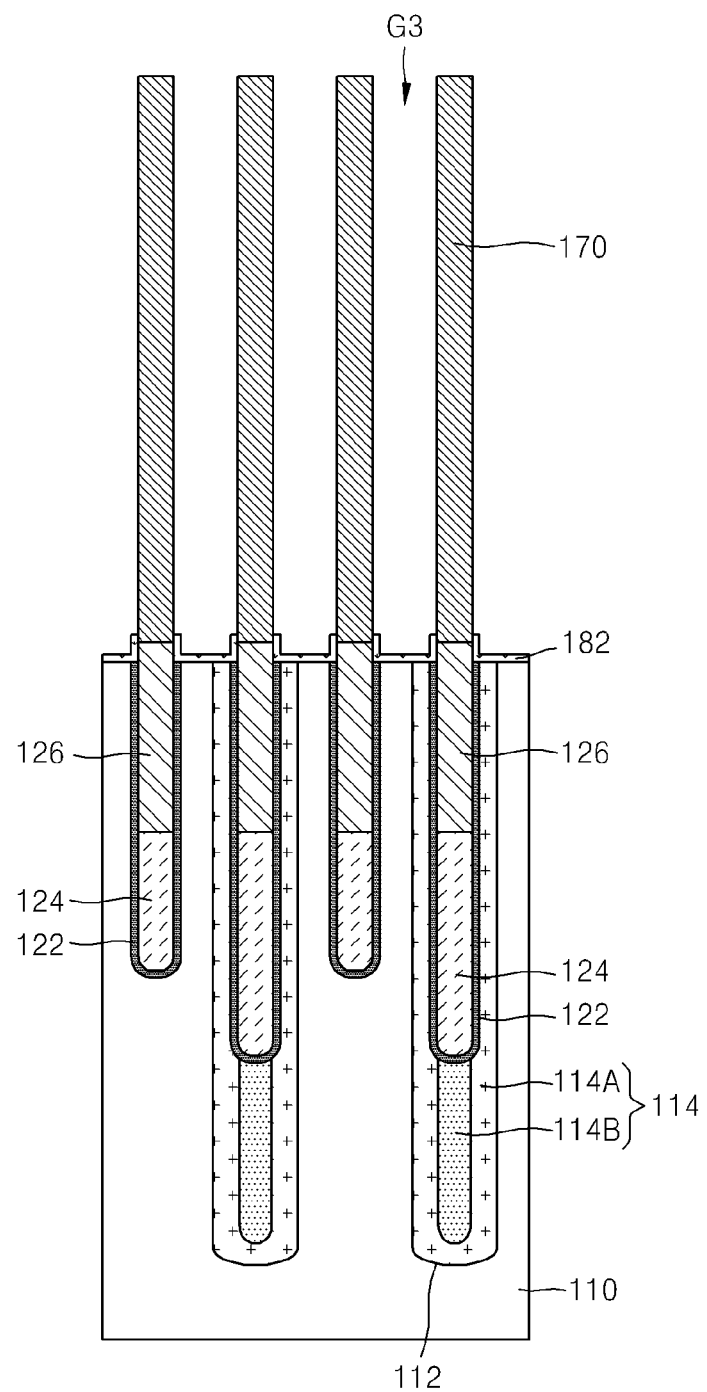
Figure 26D:
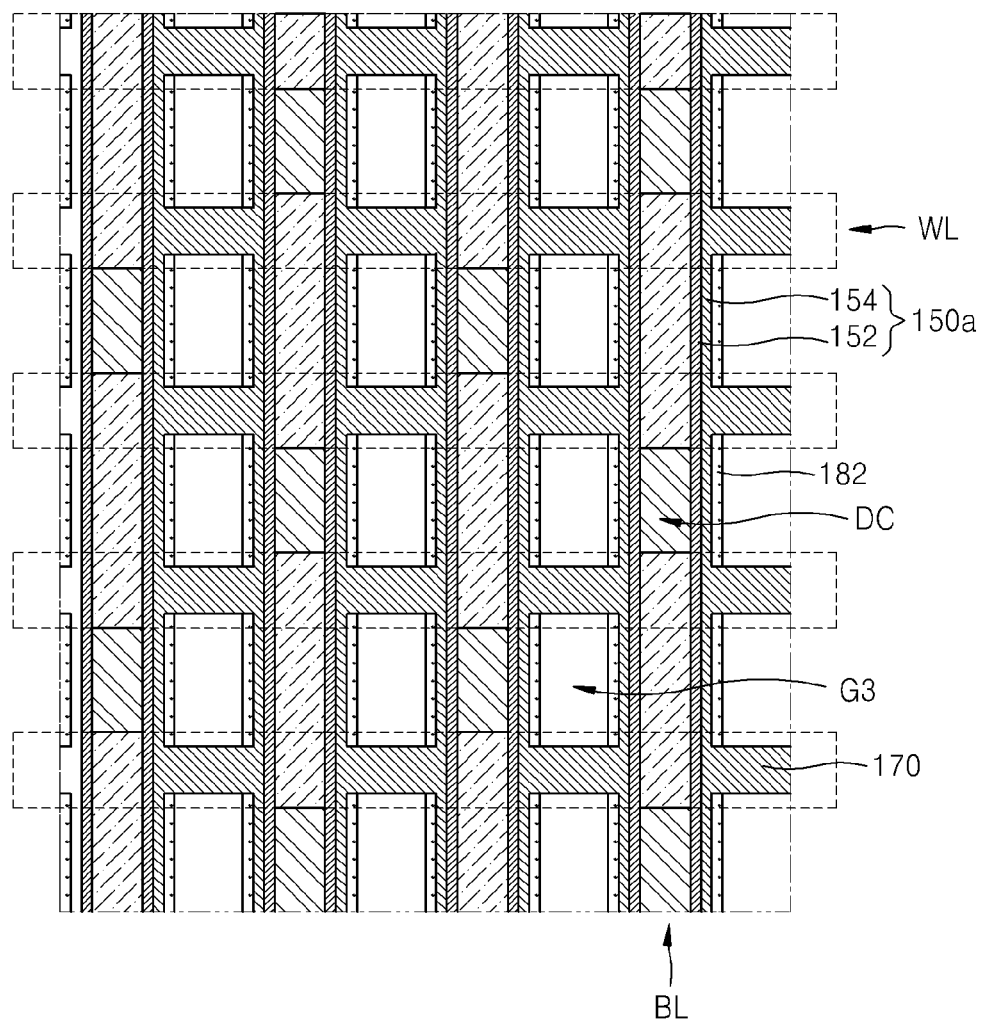

As shown in FIG. 26B, the conductive thin film 182 on the side wall of the first insulating film 170 may be removed in FIGS. 24A through 24D such that the first insulating film 170 is exposed on the inner wall of the third groove G3. Also, as shown in FIG. 26D, the third grove G3 may be surrounded by the conductive thin film 182 on two side walls in the second direction (x direction) and by the first insulating film 170 on two side walls in the first direction (y direction).

Meanwhile, according to the method of at least one example embodiment, since the sacrificial film 160 formed of an SOH material is used, the sacrificial film 160 is easily removed through the ashing and stripping processes, and thus a loss of a mask, i.e., a spacer formed of a nitride material or a recess in the device isolating film 114, generated while using a sacrificial film formed of an oxide material is etched may be mitigated (or alternatively, prevented).

Also, in at least one example embodiment, by using the conductive thin film 182 formed of polysilicon, the outermost layer of a multi-film spacer, i.e., the second spacer 156 formed of a nitride material, may be removed. Accordingly, a width of the buried contact may be increased by twice a thickness of the second spacer 156. In more detail, the conductive thin film 182 formed of polysilicon is formed, instead of the second spacer, to protect the first spacer 154, and the conductive thin film 182 forms a part of the buried contact BC later, and thus the width of the buried contact BC in the second direction (x direction) is increased as much.

Referring to FIGS. 27A through 27C, similarly to FIGS. 10A through 10C, a conductive material film (not shown) filling the third groove G3 and covering the top surfaces of the conductive thin film 182 and the first insulating film 170 is formed. Then, top portions of the conductive material film, conductive thin film 182, and first insulating film 170 are removed to expose the top surfaces of the bit line structure 140 and multi-film spacer 150a through CMP, thereby forming the plurality of buried contacts 180.

The conductive material film may be formed of a polysilicon material like the conductive thin film 182. Accordingly, a conductive material film 185 remained through CMP and the conductive thin film 182 may form the buried contact 180. Meanwhile, the conductive material film may be formed by depositing polysilicon. Alternatively, the conductive material film may be formed via an SEG process by using the conductive thin film 182 as a seed layer.

Meanwhile, a material of the conductive material film is not limited to a polysilicon material. For example, the conductive material film may be formed of a metal, metal silicide, metal nitride, or a combination thereof. Accordingly, the buried contact 180 may also be formed of a metal, metal silicide, metal nitride, or a combination thereof. If the conductive material film is formed of a metal, a metal silicide film may be formed on a boundary between the conductive material film and the conductive thin film 182.

Then, as shown in FIGS. 11A through 13C, after etching back the buried contact 180, the metal film 190 may be formed, the landing pad 190a may be formed through the landing pad groove Glp, and the capping insulating film 178 filling the landing pad groove Glp and covering the top surface of the landing pad 190a may be formed.

Figure 31A:
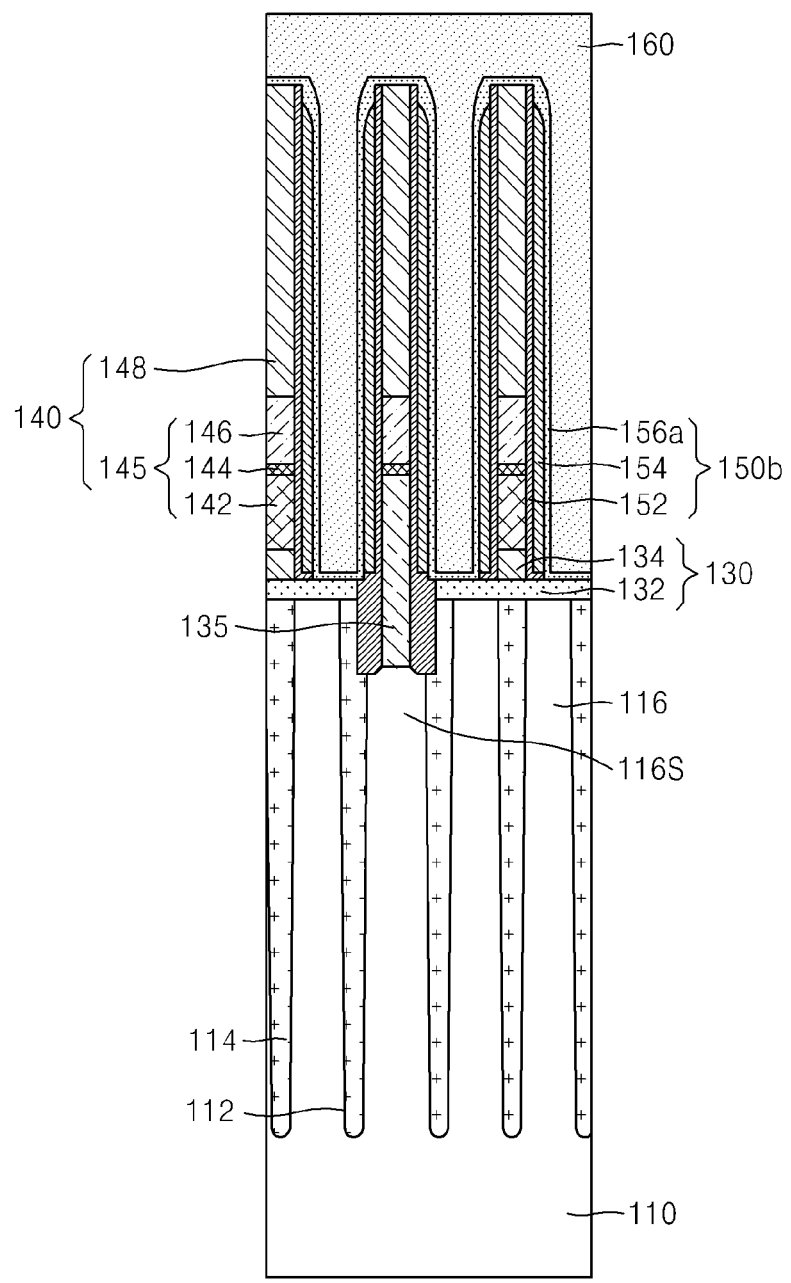
Figure 31B:
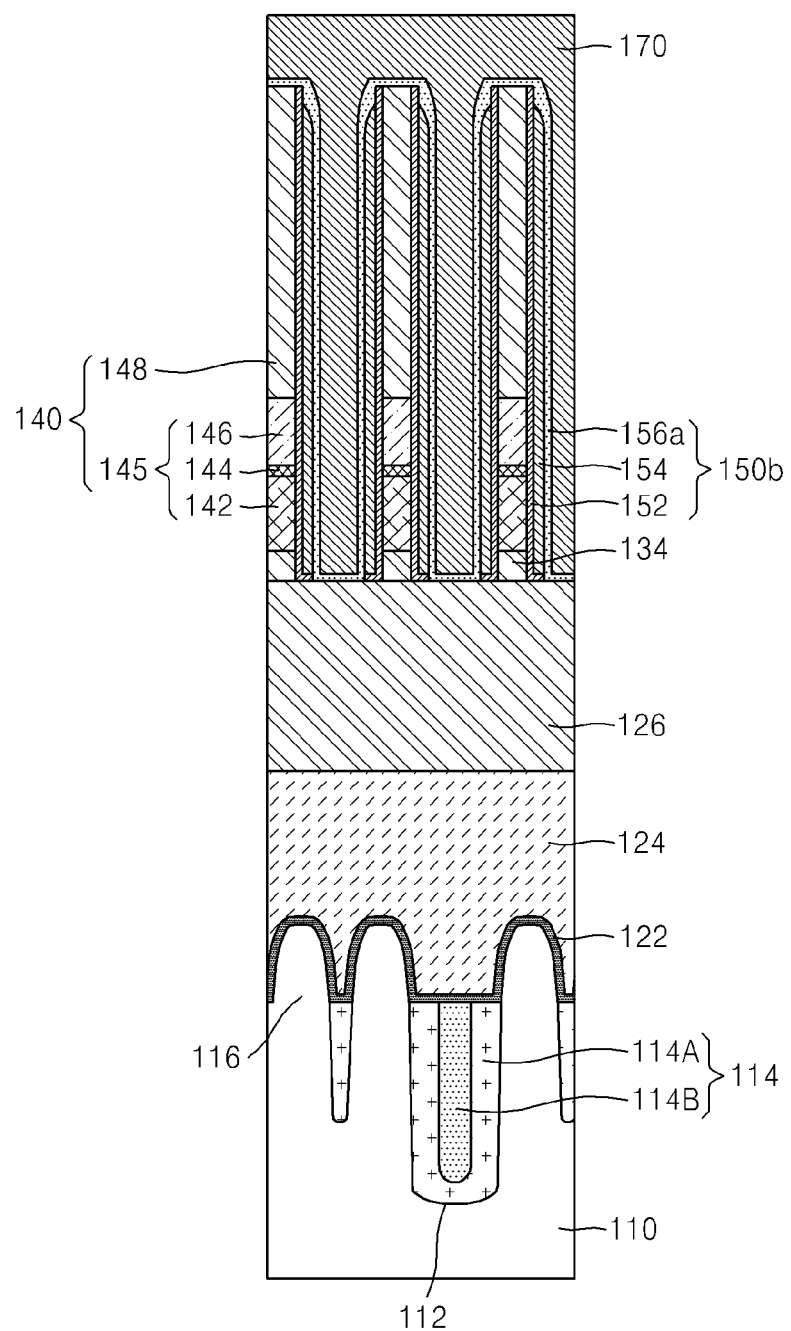
Figure 31C:
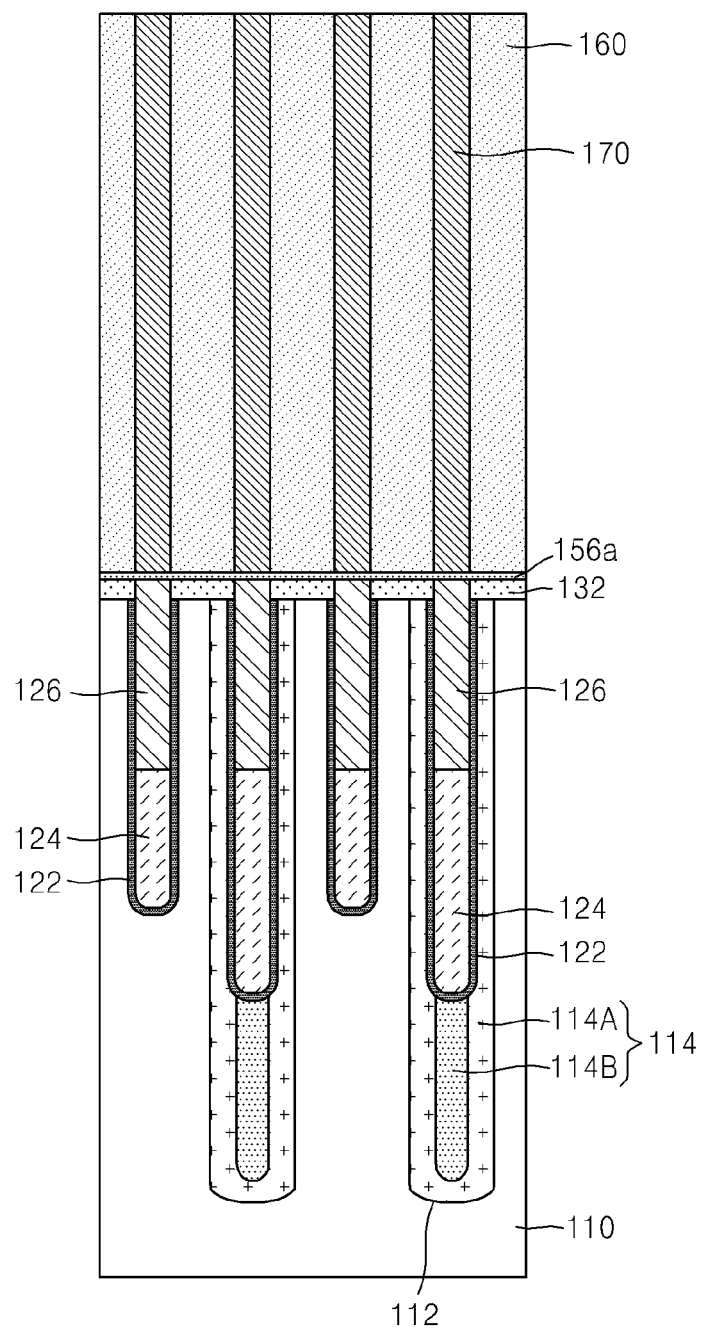
Figure 32A:
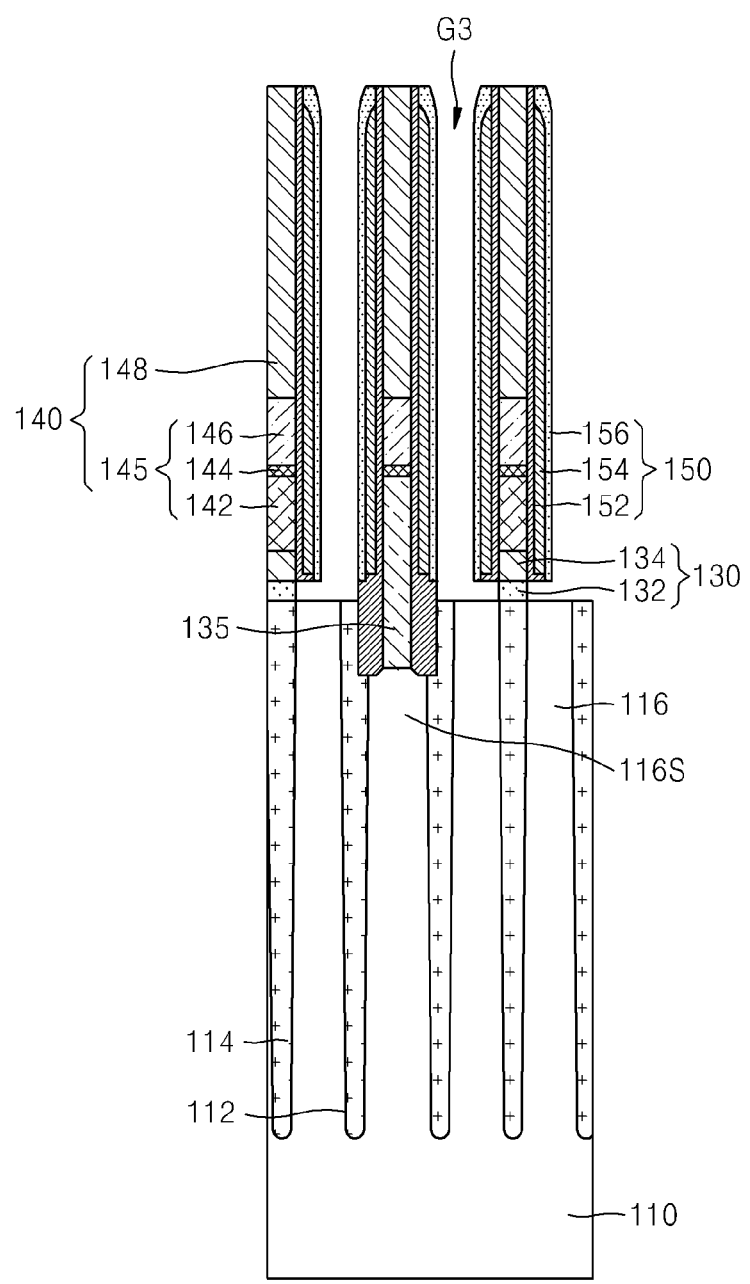
Figure 32B:
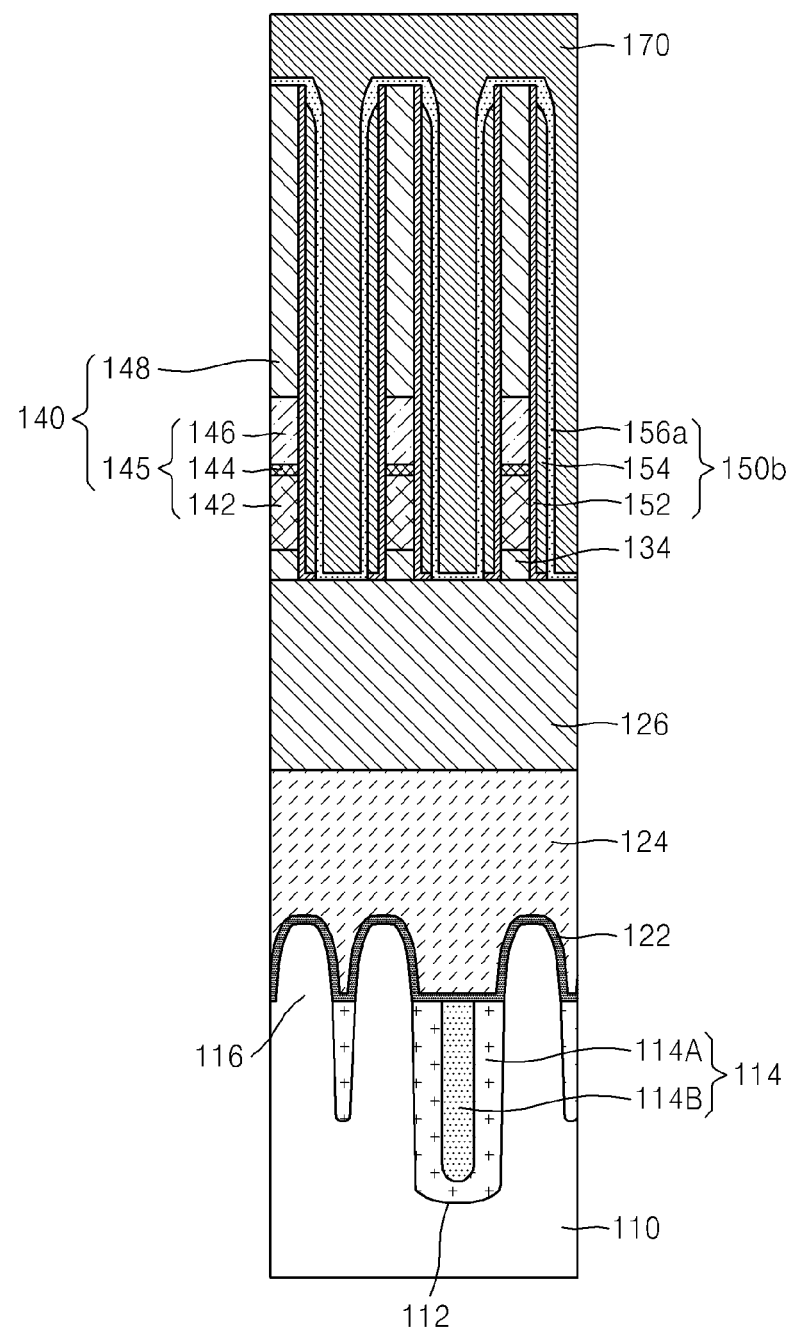
Figure 32C:
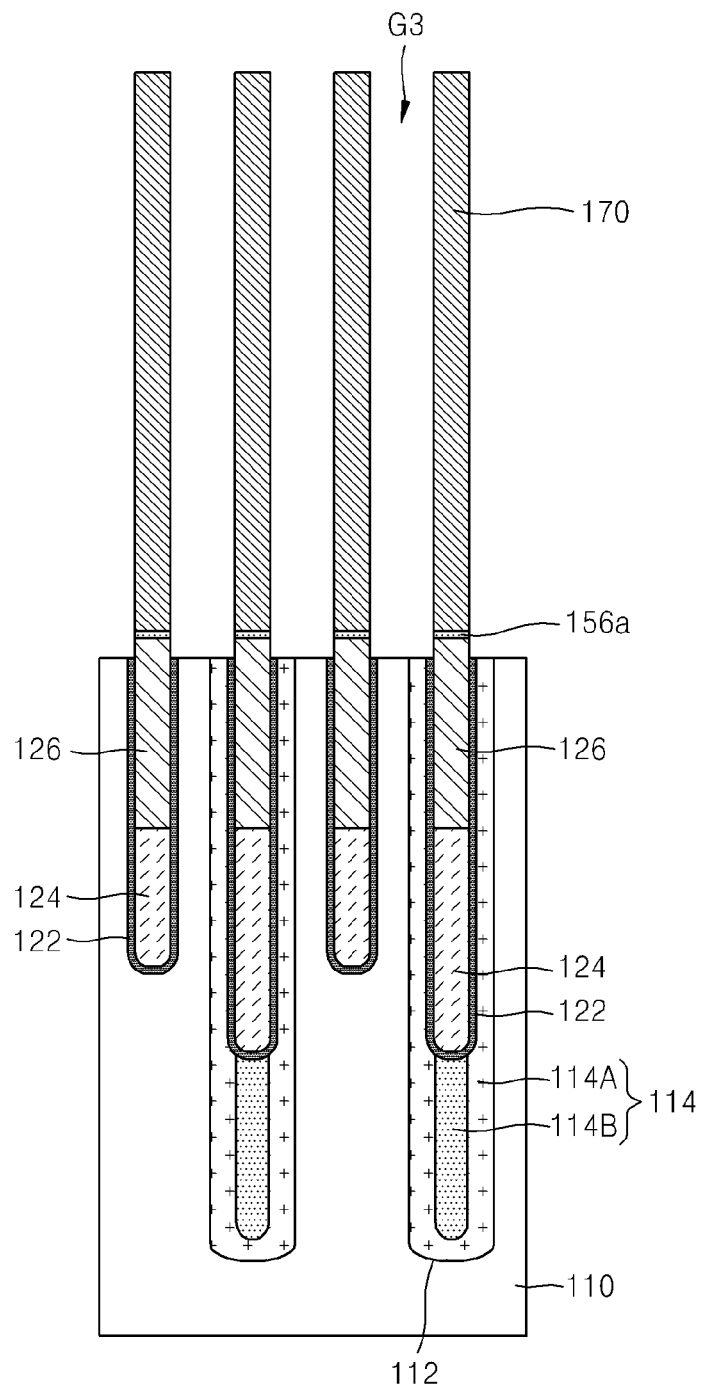
Figure 32D:
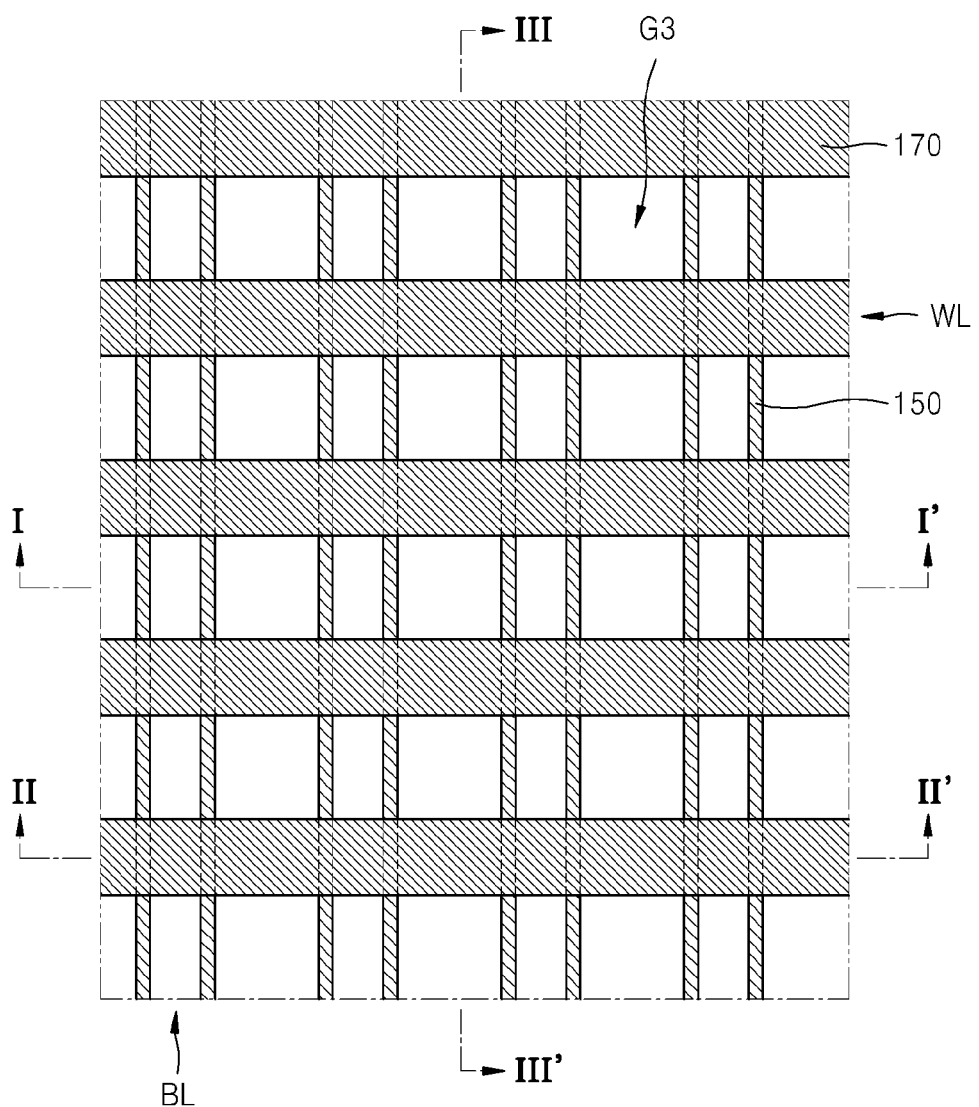

FIGS. 28A through 32D are cross-sectional views for describing a method of manufacturing a semiconductor device, according to at least one example embodiment of the inventive concepts. Here, FIGS. 28A, 29A, . . . , and 32A are cross-sectional views taken along the line I-I' of FIG. 1, FIGS. 28B, 29B, . . . , and 32B are cross-sectional views taken along the line II-II' of FIG. 1, and FIGS. 28C, 29C, . . . , and 32C are cross-sectional views taken along the line III-III' of FIG. 1. Also, FIGS. 30D and 32D are plan views corresponding to FIG. 1. Like reference numerals denote like elements in FIGS. 2A through 13C and FIGS. 28A through 32C, and thus overlapping descriptions are not provided here.

Figure 28A:
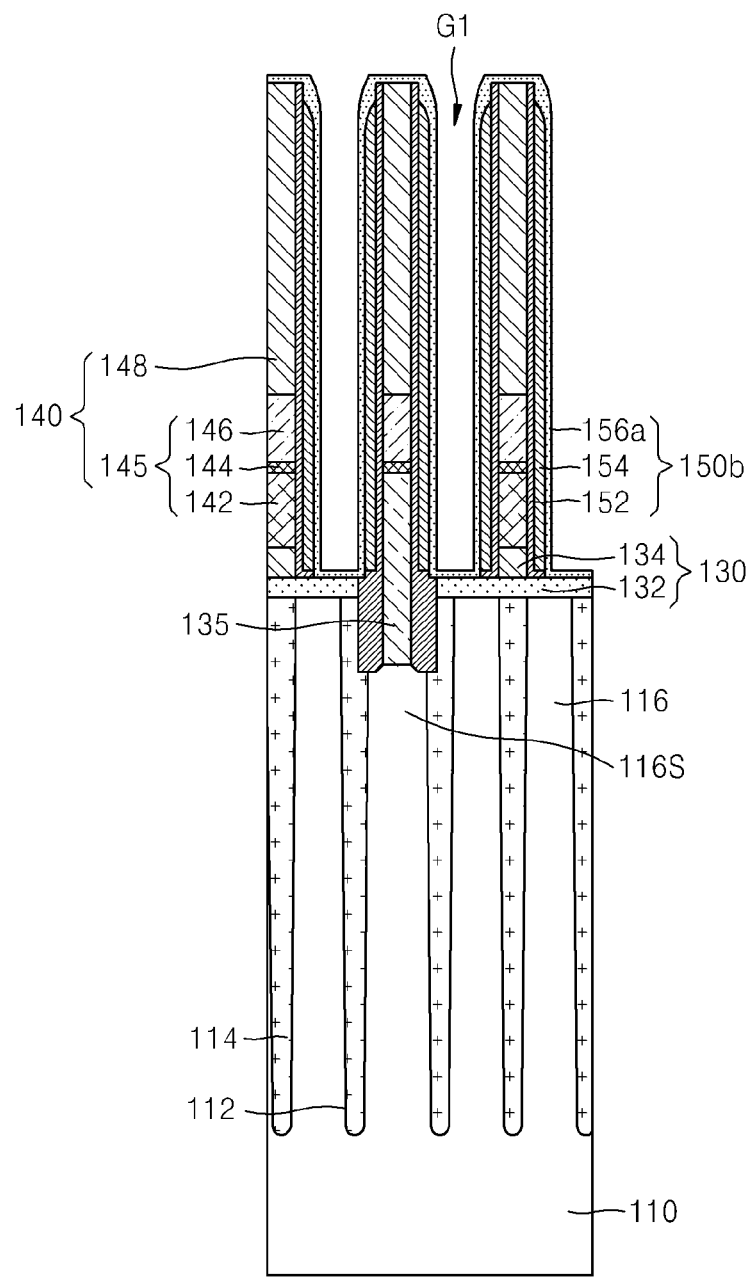
FIGS. 28A through 32D are cross-sectional views for describing a method of manufacturing a semiconductor device, according to at least one example embodiment of the inventive concepts.
Figure 28B:
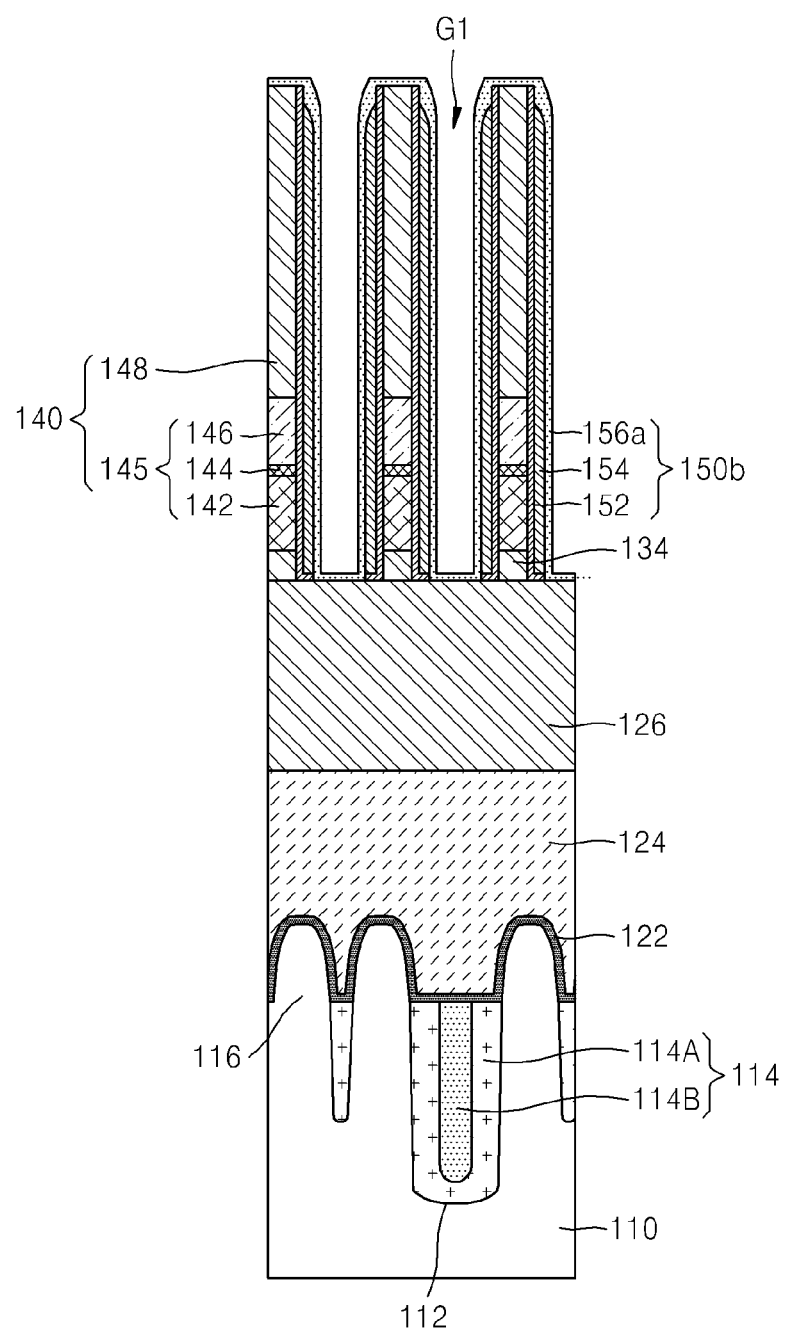
Figure 28C:
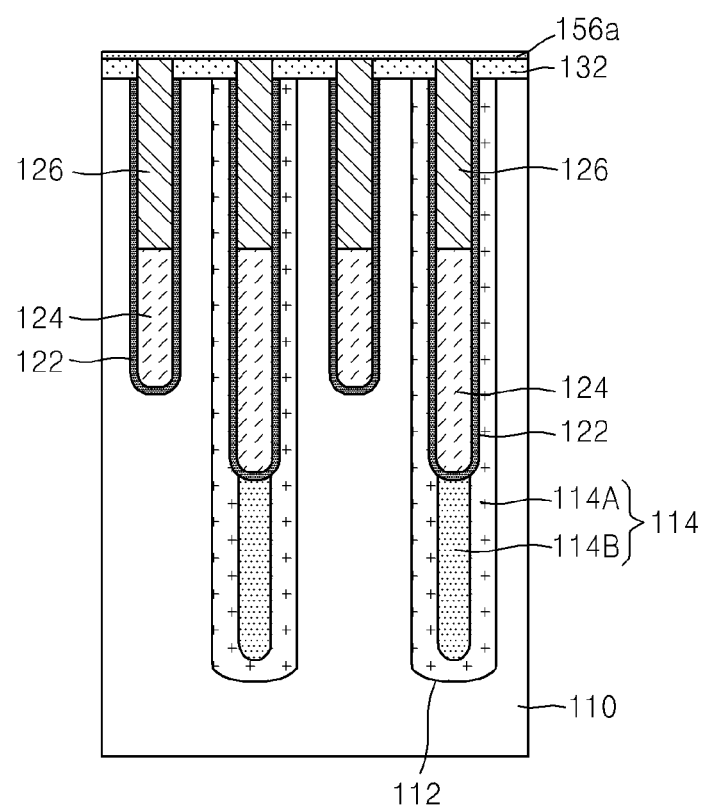

Referring to FIGS. 28A through 28C, after forming the insulating liner 152 and the first spacer 154 on two side walls of the bit line structure 140, a second spacer insulating film 156a covering the insulating liner 152 and the first spacer 154 in a uniform thickness is formed on a result product obtained by forming the first spacer 154.

Here, the insulating liner 152 may be formed of a nitride material and the first spacer 154 may be formed of an oxide material. Also, the second spacer insulating film 156a may be formed of a nitride material. The insulating liner 152, the first spacer 154, and the second spacer insulating film 156a may form an initial multi-film spacer 150b surrounding the side wall of the bit line structure 140.

According to the method of at least one example embodiment, the second spacer insulating film 156a is not formed to a second spacer via etch-back. Accordingly, the second spacer insulating film 156a may cover the top surface of the bit line structure 140 and the interlayer insulating film pattern 130 of bottom surfaces of a first groove G1. In other words, the interlayer insulating film pattern 130, for example, the SiO film 132, may not be exposed through the first groove G1.

Figure 29A:
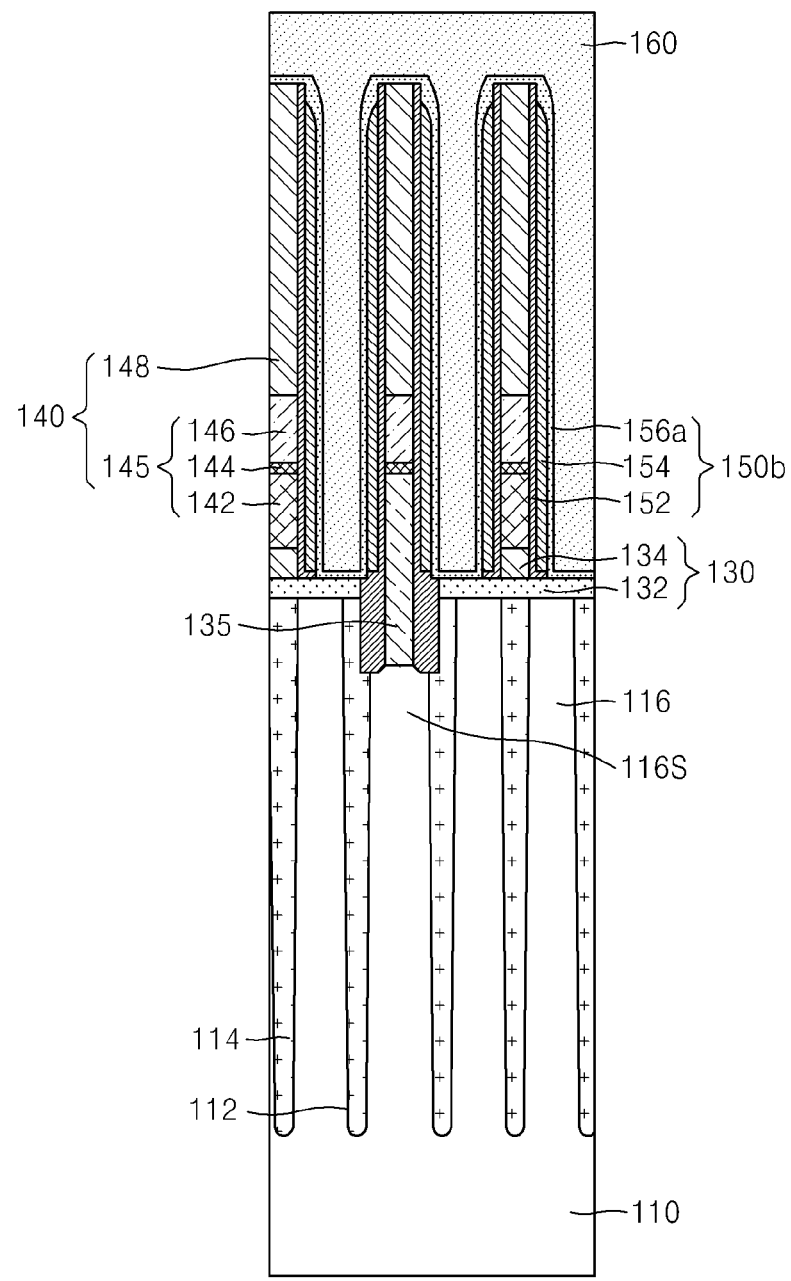
Figure 29B:
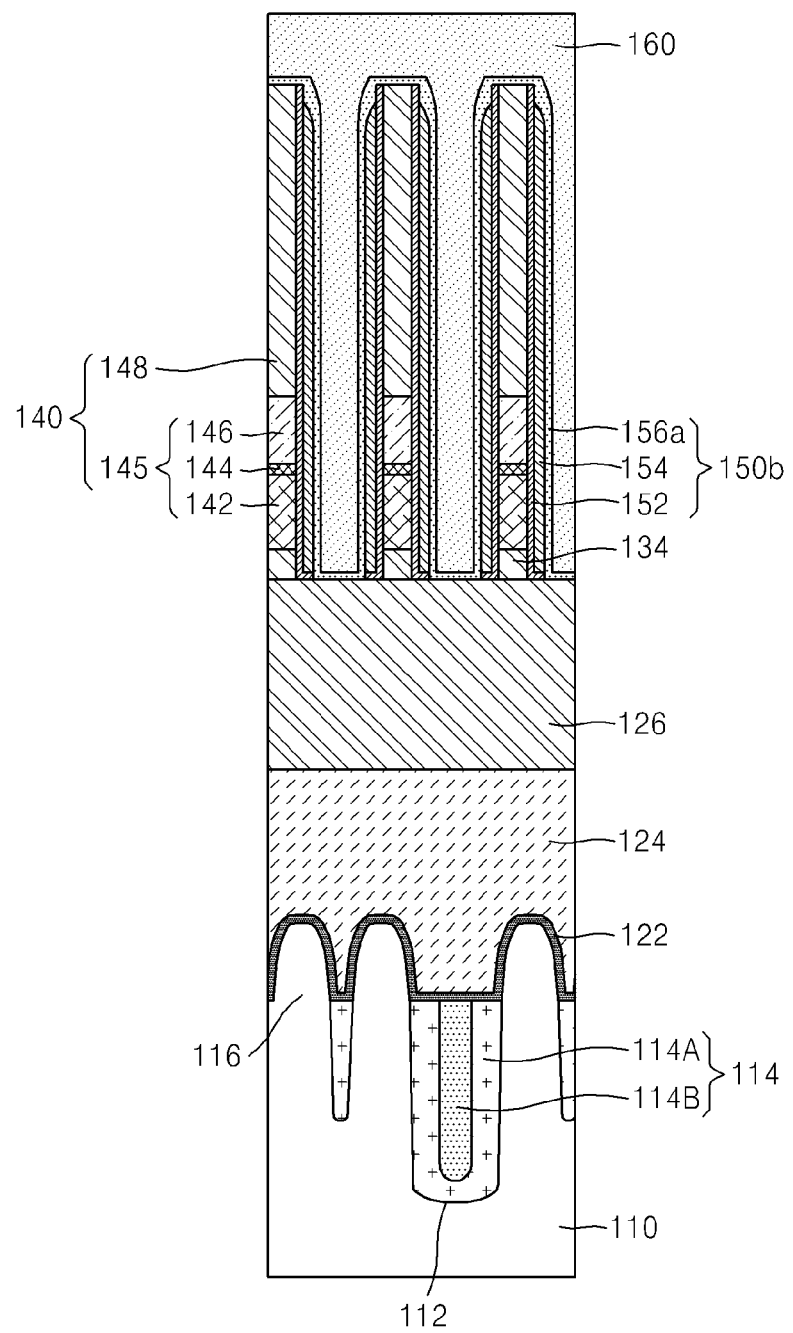
Figure 29C:
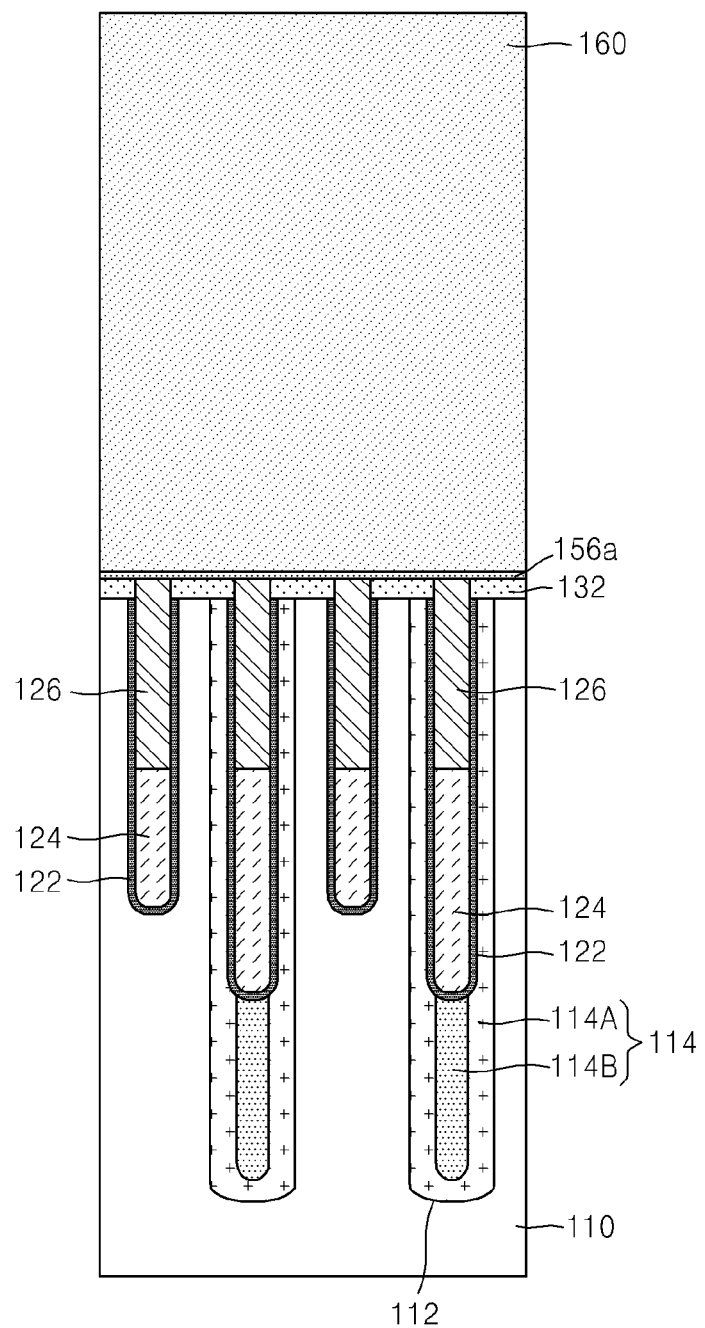

Referring to FIGS. 29A through 29C, similarly to FIGS. 6A through 6C, the sacrificial film 160 formed of an SOH material, filling the first groove G1, and covering the top surfaces of the bit line structure 140 and initial multi-film spacer 150b is formed. In detail, the sacrificial film 160 may be formed on the second spacer insulating film 156a formed in FIGS. 28A through 28C.

The sacrificial film 160 formed of an SOH material may be used to form a first insulating film later, and may be finally removed via ashing and stripping processes. After removing the sacrificial film 160 via the ashing and stripping processes, the second spacer insulating film 156a may be exposed.

Figure 30A:
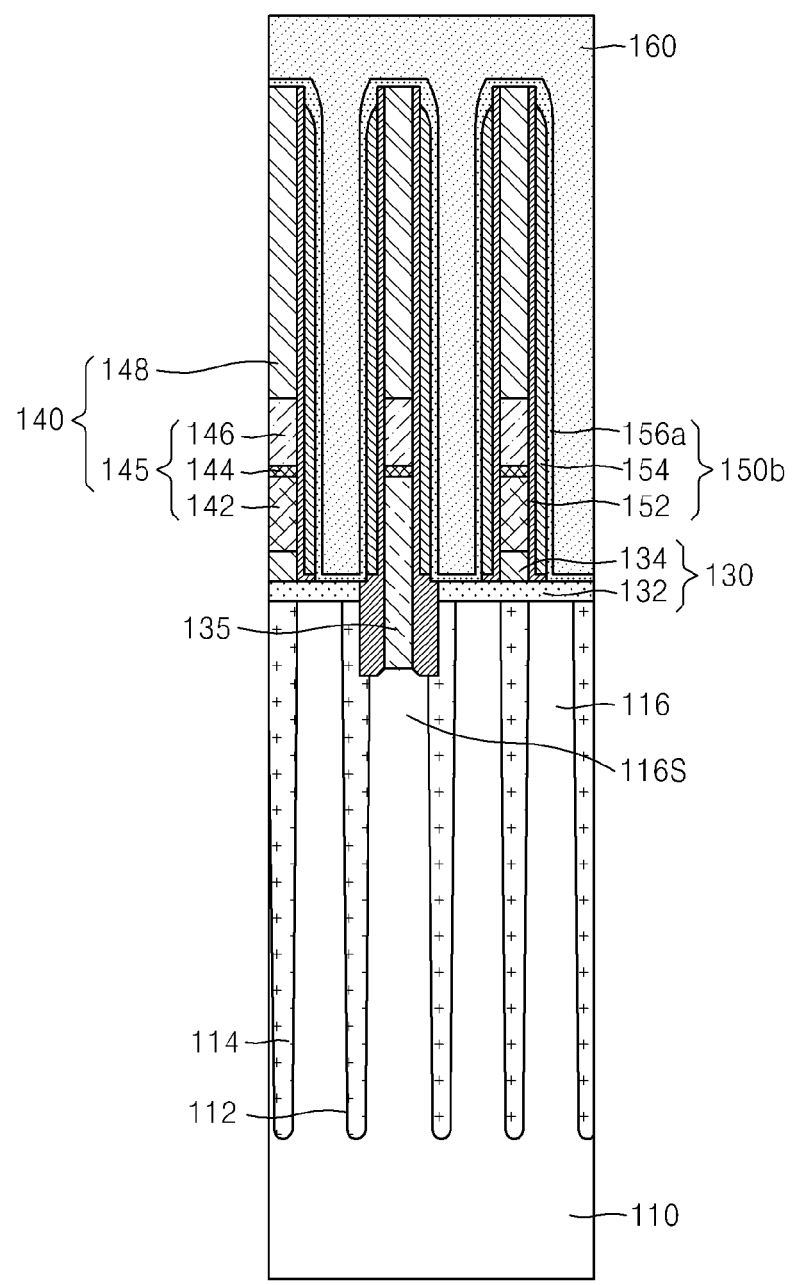
Figure 30B:
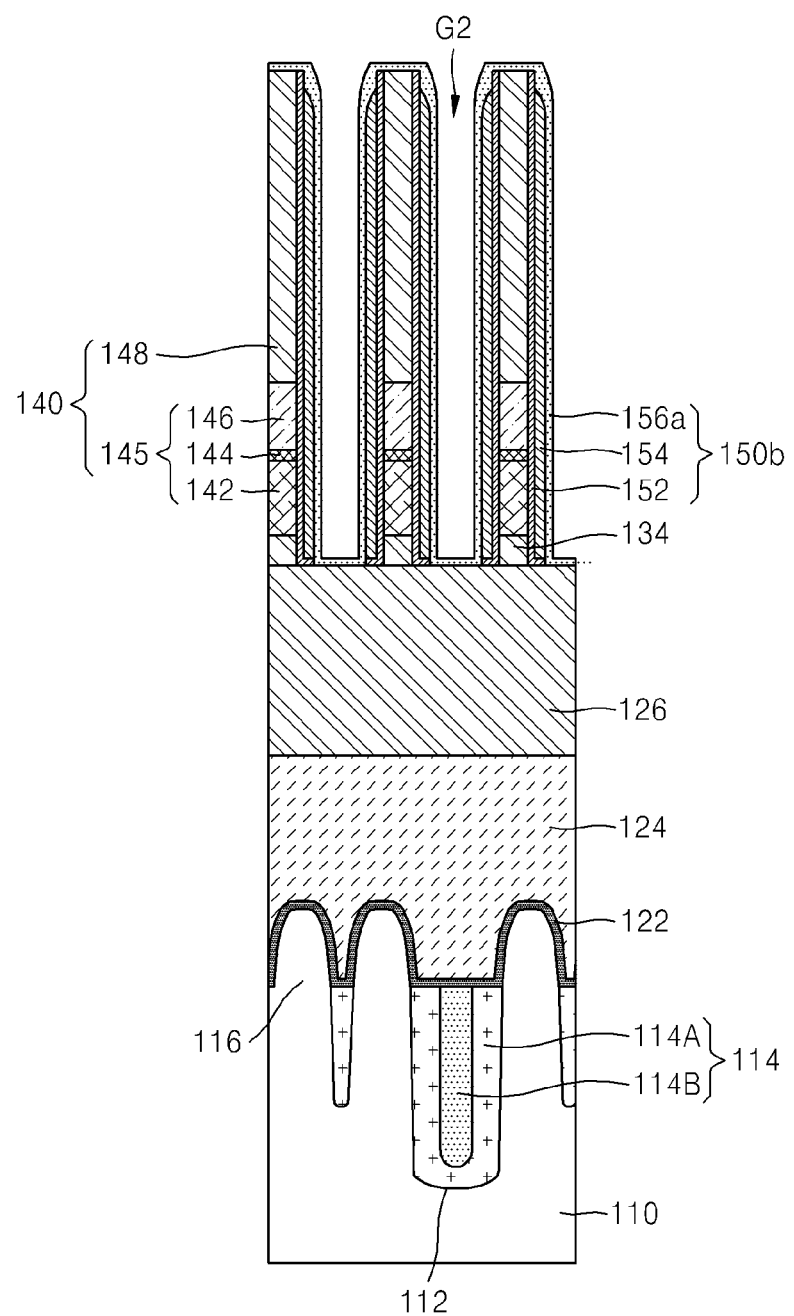
Figure 30C:
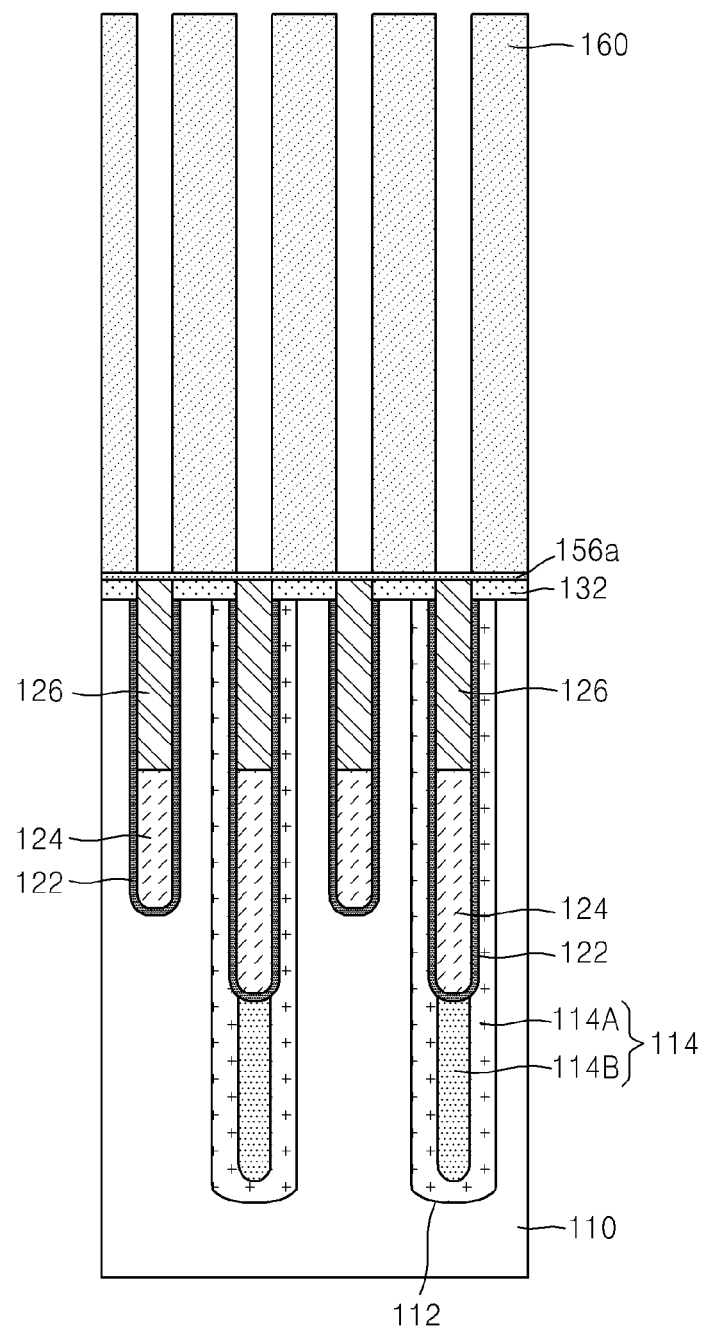
Figure 30D:
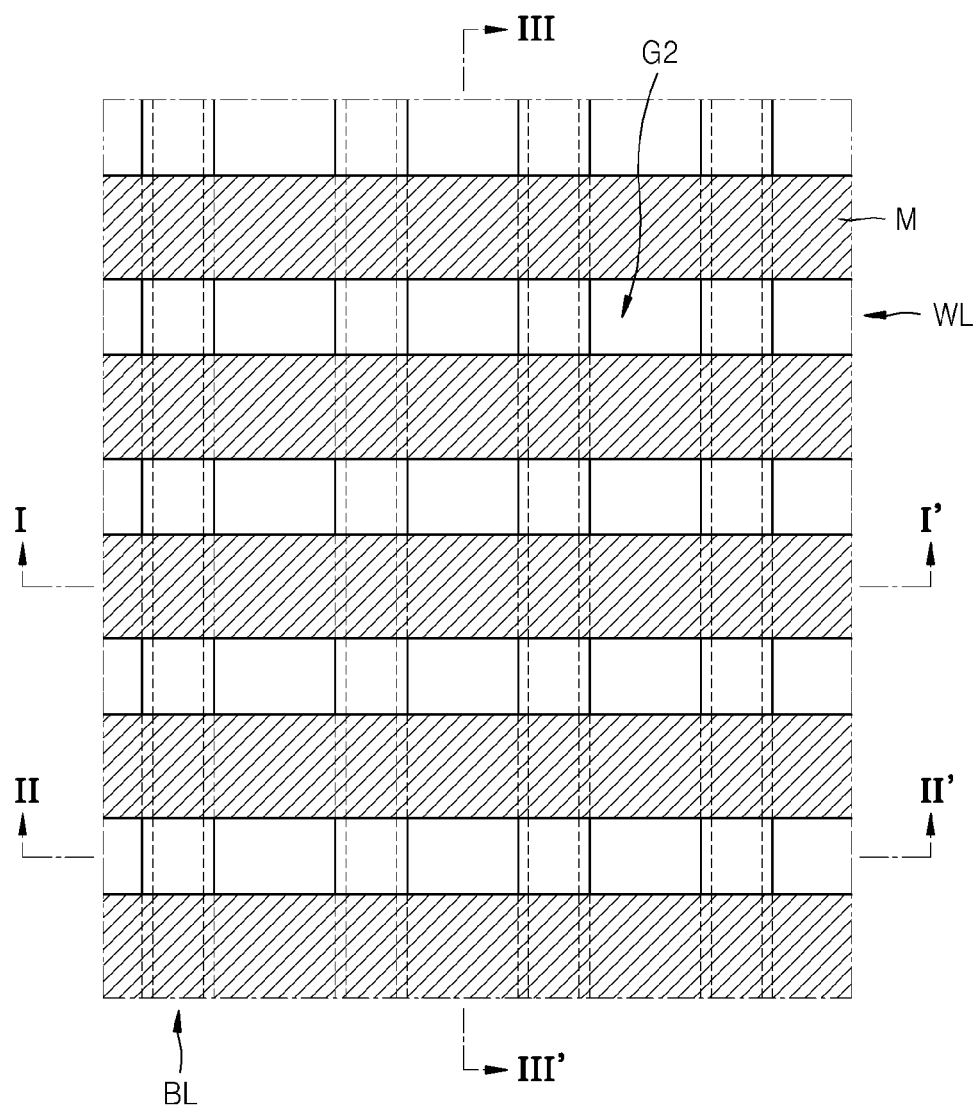

Referring to FIGS. 30A through 30D, similarly to FIGS. 7A through 7C, the mask pattern M may be formed on a result product obtained by forming the sacrificial film 160, and then a part of the sacrificial film 160 may be removed by using the mask pattern M as an etch mask, thereby forming the plurality of second grooves G2 exposing the second spacer insulating film 156a. The mask pattern M may have a line shape opening a region of the top surface of the sacrificial film 160 corresponding to the word line 124 as shown in FIG. 30D.

For convenience, in FIGS. 30A through 30C, the mask pattern M is removed after the second groove G2 is formed, and in FIG. 30D, the mask pattern M has a line shape perpendicular to the bit line BL and opens a region corresponding to the word line WL.

In at least one example embodiment, the second spacer insulating film 156a may also operate as an etch mask together with the mask pattern M while forming the second groove G2. Accordingly, as shown in FIG. 30B, the second spacer insulating film 156a may be exposed on the inner surface of the second groove G2 and the top surfaces of the bit line structure 140 and initial multi-film spacer 150b.

Since the second spacer insulating film 156a extends in the first direction (y direction) while covering the bit line BL, and the mask pattern M extends in the second direction perpendicular to the bit line BL, the second groove G2 formed by using the second spacer insulating film 156a and the mask pattern M as an etch mask may have a rectangular structure surrounded by the second spacer insulating film 156a and the sacrificial film 160.

Meanwhile, the second groove G2 may correspond to a fence region surrounding the buried contact BC formed later. In other words, as described above with reference to FIG. 14A, the second groove G2 may be later filled with the first insulating film 170 formed of an oxide material, and the first insulating film 170 filling the second groove G2 may later form the fence F1 surrounding the two side walls of the buried contact BC in the first direction.

Referring to FIGS. 31A through 31C, similarly to FIGS. 8A through 8C, the first insulating film 170 filling the second groove G2 and covering the top surfaces of the bit line structure 140 and initial multi-film spacer 150b is formed. In detail, the first insulating film 170 is formed on the second spacer insulating film 156a exposed through the second groove G2. The first insulating film 170 may be an insulating film formed of an oxide material. As described above, the first insulating film 170 may later be a fence surrounding the two side walls of the buried contact BC.

Referring to FIGS. 32A through 32D, similarly to FIGS. 9A through 9C, the plurality of third grooves G3 exposing the second spacer insulating film 156a are formed by removing the sacrificial film 160 formed of an SOH material. As described above, the sacrificial film 160 may be removed via ashing and stripping processes.

After removing the sacrificial film 160 via the ashing and stripping processes, the plurality of second spacers 156 covering the first spacer 154 are formed on two side walls of the bit line structure 140 by etching back the second spacer insulating film 156a by using the first spacer 154 as an etch blocking film. In other words, the second spacer 156 only covers the side surface of the first spacer 154, and the second spacer insulating film 156a on the top surface of the bit line structure 140 and the bottom surface of the third groove G3 may be removed via etch-back. Meanwhile, a region of the second spacer insulating film 156a at the bit line structure 140 corresponding to the line II-II' of FIG. 1 may not be removed but may be maintained as the region is covered by the first insulating film 170.

Since the second spacer insulating film 156a is transformed to the second spacer 156 via etch-back, a region of the initial multi-film spacer 150b corresponding to the line I-I' of FIG. 1 may be transformed to the multi-film spacer 150. In other words, the multi-film spacer 150 may include the insulating liner 152, the first spacer 154, and the second spacer 156, which surround the side wall of the bit line structure 140.

Meanwhile, by forming the second spacer 156, the interlayer insulating film pattern 130 on the bottom surface of the third groove G3, for example, the SiO film 1342, may be exposed.

Then, a part of the top surface of the active region 116 is exposed by etching the SiO film 132 on the bottom surface of the third groove G3 by using the second spacer 156 as an etch blocking film. While exposing the part of the top surface of the active region 116, a part of the top surface of the device isolating film 114 adjacent to the active region 116 may also be exposed.

Also, as shown in FIGS. 5A through 5C, after opening the top surface of the active region 116, a wet etching process may be further performed on the SiO film 132 to increase the open area of the top surface of the active region 116. As such, when the open area of the top surface of the active region 116 is increased, a contact area of the buried contact BC and the active region 116, which is formed by filling the third groove G3 with a conductive material, may be increased later. Accordingly, contact resistance between the buried contact BC and the active region 116 may be reduced.

Meanwhile, as shown in FIG. 32D, the third groove G3 formed after removing the sacrificial film 160 and forming the second spacer 156 may have a rectangular structure whose two side walls in the second direction are surrounded by the multi-film spacer 150, i.e., the second spacer 156, and two side walls in the first direction are surrounded by the first insulating film 170.

As described above, in the method according to at least one example embodiment, the active region 116 is opened by using the first insulating film 170 perpendicular to the bit line BL as an etch mask, and thus the active region 116 may be opened in a contact type unlike as described in FIGS. 4A through 4C. When the active region 116 is opened in the contact type, existing processes may be used except that an SOH material is used instead of an oxide material for the sacrificial film 160.

Then, as shown in FIGS. 10A through 13C, the forming of the buried contact 180, the etching back of the buried contact 180 and forming of the metal film 190, the forming of the landing pad 190a through the landing pad groove Glp, and the forming of the capping insulating film 178 filling the landing pad groove Glp and covering the landing pad 190a may be sequentially performed.

Meanwhile, by performing processes described above with reference to FIGS. 15A through 19C, the semiconductor device 100 may further include the air spacer AS.

Figure 33:
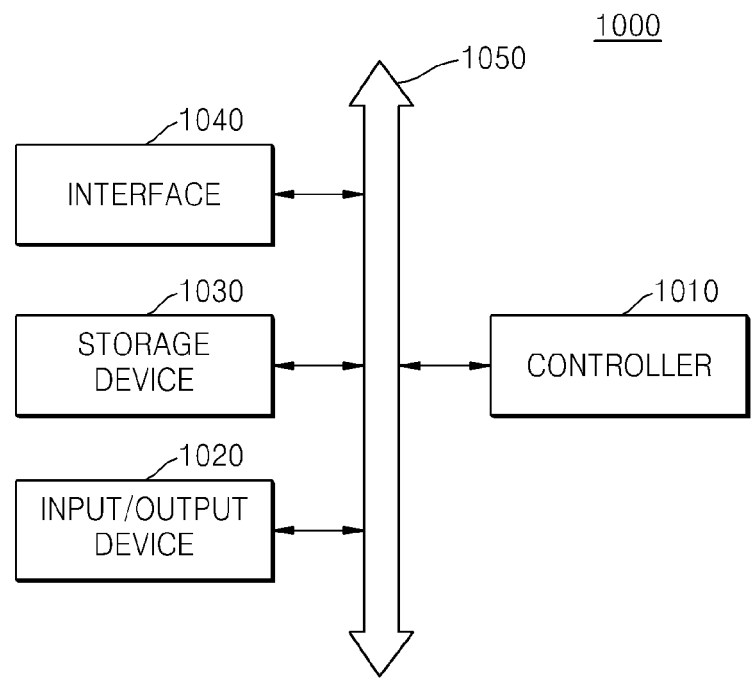
FIG. 33 is a block diagram of a system including a semiconductor device, according to at least one example embodiment of the inventive concepts.

FIG. 33 is a block diagram of a system 1000 including a semiconductor device, according to at least one example embodiment of the inventive concepts.

Referring to FIG. 33, the system 1000 may include a controller 1010, an input/output device 1020, a storage device 1030, and an interface 1040. The system 1000 may be a mobile system or a system transmitting or receiving information. According to one or more example embodiments, the mobile system may be a personal digital assistant (PDA), a portable computer, a web tablet, a wireless phone, a mobile phone, a digital music player, or a memory card.

The controller 1010 controls execution programs in the system 1000, and may include a microprocessor, a digital signal processor, a microcontroller, or a device similar thereto. The input/output device 1020 may be used to input and output data of the system 1000. The system 1000 may be connected to and exchange data with an external device, such as a personal computer or a network, by using the input/output device 1020. The input/output device 1020 may be a keypad, a keyboard, or a display.

The storage device 1030 may store codes and/or data for operations of the controller 1010, or store data processed by the controller 1010. The storage device 1030 may include a semiconductor device including an FINFET according to an example embodiment of the inventive concepts. For example, the storage device 1030 may include at least one of semiconductor devices manufactured according to the methods of FIGS. 2A through 32D.

The interface 1040 may be a data transfer passage between the system 1000 and another external device. The controller 1010, the input/output device 1020, the storage device 1030, and the interface 1040 may communicate with each other via a bus 1050.

The system 1000 may be used in a mobile phone, an MP3 player, a navigation system, a portable multimedia player (PMP), a solid state disk (SSD), or household appliances.

Figure 34:
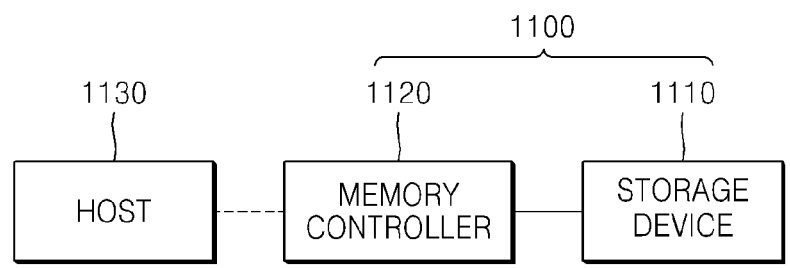
FIG. 34 is a block diagram of a memory card including a semiconductor device, according to at least one example embodiment of the inventive concepts.

FIG. 34 is a block diagram of a memory card 1100 including a semiconductor device, according to an example embodiment of the inventive concepts.

Referring to FIG. 34, the memory card 1100 may include a storage device 1110 and a memory controller 1120.

The storage device 1110 may store data. According to one or more example embodiments, the storage device 1110 may have a nonvolatile characteristic, wherein stored data is maintained even when power supply is stopped. The storage device 1110 may include at least one of semiconductor devices manufactured according to the methods of FIGS. 2A through 32D.

The memory controller 1120 may read data stored in the storage device 1110 or store data in the storage device 1110 in response to a read/write request of a host 1130. The memory controller 1120 may include at least one of semiconductor devices manufactured according to the methods of FIGS. 2A through 32D.

In the method according to one or more example embodiments of the inventive concepts, an open area of a buried contact may be increased and an etching process may be stably performed by forming the open area in a line shape while forming a multi-film spacer of a bit line structure. Accordingly, an NOP margin may be sufficient and thus a recess distribution of buried contacts may be satisfactory.

Also, in the method according to one or more example embodiments of the inventive concepts, a loss generated as a mask formed of a nitride material is etched while using a sacrificial film formed of an oxide material may be reduced (or alternatively, prevented) and a recess generated as a device isolating film is etched may be mitigated (or alternatively, prevented) by using a sacrificial film formed of an SOH material and easily removing the sacrificial film via ashing and stripping processes.

While the inventive concepts have been particularly shown and described with reference to exemplary embodiments thereof, it will be understood that various changes in form and details may be made therein without departing from the spirit and scope of the following claims.

What is claimed is:

1. A method of manufacturing a semiconductor device, the method comprising:
   forming a plurality of bit line structures on a substrate, the bit line structures being spaced apart from each other by a first groove, each of the bit line structures extending in a first direction and including a bit line and an insulation capping line, the substrate including an active region and a word line, the active region being defined by a device isolating film;
   forming a multi-film spacer on two side walls of each of the plurality of bit line structures, the multi-film spacer having an outermost region including a nitride film;
   exposing a part of a top surface of the active region by etching a lower insulating film of a bottom surface of the first groove by using the multi-film spacer as a mask;
   forming a sacrificial film in the first groove to cover the plurality of bit line structures and the multi-film spacer, the sacrificial film being including a spin on hardmask (SOH) material;
   forming a second groove by removing the sacrificial film that is exposed by a first mask pattern, the second groove extending in a second direction perpendicular to the first direction and exposing a region corresponding to the word line;
   forming a first insulating film in the second groove, the first insulating film including an oxide material;
   forming a third groove that exposes a part of a top surface of the active region by removing the remaining sacrificial film by using the first insulating film as a mask;
   forming a conductive film in the third groove such that the conductive film is electrically connected to the active region, the conductive film including a polysilicon material;
   removing a top portion of the conductive film; and
   forming a metal film to cover the conductive film, the first insulating film, the plurality of bit line structures, and the multi-film spacer.

2. The method of claim 1, wherein the multi-film spacer comprises a first nitride film, an oxide film, and a second nitride film.

3. The method of claim 1, wherein the exposing includes expanding an exposed area of the top surface of the active region by further etching an oxide film on the active region.

4. The method of claim 1, wherein the forming a second groove includes removing the sacrificial film by using the first mask pattern and the multi-film spacer as masks.

5. The method of claim 1, wherein the forming a third groove includes removing the sacrificial film by ashing and stripping,
   wherein an exposed area of a top surface of the active region after the sacrificial film is removed and an exposed area of a top surface of the active region before the sacrificial film is formed occupy substantially the same area.

6. The method of claim 1, wherein the forming a conductive film comprises:
   forming a first conductive film in the third groove to cover the plurality of bit line structures and the multi-film spacer; and
   exposing the plurality of bit line structures and the multi-film spacer by removing a top portion of the first conductive film via chemical mechanical polishing (CMP).

7. The method of claim 1, further comprising:
   forming a fourth groove by removing parts of the metal film after the forming a metal film wherein,
      the plurality of bit line structures and the multi-film spacer exposed by a second mask pattern have a desired shape, and
      the fourth groove separates the metal film into a plurality of landing pads that are electrically isolated from each other.

8. The method of claim 7, wherein,
   the plurality of landing pads are disposed in a zigzag form along the first direction,
   the multi-film spacer at a left side wall of each of the plurality of bit line structures and the multi-film spacer at a right side wall of each of the plurality of bit line structures are alternately exposed by the fourth groove along the first direction, and
   the multi-film spacers at side walls of the plurality of bit line structures in a same direction are exposed by the fourth groove along the second direction.

9. The method of claim 1, further comprising:
   forming a fourth groove by removing a top portion of the first insulating film by using the conductive film as a mask;
   forming a second insulating film in the fourth groove, the second insulating film including a nitride material, wherein the metal film covers the second insulating film;
   forming a fifth groove to expose an oxide film spacer in the multi-film spacer by removing parts of the metal film, wherein the plurality of bit line structures and the multi-film spacer exposed by a second mask pattern have a desired shape;
   forming an air spacer by removing the oxide film spacer; and
   forming a capping insulating film in the fifth groove to cover the metal film, wherein,
      the forming a fourth groove and the forming a second insulating film occur before the forming a metal film, and
      the forming a fifth groove, the forming an air spacer, and the forming a capping insulating film occur after the forming a metal film.

10. The method of claim 9, wherein the forming a fourth groove includes maintaining a top surface of the remaining first insulating film to be lower than a top surface of the conductive film remaining by the etch-back.

11. A method of manufacturing a semiconductor device, the method comprising:
   forming a plurality of bit line structures on a substrate, the bit line structures being spaced apart from each other by a first groove, each of the bit line structures extending in a first direction and including a bit line and an insulation capping line, the substrate including an active region and a word line, the active region being defined by a device isolating film;

forming a first multi-film spacer on two side walls of each of the plurality of bit line structures, the first multi-film spacer having an outermost region including a nitride film;

exposing a part of a top surface of the active region by etching a lower insulating film of a bottom surface of the first groove by using the first multi-film spacer as a mask;

forming a second multi-film spacer by removing the nitride film of the outermost region of the first multi-film spacer;

forming a conductive thin film including a polysilicon material to cover the plurality of bit line structures, the second multi-film spacer, and the exposed top surface of the active region;

forming a sacrificial film in the first groove to cover the conductive thin film, the sacrificial film including a spin on hardmask (SOH) material;

forming a second groove by removing the sacrificial film that is exposed by a first mask pattern, the second groove extending in a second direction perpendicular to the first direction and exposing a region corresponding to the word line;

removing the conductive thin film exposed by the second groove;

forming a first insulating film in the second groove, the first insulating film including an oxide material;

forming a third groove to expose the conductive thin film by removing the remaining sacrificial film by using the first insulating film as a mask;

forming a conductive film in the third groove, the conductive pattern being electrically connected to the active region and including a polysilicon material;

removing a top portion of the conductive film by etch-back by using the first insulating film as a mask; and forming a metal film to cover the conductive film, the first insulating film, the plurality of bit line structures, and the second multi-film spacer.

12. The method of claim 11, wherein,
the first multi-film spacer includes a first nitride film, an oxide film, and a second nitride film, and
the second multi-film spacer includes the first nitride film and the oxide film.

13. The method of claim 11, wherein the exposing a part of a top surface of the active region includes expanding an exposed area of the top surface of the active region by further etching an oxide film on the active region.

14. The method of claim 11, wherein the removing the conductive thin film includes separating the conductive thin film extending in the first direction into a plurality of conductive thin films that are electrically isolated from each other.

15. The method of claim 11, wherein the forming a conductive film includes forming the conductive film as a thin film via one of deposition and via selective epitaxial growth (SEG).

16. A method of manufacturing a semiconductor device, the method comprising:
forming an insulating pattern on a substrate, the substrate including an active region defined by a device isolation region;

forming a plurality of bit line structures on the insulating pattern, the bit line structures being separated from each other by a first groove, each of the bit line structures extending in a first direction;

forming a spacer on two side walls of each of the plurality of bit line structures;

exposing a top surface of the active region by removing the insulating pattern using the spacer as a mask;

forming a sacrificial film to at least partially fill the first groove, the sacrificial film including carbon;

removing a first portion of the sacrificial film that is exposed by a first mask pattern to form a second groove extending in a second direction perpendicular to the first direction;

forming a first insulating film to at least partially fill the second groove;

removing a second portion of the sacrificial film to form a third groove that exposes the top surface of the active region;

forming a conductive film to at least partially fill the third groove such that the conductive film is electrically connected to the active region; and forming a metal film on the conductive film, the first insulating film, the plurality of bit line structures, and the spacer.

17. The method of claim 16, wherein the spacer is a multi-film spacer that has an outermost region including a nitride material, and the first insulating film includes an oxide material.

18. The method of claim 16, wherein the sacrificial film has a carbon amount from about 85% to about 99% by weight.

19. The method of claim 16, wherein the exposing removes the insulating pattern between a bottom portion of the spacer and the active region.

20. The method of claim 16, wherein the removing a first portion of the sacrificial film includes using the first mask pattern and the spacer as masks, and the removing a second portion of the sacrificial film includes using the first insulating film as a mask.

* * * * *